United States Patent
Fukami et al.

(10) Patent No.: US 8,559,214 B2
(45) Date of Patent: Oct. 15, 2013

(54) MAGNETIC MEMORY DEVICE AND MAGNETIC RANDOM ACCESS MEMORY

(75) Inventors: Shunsuke Fukami, Tokyo (JP);
Kiyokazu Nagahara, Tokyo (JP);
Tetsuhiro Suzuki, Tokyo (JP);
Nobuyuki Ishiwata, Tokyo (JP);
Norikazu Ohshima, Tokyo (JP)

(73) Assignee: NEC Corporation, Tokyo (JP)

( * ) Notice: Subject to any disclaimer, the term of this patent is extended or adjusted under 35 U.S.C. 154(b) by 158 days.

(21) Appl. No.: 13/139,604

(22) PCT Filed: Dec. 24, 2009

(86) PCT No.: PCT/JP2009/071410
§ 371 (c)(1),
(2), (4) Date: Jul. 19, 2011

(87) PCT Pub. No.: WO2010/074132
PCT Pub. Date: Jul. 1, 2010

(65) Prior Publication Data
US 2011/0260273 A1    Oct. 27, 2011

(30) Foreign Application Priority Data

Dec. 25, 2008 (JP) .................................. 2008-330508
Oct. 1, 2009 (JP) .................................. 2009-229597

(51) Int. Cl.
*G11C 11/00* (2006.01)
(52) U.S. Cl.
USPC ..................... 365/158; 365/130; 257/E29.323
(58) Field of Classification Search
CPC ............................ H01L 43/08; G11C 19/0808
USPC ........... 257/E21.665, E29.323; 365/130, 131, 365/158, 131.158
See application file for complete search history.

(56) References Cited

U.S. PATENT DOCUMENTS

| | | | |
|---|---|---|---|
| 6,834,005 B1 | 12/2004 | Parkin | |
| 7,738,278 B2 | 6/2010 | Kim et al. | |
| 7,869,266 B2 * | 1/2011 | Ranjan et al. | 365/158 |
| 7,952,906 B2 | 5/2011 | Lim | |
| 2005/0078509 A1 * | 4/2005 | Parkin | 365/158 |
| 2007/0195588 A1 * | 8/2007 | Kim et al. | 365/158 |
| 2007/0217256 A1 | 9/2007 | Ono | |
| 2008/0068880 A1 * | 3/2008 | Lim et al. | 365/173 |
| 2008/0137395 A1 * | 6/2008 | Hwang et al. | 365/80 |

(Continued)

FOREIGN PATENT DOCUMENTS

| | | |
|---|---|---|
| JP | 2005093488 A | 4/2005 |
| JP | 2005191032 A | 7/2005 |

(Continued)

OTHER PUBLICATIONS

International Search Report for PCT/JP2009/071410 mailed Mar. 9, 2010.

(Continued)

*Primary Examiner* — Jerome Jackson, Jr.
*Assistant Examiner* — Paul Budd

(57) ABSTRACT

A magnetic memory cell is provided with a magnetization record layer and a magnetic tunnel junction section. The magnetization record layer is a ferromagnetic layer having a perpendicular magnetic anisotropy. The magnetic tunnel junction section is used to read data from the magnetization record layer. The magnetization record layer has a plurality of domain wall motion regions.

23 Claims, 59 Drawing Sheets

(56) References Cited

U.S. PATENT DOCUMENTS

| | | | |
|---|---|---|---|
| 2008/0138659 A1* | 6/2008 | Lim et al. | 428/810 |
| 2008/0152954 A1* | 6/2008 | Lim | 428/827 |
| 2009/0185312 A1* | 7/2009 | Cho et al. | 360/131 |
| 2009/0207643 A1* | 8/2009 | Joe et al. | 365/85 |

FOREIGN PATENT DOCUMENTS

| | | |
|---|---|---|
| JP | 2005535111 A | 11/2005 |
| JP | 2006073930 A | 3/2006 |
| JP | 2007288162 A | 11/2007 |
| JP | 2008078650 A | 4/2008 |
| WO | 2007020823 A | 2/2007 |
| WO | 2007119446 A | 10/2007 |
| WO | 2008047536 A | 4/2008 |
| WO | 2008108108 A | 9/2008 |

OTHER PUBLICATIONS

N. Sakimura et al, "A 250-MHz 1-Mbit Embedded MRAM Macro Using 2T1 MTJ Cell with Bitline Separation and Half-Pitch Shift Architecture", IEEE Asian Solid-State Circuits Conference, ASSCC'07, Nov. 2007, pp. 216-219.

N. Sakimura et al., "MRAM Cell Technology for Over 500-MHz SoC". IEEE Journal of Solid-State Circuits, vol. 42, No. 4, Apr. 2007, pp. 830-838.

J. C. Slonczewski, "Current-driven excitation of magnetic multilayers", Journal of Magnetism & Magnetic Materials, 159, 1996, pp. L1-L7.

A. Yamaguchi et al., "Real-Space Observation of Current-Driven Domain Wall Motion in Submicron Magnetic Wires", Physical Review Letters, vol. 92, No. 7, Feb. 20, 2004, pp. 077205-1-4.

A. Yamaguchi et al., "Reduction of Threshold Current Density for Current-Driven Domain Wall Motion using Shape Control", Japanese Journal of Applied Physics, vol. 45, No. 5A, 2006, pp. 3850-3853.

S. Fukami et al, "Micromagnetic analysis of current driven domain wall motion in nanostrips with perpendicular magnetic anisotropy" Journal of Applied Physics, vol. 103, 2008, 07E718-1~3.

D. Ravelosona et al., "Threshold currents to move domain wall in films with perpendicular anisotropy", Applied Physics Letters; vol. 90, 2007, 072508-1~3.

Non-Final Office Action for U.S. Appl. No. 13/139,607, dated on Jun. 14, 2013.

* cited by examiner

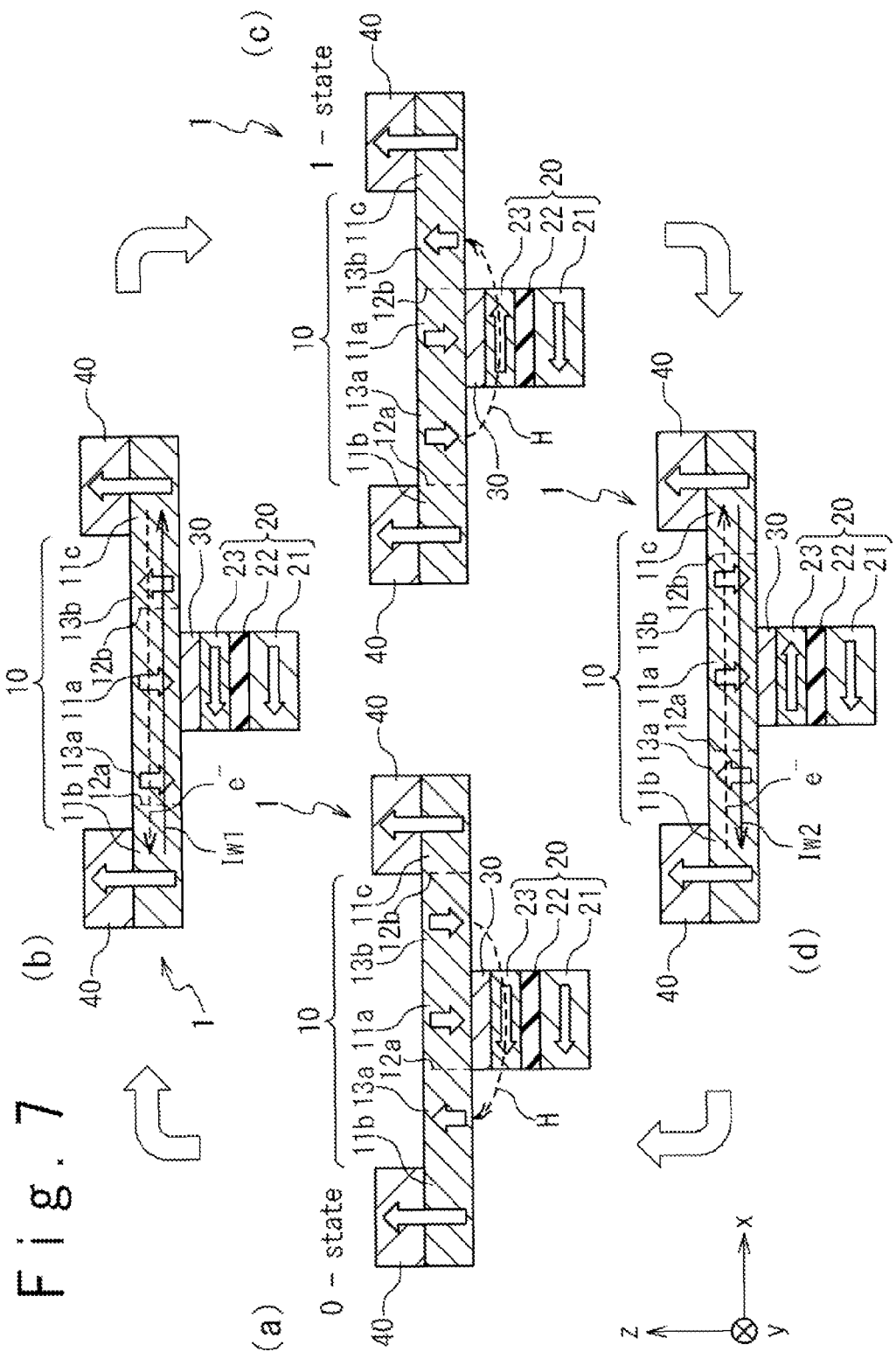

δ1-state

δ2-state

δ3-state

δ4-state

δ5-state

δ6-state

δ7-state

δ8-state

ε1-state

ε2-state

ε3-state

ε4-state

MAGNETIC MEMORY DEVICE AND MAGNETIC RANDOM ACCESS MEMORY

This patent application is the National Phase of PCT/JP2009/071410, filed Dec. 24, 2009, which claims priorities on convention based on Japanese Patent Application No. 2008-330508 filed on Dec. 25, 2008 and Japanese Patent Application No. 2009-229597 filed on Oct. 1, 2009. The disclosures thereof are incorporated herein by reference.

TECHNICAL FIELD

The present invention is related to a magnetic memory device and a magnetic random access memory, and more particular to a domain wall motion-type magnetic memory device and a magnetic random access memory.

RELATED ART

The magnetic random access memory (MRAM) is expected to be a non-volatile memory device that a high-speed operation is possible, and an infinite rewrite operation is possible, and the research extensively progresses. In the MRAM, magneto-resistance elements are integrated in a memory cell and data is stored based on the magnetization direction of a ferromagnetic layer of the magneto-resistance element. Some proposals of the MRAM have been made with respect to a method of switching (inverting) the magnetization direction of the ferromagnetic layer.

The most general MRAM is a current inducing magnetic field write-type MRAM. In this MRAM, a wiring line is arranged around the magneto-resistance element to supply a write current, and the magnetization direction of the ferromagnetic layer of the magneto-resistance element is switched with magnetic field generated with the write current. In this MRAM, theoretically, the write operation can be completed in 1 nanosecond or less and it is ideal as a high-speed MRAM. For example, a success in an operation test in 250 MHz is reported: "A 250-MHz 1-Mbit Embedded MRAM Macro Using 2T1 MTJ Cell with Bitline Separation and Half-Pitch Shift Architecture", by N. Sakimura et al. (Solid-State Circuits Conference, 2007, ASSCC' 07, IEEE Asian. p. 216). Moreover, a circuitry suited for 500-MHz operation is proposed in "MRAM Cell Technology for Over 500-MHz SoC", by N. Sakimura et al. (IEEE JOURNAL OF SOLID-STATE CIRCUITS, Vol. 42, 2007, p. 830).

However, the magnetic field required to switch the magnetization direction of a magnetic substance body that has heat stability and external disturbing magnetic field tolerance, is about a few of ten |Oe|. In order to generate such a magnetic field, the write current of 1 mA to several mA is necessary. The chip area is necessarily increased when the write current is large, and also a current consumption amount increases for the write operation. In addition to this, when a memory cell is miniaturized, the write current increases more and a scaling does not occur. A technique by which the write current can be reduced in correspondence to the miniaturization of the memory cell is required.

As a write technique in which the increase of the write current accompanied with miniaturization can be restrained, the "spin transfer" method is proposed (for example, JP 2005-93488A. and "Current-driven excitation of magnetic multi-layers" by J. C. Slonezewski (Journal of Magnetism & Magnetic Materials, 159, L1-L7 (1996)). According to the spin transfer method, spin-polarized current is injected to a ferromagnetic conductor, and the magnetization direction of a conductor is inverted through direct interaction between spin of conduction electrons in a current and the magnetic moment of the conductor (hereinafter, this is referred to as "Spin Transfer Magnetization Switching"). The occurrence of the spin transfer magnetization switching depends on a current density (not an absolute value of the current). Therefore, when using the spin transfer magnetization switching for the data write, a write current is reduced if the size of the memory cell becomes small. That is, the spin transfer magnetization switching method is excellent in the scaling. When the write current is small, the chip region can be made small and a high integration and a large scaling become possible. Here, in the spin transfer magnetization switching method, generally, the write time is longer than in the current inducing magnetic field write-type MRAM (e.g. 1 nsec. or above).

A magnetic shift register using the spin transfer is disclosed in U.S. Pat. No. 6,834,005. The magnetic shift register stores data by using domain walls in a magnetic substance body. A current is injected to pass through the domain wall in the magnetic substance body which is divided into many regions (magnetic domain) and the domain wall is moved with the current. The magnetization direction of each region is handled as the stored data. For example, such a magnetic shift register is used for the storage of a great deal of serial data. It should be noted that the movement of the domain wall in the magnetic substance body is reported in "Real-Space Observation of Current-Driven Domain Wall Motion in Submicron magnetic Wires" by A. Yamaguchi et al., (Physical Review Letters, Vol. 92, pp. 077205-1-4 (2004)).

The "MRAM of a domain wall motion type" which uses domain wall motion by the spin transfer is described in JP 2005-191032A and the WO 2007/020823.

The MRAM described in JP 2005-191032A is provided with a magnetization fixed layer in which magnetization is pinned, a tunnel insulating layer formed on the magnetization fixed layer; and a magnetization record layer formed on the tunnel insulating layer. The magnetization record layer includes a part that the magnetization direction is invertible and another part that the magnetization direction is substantially unchangeable, and therefore, the layer is referred to as not a magnetization free layer but the magnetization record layer. FIG. 1 is a plan view schematically showing a planar structure of the magnetization record layer in JP 2005-191032A. In FIG. 1, the magnetization record layer 100 has a linear shape. Specifically, the magnetization record layer 100 is provided with a junction section 103 which overlaps with the tunnel insulating layer and the magnetization fixed layer, a constricted section 104 in the neighborhood of both ends of the junction section 103, and a pair of magnetization fixed regions 101 and 102 formed in the neighborhood of the constricted section 104. The magnetization fixed regions 101 and 102 have fixed magnetizations directed to opposite directions to each other. Moreover, the MRAM is provided with a pair of write terminals 105 and 106 electrically connected to the pair of magnetization fixed regions 101 and 102, respectively. A current is supplied from the write terminals 105 and 106 to pass through the junction section 103 of the magnetization record layer 100, the constricted section 104 and the pair of magnetization fixed regions 101 and 102.

FIG. 2 is a plan view schematically showing the planar structure of the magnetization record layer 120 in WO 2007/020823. In FIG. 2, the magnetization record layer 120 has a U-character shape. Specifically, the magnetization record layer 120 has a first magnetization fixed region 121, a second magnetization fixed region 122 and a magnetization invertible region 123. The magnetization invertible region 123 overlaps with a pinned layer 130. The first and second magnetization fixed regions 121 and 122 are formed to extend to the Y direction and the magnetization directions are fixed on a same direction. On the other hand, the magnetization inversion region 123 is formed to extend to the X direction and it has the invertible magnetization. Therefore, a domain wall is formed in the boundary B1 between the first magnetization fixed region 121 and the magnetization invertible region 123 or the boundary B2 between the second magnetization fixed region 122 and the magnetization invertible region 123. The first and second magnetization fixed regions 121 and 122 are connected with the current supply terminals 125 and 126, respectively. By using the current supply terminals 125 and 126, it is possible to supply the write current to the magnetization record layer 120. The domain wall is moved in magnetization invertible region 123 according to the direction of the write current. The magnetization direction of the magnetization invertible region 123 can be controlled through this domain wall motion.

However, in the MRAM using a current drive domain wall motion, it is worried that an absolute value of the write current becomes relatively large. In addition to the above Physical Review Letters, Vol. 92, pp. 077205-1-4 (2004), much observations of the current drive domain wall motion are reported. However, the domain wall motion requires a threshold current density of about $1 \times 10^8$ A/cm$^2$. In this case, the write current is required to be 1 mA in a case of the width of 100 nm and the thickness of 10 nm in a layer through which the domain wall motion is moved. In order to reduce the write current below this value, the film thickness must be made thinner. In such a case, it is known that the write current density is increased more (for example, "Reduction of Threshold Current Density for Current-Driven Domain Wall Motion using Shape Control" by A. Yamaguchi et al., (Japanese Journal of Applied Physics, vol. 45, No. 5A, pp. 3850-3853 (2006)).

On the other hand, in a device which using a material having the perpendicular magnetic anisotropy that the magnetic anisotropy of the magnetization record layer is perpendicular to a substrate surface, it is shown experimentally that the threshold current density for the domain wall motion is small, compared a case of a material having an in-plane magnetic anisotropy. For example, in "Threshold currents to move domain wall in films with perpendicular anisotropy" by D. Ravelosona et al., (Applied Physics Letters, Vol. 90, 072508 (2007)), the threshold current density in an order of $10^6$ A/cm$^2$ is observed. Also, in "Micromagnetic analysis of current driven domain wall motion in nanostrips with perpendicular magnetic anisotropy" by S. Fukami et al. (J. Appl. Phys. 103, 07E718 (2008)), it is theoretically shown that the threshold current density for the domain wall motion becomes small in the case of the material having the perpendicular magnetic anisotropy, compared of the case of the material having the in-plane magnetic anisotropy. Therefore, it is expected that the write current can be reduced by using the perpendicular magnetic anisotropy material for the magnetization record layer in the MRAM of the current drive domain wall motion type.

As a related technique, in JP 2006-73930A is disclosed a magnetization changing method of a magneto-resistance element using the domain wall motion, a magnetic memory device using the same, and a solid magnetic memory. The magnetic memory device is provided with a first magnetic layer, an intermediate layer and a second magnetic layer and data is stored based on the magnetization directions of the first magnetic layer and the second magnetic layer. In this magnetic memory device, magnetic domains having magnetization directions anti-parallel to each other and a domain wall partitioning the magnetic domains are steadily formed in at least one of the magnetic layers, and by moving the domain wall in the magnetic layer, the position oldie neighboring magnetic domains can be controlled to record the data. The second magnetic layer may have magnetic anisotropy in the perpendicular direction to the film surface.

As mentioned above, in the MRAM using the current drive domain wall motion, it is worried that the absolute value of the write current becomes relatively large. Therefore, the inventor of the present invention considered the reduction of the write current by using the perpendicular magnetic anisotropy material as the magnetization record layer in the MRAM using the current drive domain wall motion.

FIG. 3A and FIG. 3B are a plan view and a sectional view of a magneto-resistance element using the perpendicular magnetic anisotropy material which can be assumed. The magnetization record layer 210 is provided with a magnetization invertible region 213, and a pair of magnetization fixed regions 211a and 211b. Here, symbols of a white circle and a point, symbols of a white circle and a cross, and a white arrow symbol show the magnetization directions of the regions (magnetization invertible region 213 and magnetization fixed regions 211a and 211b in FIG. 3A and FIG. 3B).

The magnetization invertible region 213 overlaps with a tunnel insulating layer 232 and a pinned layer 230 and has a function as a free layer. That is, the magnetization invertible region 213, the tunnel insulating layer 232 and the pinned layer 230 configures a magnetic tunneling junction (MTJ) section. A magnetization fixed region 211a and a magnetization fixed region 211b are connected to one end of the magnetization invertible region 213 and the other end of the magnetization invertible region 213, respectively. A junction section of the magnetization invertible region 213 and the magnetization fixed regions 211a and 211b is provided with the restricted section 215 to which a pin potential forming method disclosed in JP 2005-191032A is applied. The fixed magnetizations opposite in direction to each other must be given to the pair of magnetization fixed regions 211a and 211b. Also, the restricted section 215 functions as a pin potential to the domain wall and the domain wall must be initialized to be the domain wall 212a or 212b in the region in the neighborhood of the restricted section.

Here, the magnetic anisotropy of the magnetization record layer is in the in-plane as shown in FIG. 2. When the magnetization direction is the in-plane, it is easy to initialize the magnetization direction of the magnetization fixed region and the domain wall position to desired states by using a U-shape magnetization record layer. However, when the magnetic anisotropy of the magnetization record layer is perpendicular as shown in FIG. 3A and FIG. 3B, and the magnetization is perpendicular to the in-plane direction, it is difficult to initialize with the external magnetic field even if the magnetization record layer is U-shaped.

Moreover, in the MRAM of the domain wall motion-type, when the pin potential forming method disclosed in JP 2005-191032A is used, the size of the restricted section 215 is small, compared with the magnetization record layer 210, as shown in FIG. 3A and FIG. 3B. Therefore, there is a possibility that the shape is deformed due to the manufacturing variation. In such a case, because the restricted section 215 does not have a desired shape, the domain wall 212 cannot be pinned so that the device cannot function as the magnetic memory. Moreover, it is very difficult to form the restricted section when the device is further miniaturized to make the width of the magnetization record layer narrow. Also, there is a possibility that a work over the lithography limit of the semiconductor process is required.

CITATION LIST

Patent Literature

[Patent Literature 1]: JP 2005-93488A
[Patent Literature 2]: U.S. Pat. No. 6,834,005
[Patent Literature 3]: JP 2005-191032A
[Patent Literature 4]: WO 2007/020823
[Patent Literature 5]: JP 2006-73930

Non-Patent Literature

[Non-Patent Literature 1]: by N. Sakimura et al., Solid-State Circuits Conference, 2007. ASSCC'07. IEEE Asian. p. 216
[Non-Patent Literature 2]: by N. Sakimura et al., IEEE JOURNAL OF SOLID-STATE CIRCUITS, Vol. 42, 2007, p. 830
[Non-Patent Literature 3]: by J. C. Slonezewski, Journal of Magnetism & Mannetic Materials, 159, L1-L7 (1996)
[Non-Patent Literature 4]: by A. Yamaguchi et al., Physical Review Letters, Vol. 92, pp. 077205-1-4 (2004)
[Non-Patent Literature 5]: by A. Yamaguchi et al., Japanese Journal of Applied Physics, vol. 45, No. 5A, pp. 3850-3853 (2006)
[Non-Patent literature 6] by D. Ravelosona et al., Applied Physics Letters, Vol. 90, 072508 (2007)
[Non-Patent Literature 7]: by S. Fukami et. al., J. Appl. Phys. 103, 07E718 (2008)

SUMMARY OF THE INVENTION

A subject matter of the present invention is to provide a magnetic memory cell and a magnetic random access memory having a structure in which a magnetization fixed region can be formed easily, a pinning site of a domain wall can be formed easily, in an MRAM of a current drive domain wall motion type in which a magnetic anisotropy of a magnetization record layer is in a perpendicular direction.

The subject matter and other subject matters and features of the present invention could be easily confirmed by the following description and the accompanying drawings.

The magnetic memory cell of the present invention is provided with a magnetization record layer and a magnetic tunnel junction section. The magnetization record layer is a ferromagnetic layer having perpendicular magnetic anisotropy. The magnetic tunnel junction section is used to read data in the magnetization record layer. The magnetization record layer is provided with a plurality of magnetic domain wall motion regions.

Also, the magnetic random access memory of the present invention is provided with a plurality of the magnetic memory cells described above and arranged in a matrix. In each of magnetic memories of a plurality of reference cells, a sensor layer has a magnetic anisotropy in a perpendicular direction to a direction of line which links a first domain wall motion region and a second domain wall motion region.

According to the present invention, the magnetization fixed region can be easily formed and the pinning site of the domain wall can be easily formed.

BRIEF DESCRIPTION OF THE DRAWINGS

FIG. 7 is a sectional view showing a data write principle according to the first exemplary embodiment of the present invention.

DESCRIPTION OF EMBODIMENTS

Hereinafter, a magnetic memory cell and a magnetic random access memory (MRAM) according to the present invention will be described with reference to the attached drawings.

The magnetic memory cell of the present invention is provided with a magnetization record layer which is a ferromagnetic layer having perpendicular magnetic anisotropy, and a magnetic tunnel junction section to read data form the magnetization record layer. The magnetization record layer is provided with a plurality of domain wall motion regions. The data can be stored in accordance with the moved domain walls in the plurality of domain wall motion regions. Also, It is desirable that the magnetic tunnel junction section is provided with a sensor layer which is a ferromagnetic layer having invertible magnetization and having in-plane magnetic anisotropy. Moreover, the magnetization record layer is desirably provided with N+1 (N is a natural number equal to or more than 2) magnetization fixed regions from the $0^{th}$ magnetization fixed region to the $N^{th}$ magnetization fixed region, which have fixed magnetization directions, and N domain wall motion regions from the first domain wall motion region to the $N^{th}$ domain wall motion region, which have invertible magnetizations and through which the domain walls are movable. It is desirable that the $N^{th}$ domain wall motion region is connected between the $0^{th}$ magnetization fixed region to the $N^{th}$ magnetization fixed region. At this time, the magnetization record layer stores the data based on a relation of the magnetization directions of the N domain wall motion regions. The magnetization directions of the N magnetization fixed regions other than the $0^{th}$ magnetization fixed region are substantially the same and the magnetization direction of the $0^{th}$ magnetization fixed region is opposite to the magnetization directions of the N magnetization fixed regions. The projection of the sensor layer to the magnetization record layer overlaps with at least a part of a region of the magnetization record layer between the N domain wall motion regions. The MRAM of the present invention is provided with a plurality of the magnetic memory cells arranged in a matrix. Hereinafter, the magnetic memory cell and the MRAM of the present invention will be described in detail.

First Exemplary Embodiment

Figure 1:
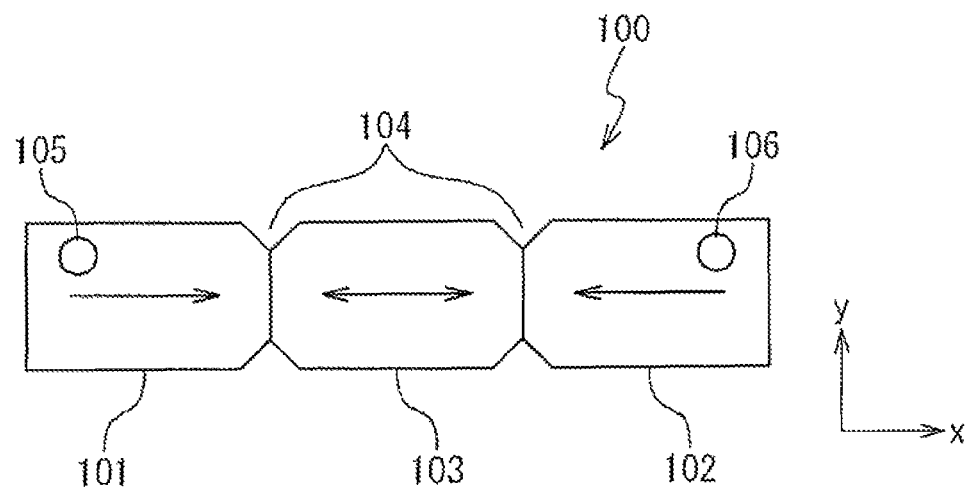
FIG. 1 is a plan view showing a structure of a magnetization record layer disclosed in JP 2005-191032A.
Figure 2:
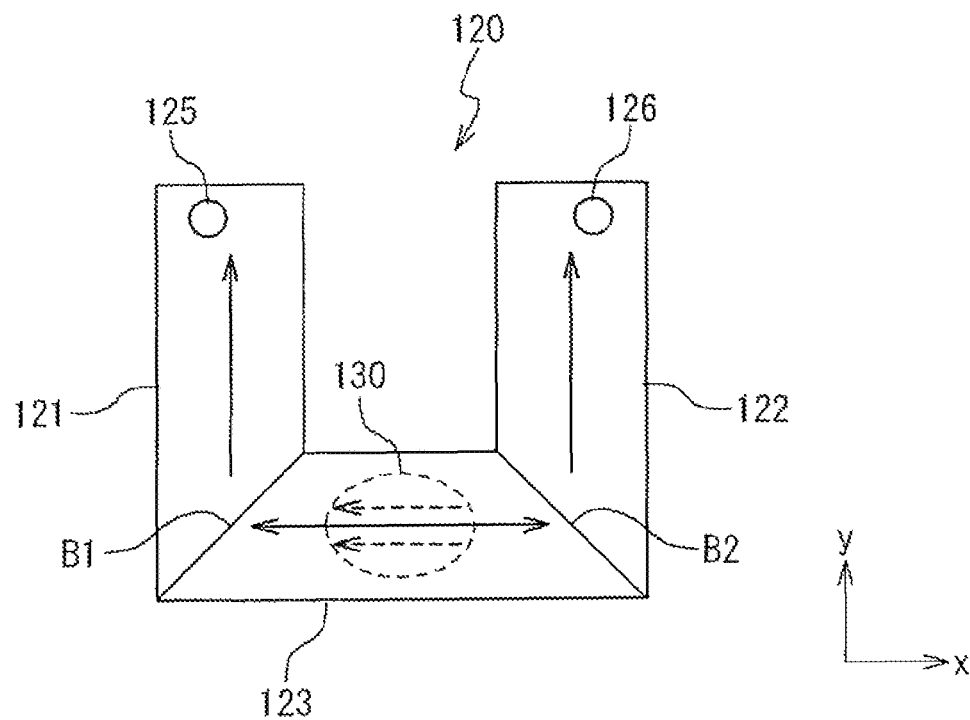
FIG. 2 is a plan view showing a structure of a magnetization record layer disclosed in WO 2007/02083.
Figure 3A:
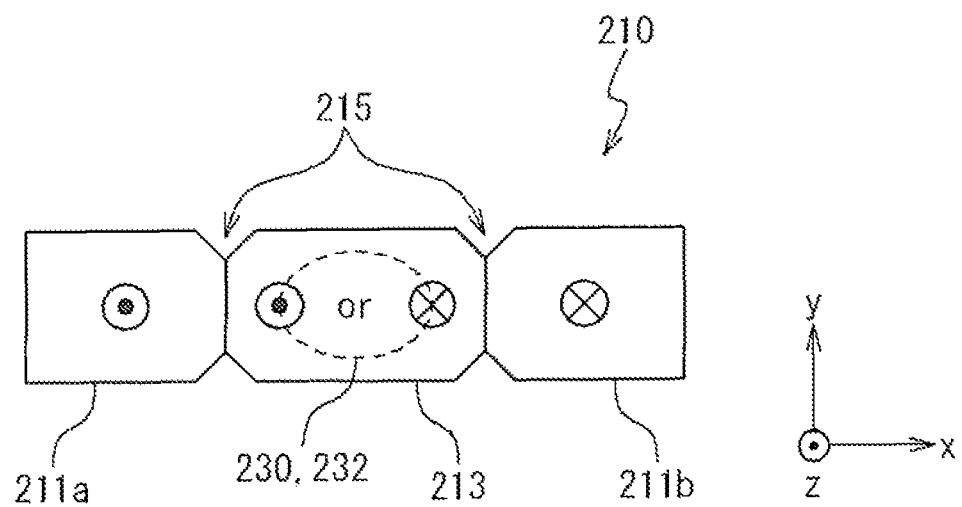
FIG. 3A is a plan view of a magneto-resistance element using a perpendicular magnetic anisotropy which is assumed.
Figure 3B:
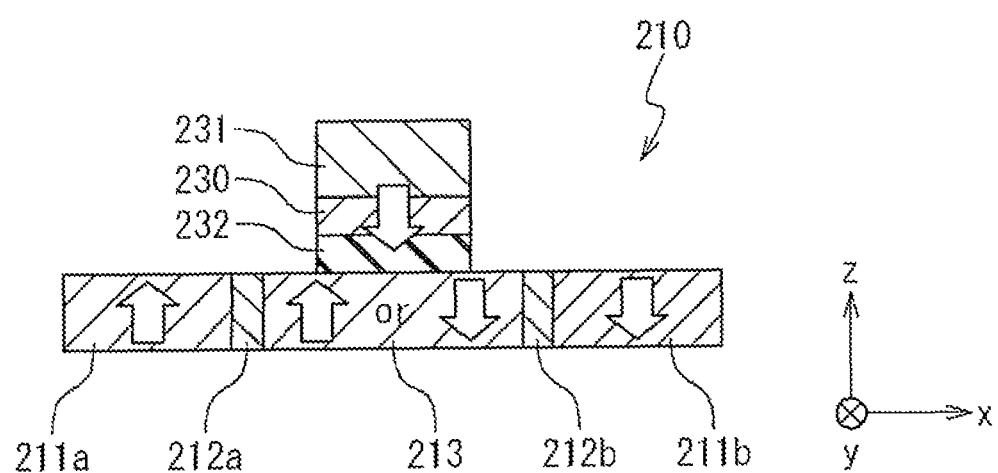
FIG. 3B is a sectional view of the magneto-resistance element using the perpendicular magnetic anisotropy which is assumed.
Figure 4A:
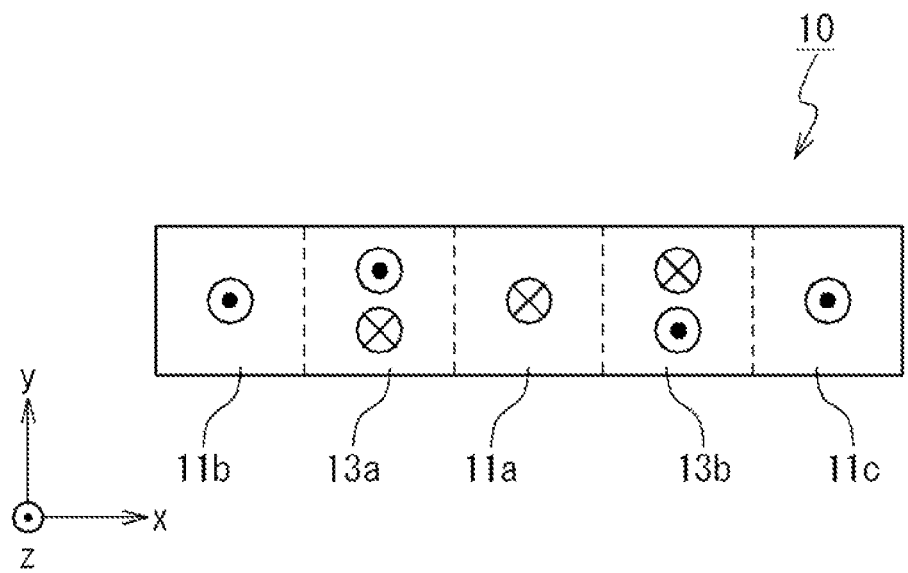
FIG. 4A is a plan view showing a configuration of a magnetization record layer in a magnetic memory device according to a first exemplary embodiment of the present invention.
Figure 4B:
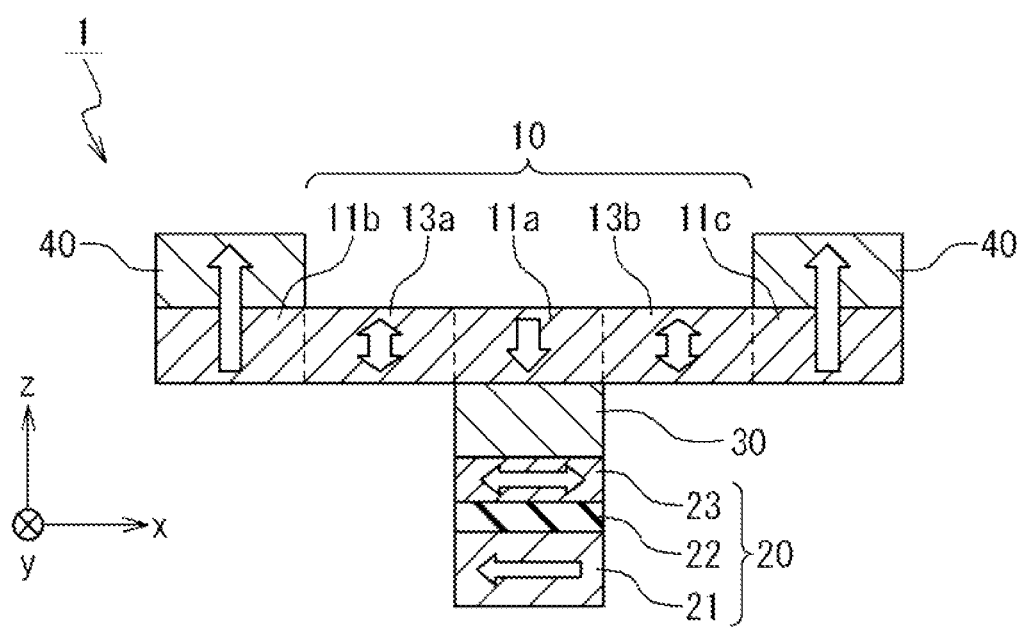
FIG. 4B is a sectional view showing the configuration of the magnetic memory device according to the first exemplary embodiment of the present invention.

In a first exemplary embodiment, the magnetic memory cell and MRAM in a case of N=2 when will be described.
1. Basic Configuration of Magnetic Memory Device FIG. 4A is a plan view showing an example of the configuration of a magnetization record layer of a magnetic memory device according to the first exemplary embodiment of the present invention. FIG. 4B is a sectional view showing an example of the configuration of the magnetic memory device according to the first exemplary embodiment of the present invention. Here, in FIG. 4A and FIG. 4B, a mark of a white circle and a point, a mark of a white circle and a cross, and a white arrow show the magnetization direction of a concerned region, as used generally. Hereinafter, this is similarly applied to the specification and each drawing.

A magnetic memory device 1 is provided with a magnetization record layer 10 and a magnetic tunnel junction section 20. The magnetization record layer 10 is a ferromagnetic layer which has perpendicular magnetic anisotropy. The magnetization record layer 10 is provided with a plurality of domain wall motion regions, e.g. two domain wall motion regions in the first exemplary embodiment. The magnetic tunnel junction section 20 is provided in the neighborhood of a central region of the magnetization record layer 10 and used to read data stored in the magnetization record layer 10. The details of the magnetization record layer 10 and the magnetic tunnel junction section 20 will be described later. It should be noted that the magnetic memory device 1 may be further provided with a contact layer 30 to electrically connect the magnetization record layer 10 and the magnetic tunnel junction section 20.

The magnetic tunnel junction section 20 is provided with a sensor layer 23, a reference layer 21 and a barrier layer 22.

The reference layer 21 has a fixed magnetization direction and is a ferromagnetic layer which has an in-plane magnetic anisotropy. Here, the in-plane magnetic anisotropy indicates a magnetic anisotropy in x- and y-plane in an example of these figures. Hereinafter, this is applied in the whole specification. It is desirable that the magnetization direction of the reference layer 21 is a longitudinal direction of the magnetization record layer 10. In the example of these figures, the magnetization direction of the reference layer 21 is −x direction of the ±x directions which are the longitudinal directions of the magnetization record layer 10. This magnetization direction may be opposite to the above direction. Also, it is desirable that the reference layer 21 is provided with a plurality of ferromagnetic layers which have a laminated ferri coupling, and/or it is desirable that the reference layer 21 is formed from anti-ferromagnetic layers such as Pt—Mn provided in the neighborhood. In order to prevent the magnetization direction of the reference layer 21 from being inverted through write and read operations, it is desirable that the magnetization direction of the reference layer 21 is substantially fixed to one direction.

The sensor layer 23 has an invertible magnetization and is a ferromagnetic layer having the in-plane magnetic anisotropy. The sensor layer 23 is magnetically coupled to the magnetization record layer 10, as described later. Therefore, the magnetization direction of the sensor layer 23 receives in-plane change according to a magnetization state of the magnetization record layer 10 (stored data). In the example of these figures, the magnetization is in the x- and y-plane according to the magnetization state of the magnetization record layer 10 (stored data). The barrier layer 22 is a non-magnetic film or an insulating film provided between the sensor layer 23 and the reference layer 21.

The reference layers 21, the barrier layer 22 and the sensor layer 23 configure a pinned layer, a tunnel insulating layer and a free layer in a magnetic tunnel junction (MTJ). The magnetization direction of the sensor layer 23 is turned in accordance with the data stored in the magnetization record layer 10. On the other hand, the magnetization direction of the reference layer 21 is fixed. Therefore, a resistance value of the magnetic tunnel junction (MTJ) section 20 changes based on the relative relation between the magnetization direction of the sensor layer 23 and the magnetization direction of the reference layer 21. Therefore, by detecting the resistance value of the magnetic tunnel junction section 20, the data stored in the magnetization record layer 10 can be read. That is, the magnetic tunnel junction section 20 can be used as a means of reading the data stored in the magnetization record layer 10.

It is desirable that the reference layer 21 and the sensor layer 23 which have the in-plane magnetic anisotropies contain at least one material selected from the group consisting of Fe, Co and Ni. In addition, it is possible to adjust for a desired magnetic property by adding any of B, C, N, O, Al, Si, P, Ti, V, Cr, Mn, Cu, Zn, Zr, Nb, Mo, Tc, Ru, Rh, Ag, Hf, Ta, W, Re, Os, Ir, and Au. Specifically, Ni—Fe, Co—Fe, Fe—Co—Ni, Ni—Fe—Zr, Co—Fe—B, Co—Fe—Zr—B, and so on are exemplified. Also, it is desirable that the barrier layer 22 is composed of insulating material. Specifically, Mg—O, Al—O, Al—N, Ni—O, Hf—O, and so on are exemplified. Besides, it is possible to attain the present invention even if a non-magnetic material such as a semiconductor material and a metal material is used as the barrier layer 22. Specifically, Cr, Al, Cu, Zn, and so on are exemplified.

It should be noted that it is desirable that the materials having large magneto-resistance effect ratios, which are equivalent to a SN ratio in a read signal, are selected for the sensor layer 23, the reference layer 21 and the barrier layer 22. For example, in an MTJ of a Co—Fe—B/Mg—O/Co—Fe—B system, a very large magneto-resistance effect ratio is reported to be in an order of 500%. From this viewpoint, it is desirable that the sensor layer 23 and the reference layer 21 are formed of a material of the Co—Fe—B system and the barrier layer 22 is formed of a material of the Mg—O system.

The magnetization record layer 10 is provided with a $0^{th}$ magnetization fixed region 11a, a first magnetization fixed region 11b, a second magnetization fixed region 11e, a first domain wall motion region 13a and a second domain wall motion region 13b. The first domain wall motion region 13a and the second domain wall motion region 13b are connected with both sides of the $0^{th}$ magnetization fixed region 11a, respectively. The first magnetization fixed region 11b and the second magnetization fixed region 11e are connected to the outer sides of the first domain wall motion region 13a and the second domain wall motion region 13b, respectively.

The first magnetization fixed region 11b, the $0^{th}$ magnetization fixed region 11a and the second magnetization fixed region 11c are ferromagnetic regions having fixed magnetization directions and having perpendicular magnetic anisotropy. Here, the perpendicular magnetic anisotropy means the magnetic anisotropy perpendicular to the x- and y-plane in the example of these figures. Hereinafter, this is same in the whole specification. The magnetization direction of the first magnetization fixed region 11b and that of the second magnetization fixed region 11c are substantially same and the magnetization direction of the $0^{th}$ magnetization fixed region 11a is opposite to the magnetization directions of them. That is, the magnetization direction of the first magnetization fixed region 11b and that of the second magnetization fixed region 11e are fixed to a parallel direction to each other. The magnetization direction of the first magnetization fixed region 11b or the second magnetization fixed region 11c and that of the $0^{th}$ magnetization fixed region 11a are fixed to an anti-parallel direction to each other. It should be noted that the magnetization direction of the first magnetization fixed region 11b or the second magnetization fixed region 11c and the magnetization direction of the $0^{th}$ magnetization fixed region 11a are sufficient to generate domain walls 12a and 12b, and do not mean the same and opposition directions in strict meaning. Also, the phrase of "magnetization is fixed" means that the magnetization direction does not change before and after a write operation. Even if the magnetization direction of a part of the magnetization fixed region changes during the write operation, it turns back after the write operation. Hereinafter, this is applied to the whole specification. In the example of these figures, the magnetization direction of the first magnetization fixed region 11b and that of the second magnetization fixed region 11c are a direction of +z and the magnetization direction of the $0^{th}$ magnetization fixed region 11a is a direction of −z. These magnetizations directions may be opposite.

It is desirable that the first magnetization fixed region 11b and the second magnetization fixed region 11c are formed to be substantially the same. The reason is in that it is the easiest to form them in a same process from the viewpoint of the manufacturing process and they have high symmetric property from the viewpoint of the stability and the reliability in the write operation and retention of data to be mentioned later. Here, the phrase of "substantially same" means that the shape and material are same in a range of variation of the manufacturing process, including a film thickness. In this case, a method of fixing magnetization, too, is same, as described later.

It is desirable that first hard layers 40 are formed in the neighborhood of the first magnetization fixed region 11b and the second magnetization fixed region 11c. The first hard layers 40 reinforce coercive forces of the first magnetization fixed region 11b and the second magnetization fixed region 11c to be effectively larger than the coercive forces of the first domain wall motion region 13a, the $0^{th}$ magnetization fixed region 11a and the second domain wall motion region 13b, and as a result of this, the initialization can be facilitated. It is desirable that when the first hard layer 40 is provided, a magnetization fixed portion which includes the first hard layer 40, in each of a set of the first magnetization fixed region 11b and the first hard layer 40, and a set of the second magnetization fixed region 11c and the first hard layer 40, is substantially the same in the above-mentioned meaning.

The first domain wall motion region 13a and the second domain wall motion region 13b are ferromagnetic regions which have invertible magnetization, which have a perpendicular magnetic anisotropy, and through which domain walls are movable. Therefore, a possible combination of the magnetization directions of the first domain wall motion region 13a and the second domain wall motion region 13b is $2^2$=4. In the present exemplary embodiment of the present invention, two combinations of magnetization directions (+z, −z), and (−z, +z) among them are used in accordance with the data to be stored.

The above-mentioned magnetic tunnel junction section 20 is provided in the neighborhood of the $0^{th}$ magnetization fixed region 11a. The magnetization direction of the reference layer 21 of the magnetic tunnel junction section 20 is a direction of a line which links the first domain wall motion region 13a and the second domain wall motion region 13b. In the example of these figures, the magnetization direction of the reference layer 21 is the ±x directions which are a direction of a line which links (the center of gravity of) the first domain wall motion region 13a and (the center of gravity of) the second domain wall motion region 13b. The magnetization direction of the sensor layer 23 will be described later.

It is desirable that the magnetization record layer 10 having the perpendicular magnetic anisotropy contains at least a material selected from the group consisting of Fe, Co and Ni. Moreover, it is possible to stabilize the perpendicular magnetic anisotropy by containing Pt and Pd. In addition, it is possible to adjust for the desired magnetic property by adding any of B, C, N, O, Al, Si, P, Ti, V, Cr, Mn, Cu, Zn, Zr, Nb, Mo, Tc, Ru, Rh, Ag, Hf, Ta, W, Re, Os, Ir, Au, and Sm. Specifically, Co, Co—Pt, Co—Pd. Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd. Sm—Co, Gd—Fe—Co, Tb—Fe—Co, Gd—Tb—Fe—Co, and so on are exemplified. Besides, it is possible to realize the magnetic anisotropy in a perpendicular direction by alternately laminating a layer containing a material selected from Fe, Co and Ni and a different layer. Specifically, laminate films are exemplified in which Co/Pd, Co/Pt, Co/Ni, Fe/Au are alternately laminated. Also, the above-mentioned ferromagnetic material and anti-ferromagnetic material such as PtMn, NiMn, and FcMn may be used for the first hard layer 40.

The typical sizes of sections of the magnetic Memory device 1 in a case of the design rule of F=90 nm, are 450 nm×90 nm×5 nm$^t$ for the magnetic recording layer 10, and 90 nm×90 nm×25 nm$^t$ for the reference layer 21 of the magnetic tunnel junction section 20, 90 nm×90 nm×1 nm$^t$ for the barrier layer 22 thereof, 90 nm×90 nm×2 nm$^t$ for the sensor layer 23 thereof, and 90 nm×90 nm×20 nm$^t$ for the contact layer 30.

2. Storage State of Data

Figure 5A:
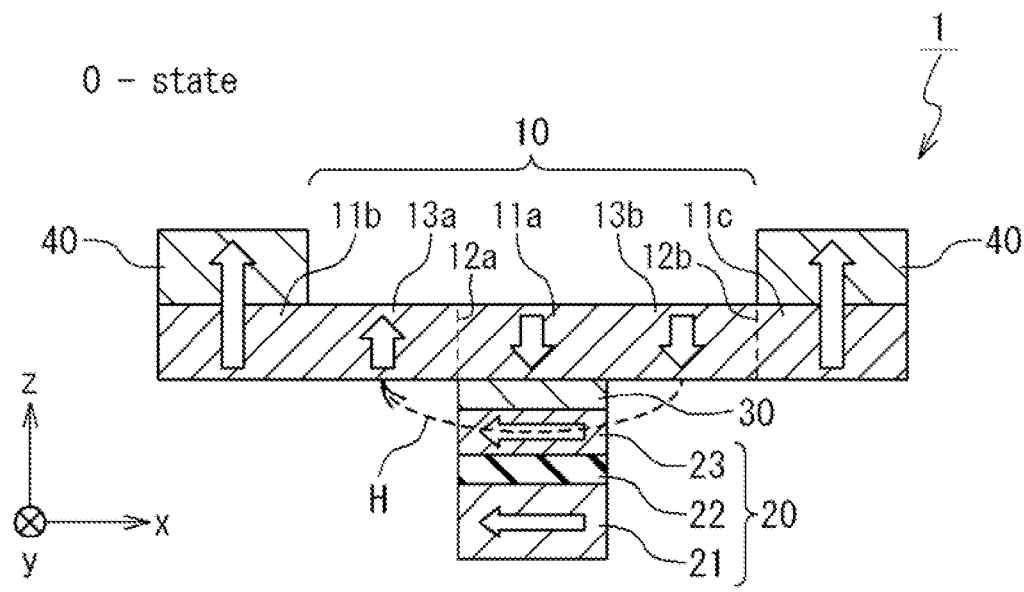
FIG. 5A is a sectional view showing the configuration of the magnetic memory device according to the first exemplary embodiment of the present invention.
Figure 5B:
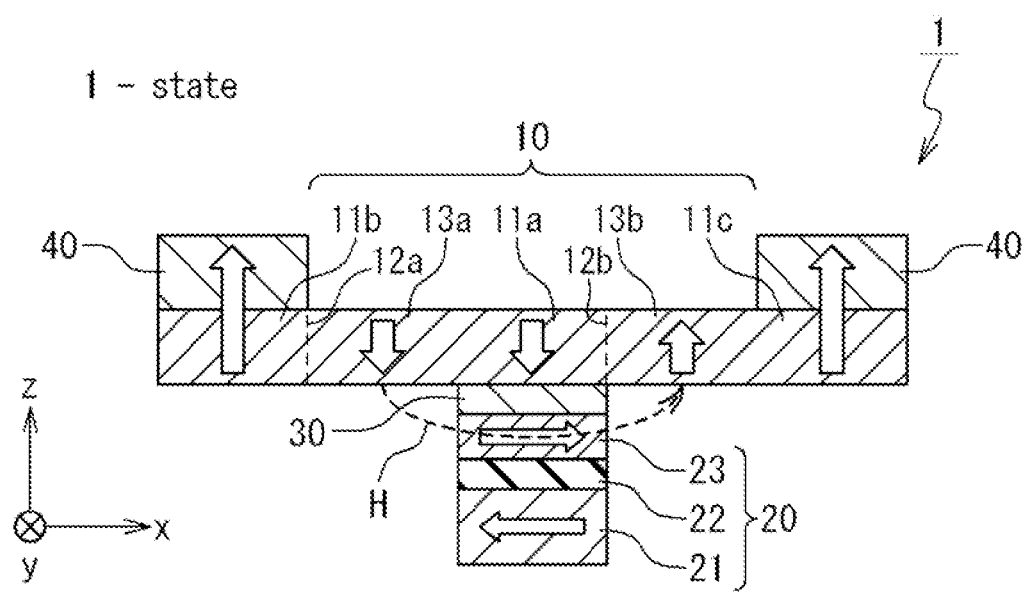
FIG. 5B is a sectional view showing the configuration of the magnetic memory device according to the first exemplary embodiment of the present invention.

FIG. 5A and FIG. 5B are sectional views showing an example of the configuration of the magnetic memory device 1 according to the first exemplary embodiment of the present invention. FIG. 5A show a state in which the data of "0" is stored (0-state) and FIG. 5B shows a state in which the data of "1" is stored (1-state). In the present exemplary embodiment, the magnetization record layer 10 retains the data as a relation of the magnetization directions in the respective domain wall motion regions. Hereinafter, the retention of data will be described in detail.

As shown in FIG. 5A, when the magnetization record layer 10 retains the data of "0", the magnetization direction of the first domain wall motion region 13a is the direction of +z and the magnetization direction of the second domain wall motion region 13b is the direction of −z, i.e. (+z, −z). At this time, the first magnetization fixed region 11b and the first domain wall motion region 133 have the magnetizations in the direction of +z. The $0^{th}$ magnetization fixed region 11a and the second domain wall motion region 13b have the magnetizations in the direction of −z. The second magnetization fixed region 11c has the magnetization in the direction of +z. That is, a set of the first magnetization fixed region 11b and the first domain wall motion region 13a, a set of the $0^{th}$ magnetization fixed region 11a and the second domain wall motion region 13b, and a set of the second magnetization fixed region 11c form separate magnetic domains. In other words, the domain walls 12a and 12b are formed between the first domain wall motion region 13a and the $0^{th}$ magnetization fixed region 11a and between the second domain wall motion region 13b and the second magnetization fixed region 11c, respectively.

At this time, the magnetic field H is generated to direct from the second domain wall motion region 13b to the first domain wall motion region 13a on the lower-side of the magnetization record layer 10 (on the side of −z). The magnetic field H directs to the direction of −x in the neighborhood of the sensor layer 23. Thus, the magnetization of the sensor layer 23 directs to the direction of −x. That is, the data stored in the magnetization record layer 10 is reflected in the sensor layer 23. As a result, the magnetization direction of the sensor layer 23 and the magnetization direction of the reference layer 21 become parallel to each other in the magnetic tunnel junction section 20. Therefore, by detecting a resistance value in the ±z direction of the magnetic tunnel junction section 20, this parallel state can be detected. That is, the data "0" stored in the magnetization record layer 10 can be read.

On the other hand, as shown in FIG. 5B, when the magnetization record layer 10 stores the data of "1", the magnetization direction of the first domain wall motion region 13a is the direction of −z and the magnetization direction of the second domain wall motion region 13b is the direction of +z. i.e. (−z, +z). At this time, a set of the first magnetization fixed region 11b has the magnetization in the direction of +z, a set of the first domain wall motion region 13a and the $0^{th}$ magnetization fixed region 11a has the magnetization to the direction of −z, and a set of the second domain wall motion region 13b and the second magnetization fixed region 11c has the magnetization in the direction of +z. That is, the set of the first magnetization fixed region 11b, the set of the first domain wall motion region 13a and the $0^{th}$ magnetization fixed region 11a, and the set of the second domain wall motion region 13b and the second magnetization fixed region 11c form different magnetic domains. In other words, the domain walls 12a and 12b are formed between the first magnetization fixed region 11b and the first domain wall motion region 13a and between the $0^{th}$ magnetization fixed region 11a and the second domain wall motion region 13b, respectively.

At this time, the magnetic field H is generated on the lower-side of the magnetization record layer 10 (on the side in the −z direction) to direct from the first domain wall motion region 13a to the second domain wall motion region 13b. The magnetic field H directs to the direction of in the neighborhood of the sensor layer 23. Thus, the magnetization direction of the sensor layer 23 is the direction of +x. That is, the data stored in the magnetization record layer 10 is reflected in the sensor layer 23. As a result, the magnetization direction of the sensor layer 23 and the magnetization direction of the reference layer 21 become anti-parallel in the magnetic tunnel junction section 20. Therefore, by detecting the resistance value in the direction of ±z of the magnetic tunnel junction section 20, this anti-parallel state can be detected. That is, the data of "1" stored in the magnetization record layer 10 can be read.

In such a state that the data is retained, the magnetization recorded in the sensor layer 23 through magnetic interaction among the sensor layer 23, the second domain wall motion region 13b and the first domain wall motion region 13a, has the effect to stabilize the magnetization states of the second domain wall motion region 13b and the first domain wall motion region 13a (the magnetization directions). Thus, in each state of FIG. 5A and FIG. 5B, the domain walls 12a and 12b can be fixed (retained) on the desired positions more stably. That is, the retention characteristic of the magnetic memory device can be improved.

It should be noted that a method of stopping the domain walls 12a and 12b on the positions in the states shown in FIG. 5A and FIG. 5B will be described later.

3. Initializing Method of Magnetization Fixed Region

Figure 6A:
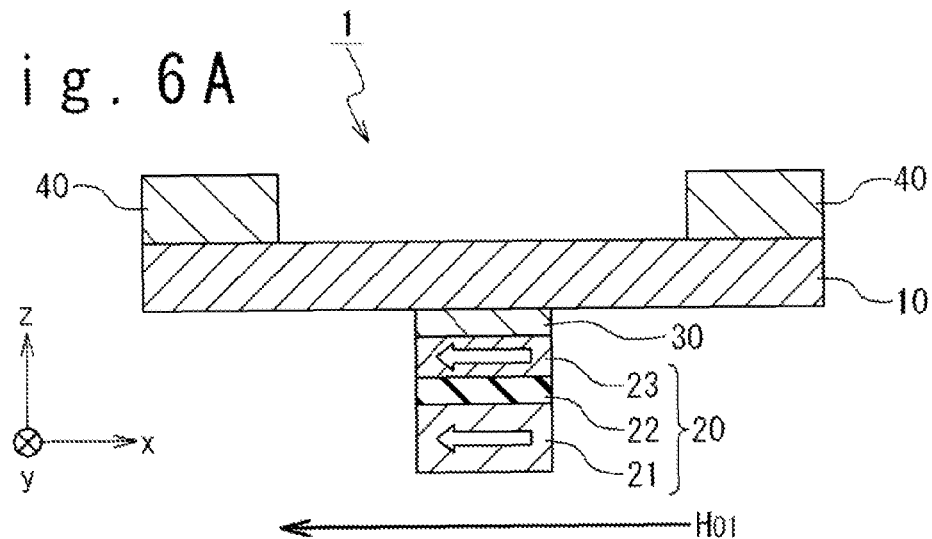
FIG. 6A is a sectional view showing an initializing method of the magnetic memory device according to the exemplary embodiment of the present invention.
Figure 6B:
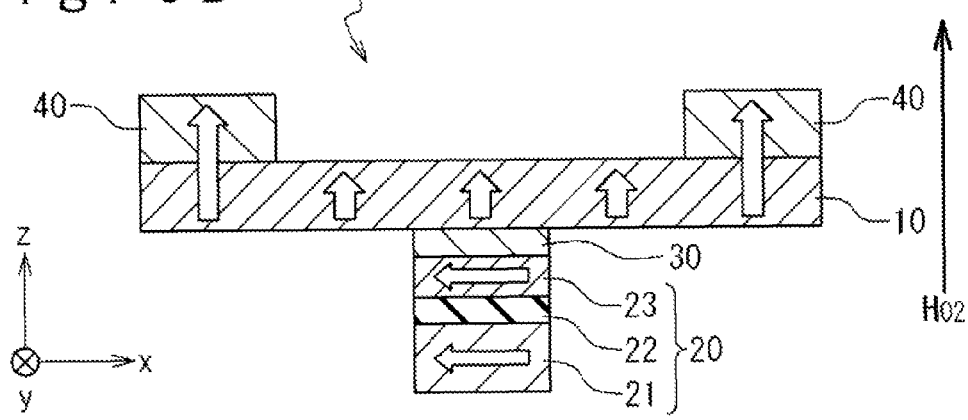
FIG. 6B is a sectional view showing the method of initializing the magnetic memory device according to the exemplary embodiment of the present invention.
Figure 6C:
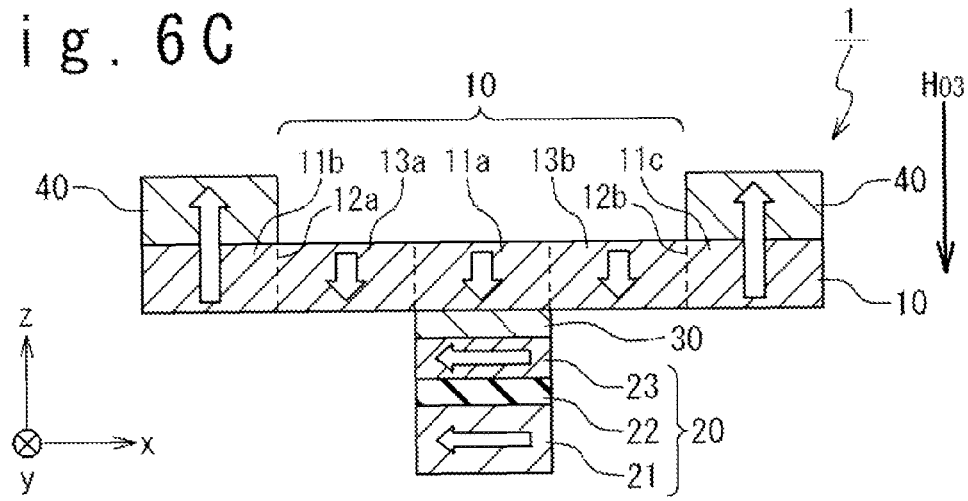
FIG. 6C is a sectional view showing the initializing method of the magnetic memory device according to the exemplary embodiment of the present invention.

Next, a method of initializing the magnetic memory device according to the first exemplary embodiment of the present invention will be described. FIGS. 6A to 6C are sectional views showing an example of the method of the initializing the magnetic memory device according to the first exemplary embodiment of the present invention.

At first, as shown in FIG. 6A, the magnetic memory device 1 is heated to a predetermined temperature in an annealing furnace in a magnetic field, and is cooled while applying the magnetic field H01 to the magnetic memory device 1 in the direction of −x (Step 1). The reference layer 21 of the magnetic tunnel junction section 20 is magnetized to the direction of −x by heating and magnetizing the magnetic memory device 1 in the magnetic field H01. At this time, because the magnetization record layer 10 is formed of the material which has the perpendicular magnetic anisotropy, the magnetization record layer 10 is never magnetized to the −x direction.

Next, magnetic field H02 is applied to the magnetic memory device 1 in the direction of +z, as shown in FIG. 6B (Step 2). Here, the magnetic field H02 is stronger than the coercive forces of the first hard layer 40 and the magnetization record layer 10. Thus, the whole magnetization of the first hard layer 40 and the magnetization record layer 10 turns to the direction of +z. At this time, because the reference layer 21 of the magnetic tunnel junction section 20 is formed of the material which has the in-plane magnetic anisotropy, and is magnetized through heating, it is never magnetized to the direction of +z. Also, the first magnetization fixed region 11b and the second magnetization fixed region 11c have the effective coercive forces larger than the coercive forces of the first domain wall motion region 13a, the $0^{th}$ magnetization fixed region 11a and the second domain wall motion region 13b, through the exchange coupling with the first hard layer 40.

After that, magnetic field H03 is applied to the magnetic memory device 1 in the direction of −z as shown in FIG. 6C (Step 3). Here, this magnetic field H03 is stronger than the coercive forces of the first domain wall motion region 13a, the $0^{th}$ magnetization fixed region 11a and the second domain wall motion region 13b, and weaker than the effective coercive forces of the first magnetization fixed region 11b and the second magnetization fixed region 11e. Thus, the magnetization directions of the first domain wall motion region 13a, the $0^{th}$ magnetization fixed region 11a, and the second domain wall motion region 13b of the magnetization record layer 10, which have relatively weaker coercive force, are inverted to the direction of −z. There is no case that the first magnetization fixed region 11b and the second magnetization fixed region 11c, which have relatively stronger coercive force, of the magnetization record layer 10 are never magnetized to the −z directions. Also, the reference layer 21 of the magnetic tunnel junction section 20 is formed of the material which has the in-plane magnetic anisotropy and is magnetized through heating, the reference layer 21 is never magnetized to the −z direction.

By the above initializing method, three regions are formed which include the first magnetization fixed region 11b, the second magnetization fixed region 11c, and a coupled reason of the first domain wall motion region 13a, the $0^{th}$ magnetization fixed region 11a and the second domain wall motion region 13b. The domain walls 12a and 12h are formed in the boundary between the coupled region and the first magnetization fixed region 11b and in the boundary between the coupled region and the second magnetization fixed region 11c, respectively. This state is different from the state that the data "0" is stored as shown in FIG. 5A, or that the data "1" is stored as shown in FIG. 5B, but is the state which data can be stored through the write operation to be mentioned later. That is, by executing the write operation of the data "0" or the data "1", the data "0" or the data "1" can be stored.

4. Write Operation

Next, the data write principle into the magnetic memory device will be described. In the write operation, a current is supplied such that the current is supplied from the magnetization fixed region on the side of the domain wall motion region for its magnetization to turn to the direction of +2, and electrons are drawn from the side of the domain wall motion region for its magnetization to turn to the direction of −z. Hereinafter, the write operation will be described in detail.

FIG. 7 shows sectional views of the magnetic memory device according to the first exemplary embodiment of the present invention in the data write operation. The data write operation is performed by a domain wall motion method which uses spin transfer. A write current 1w flows into not a direction to pass through a MTJ (magnetic tunnel junction) section 20 but an in-plane direction of the magnetization record layer 10 while passing though the domain walls 11a and 12b. The write current Iw is supplied to the magnetization record layer 10 from either of a current supply terminal (not shown) connected with the first magnetization fixed region 11b or a current supply terminal (not shown) connected with the second magnetization fixed region 11c.

As shown in (a) of FIG. 7, the state that the magnetization direction of the first domain wall motion region 13a is the direction of +z, and the magnetization direction of the second domain wall motion region 13b is the direction of −z is related to the data "0". This is as shown in FIG. 5A. Here, as shown in (b) of FIG. 7, in case of the write operation of the data "1", a first write current Iw1 (solid line arrow) is supplied from the current supply terminal on the side of the first magnetization fixed region 11b. The first write current Iw1 flows to the second magnetization fixed region 11c through the first magnetization fixed region 11b, the first domain wall motion region 13a, the $0^{th}$ magnetization fixed region 11a, the $0^{th}$ magnetization fixed region 11a and the second domain wall motion region 13b. The first write current Iw1 is ejected from the current supply terminal on the side of the second magnetization fixed region 11c. In this case, the motion direction of electrons e⁻ (broken line arrow) is opposite to the flow direction of the first write current Iw1. As a result, the spin electrons e⁻ are injected into the second domain wall motion region 13b from the second magnetization fixed region 11c. The domain wall 12b is driven due to spin of injected electrons e⁻ from the boundary between the second magnetization fixed region 11c and the second domain wall motion region 13b to a direction of the $0^{th}$ magnetization fixed region 11a. As a result, the magnetization direction of the second domain wall motion region 13b is switched to the direction of +z due to the spin transfer effect. The domain wall 12b is moved to the boundary between the second domain wall motion region 13b and the $0^{th}$ magnetization fixed region 11a. Moreover, spin electrons e⁻ are injected into the first domain wall motion region 13a from the $0^{th}$ magnetization fixed region 11a. The domain wall 11a is driven due to spin of the injected electrons e⁻ from the boundary between the $0^{th}$ magnetization fixed region 11a and the first domain wall motion region 13a to the direction of the first magnetization fixed region 11b. As a result, the magnetization direction of the first domain wall motion region 13a is switched to the direction of −z due to the spin transfer effect. The domain wall 12a is moved to the boundary between the first domain wall motion region 13a and the first magnetization fixed region 11b. Thus, the data "1" is written as shown in (c) of FIG. 7.

On the other hand, as shown in (c) of FIG. 7, a state that the magnetization direction of the first domain wall motion region 13a is the direction of −z and the magnetization direction of the second domain wall motion region 13b is the direction of +z is related to the data "1". This is as shown in FIG. 5B. Here, as shown in (d) of FIG. 7, in a case of the write operation of the data "0", the second write current Iw2 (solid line arrow) is supplied from the current supply terminal on the side of the second magnetization fixed region 11c. The second write current Iw2 flows to the first magnetization fixed region 11b through the second magnetization fixed region 11c, the second domain wall motion region 13b, the $0^{th}$ magnetization fixed region 11a and the first domain wall motion region 13a. The current is drawn out from the current supply terminal on the side of the first magnetization fixed region 11b. In this case, the motion direction of electrons e⁻ (broken line arrow) is opposite to the flow direction of the second write current Iw2. As a result, the spin electrons e⁻ are injected into the first domain wall motion region 13a from the first magnetization fixed region 11b. The domain wall 12a is driven due to spin of the injected electrons e⁻ from the boundary between the first magnetization fixed region 11b and the first domain wall motion region 13a to a direction of the $0^{th}$ magnetization fixed region 11a. As a result, the magnetization direction of the first domain wall motion region 13a is switched to the direction of +z due to the spin transfer effect. The domain wall 12a is moved to the boundary between the first domain wall motion region 13a and the $0^{th}$ magnetization fixed region 11a. Moreover, electrons e⁻ are injected into the second domain wall motion region 13b from the $0^{th}$ magnetization fixed region 11a. The domain wall 12b is driven due to spin of the injected electrons e⁻ from the boundary between the $0^{th}$ magnetization fixed region 11a and the second domain wall motion region 13b to a direction of the second magnetization fixed region 11c. As a result, the magnetization direction of the second domain wall motion region 13b is switched to the direction of −z due to the spin transfer effect. The domain wall 12b is moved to the boundary between the second domain wall motion region 13b and the second magnetization fixed region 11e. In this way, the write of the data "0" is performed in as shown in (a) of FIG. 7.

In this way, the magnetization directions of the first domain wall motion region 13a and the second domain wall motion region 13b are respectively switched with the write currents Iw1 and Iw2 which flow through the magnetization record layer 10 in a plane. The data "0" and "1" can be differently written and stored based on combinations of the magnetization directions. At this time, the magnetization fixed regions on both sides of each domain wall motion region have the magnetization directions anti-parallel to each other and function as different supply sources of the spin electrons to the domain wall motion region. It should be noted that when the domain wall 12 is initially in a position after the write operation, the state of the domain wall 12 is maintained regardless of the injection of spin electrons e⁻. Therefore, the over-write, too, is possible.

In this case, the magnetization record layer 10 is formed of a material having the perpendicular magnetic anisotropy. For this reason, the magnetization directions of the respective regions of the magnetization record layer 10 are perpendicular to the write currents Iw1 and Iw2. Therefore, the values of write currents Iw1 and Iw2 can be remarkably reduced. At this time, the write currents Iw1 and Iw2 may pass wherever later if they pass through the domain walls 12a and 12b.

5. Read Operation

Next, the read principle of the data from the magnetic memory device will be described.

Figure 8A:
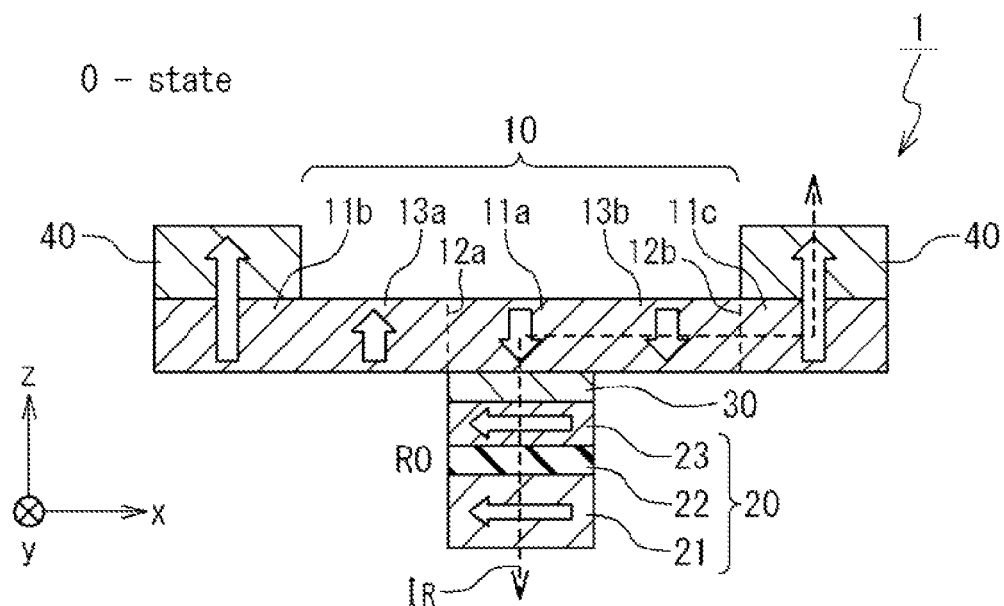
FIG. 8A is a sectional view showing a data read principle according to the exemplary embodiment of the present invention.
Figure 8B:
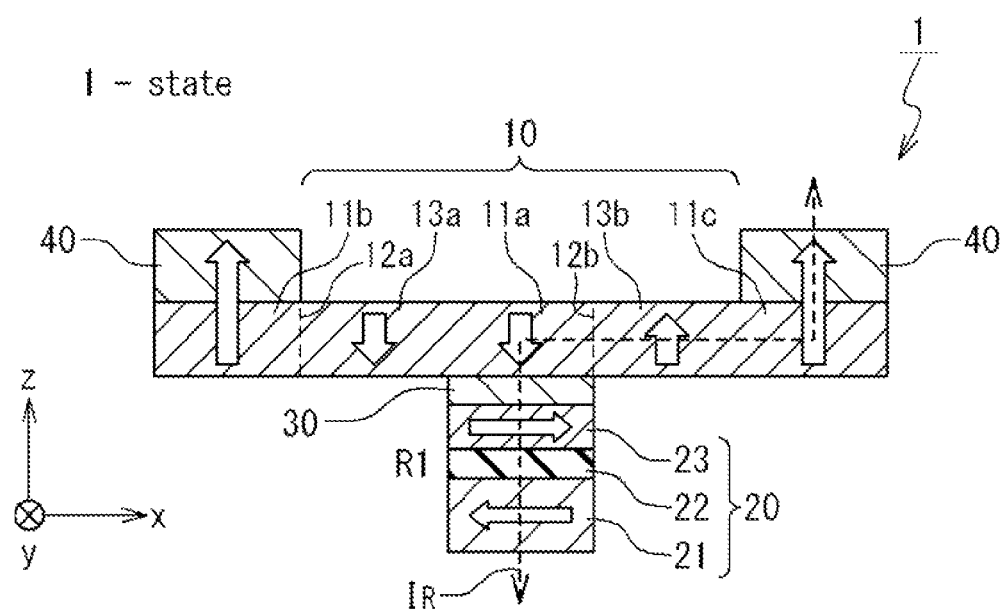
FIG. 8B is a sectional view showing the data read principle according to the exemplary embodiment of the present invention.

FIG. 8A and FIG. 8B are sectional views showing the read principle of the data from the magnetic memory device according to the first exemplary embodiment of the present invention. Upon the data read, a read current IR is supplied to pass through an MTJ of the magnetic tunnel junction section 20 (the reference layer 21, the barrier layer 22 and the sensor layer 23). If the read current IR is supplied in such a manner, the read current IR may flow and may not flow through the magnetization record layer 10. In the example of FIG. 8A and FIG. 8B, the read current IR is supplied from either one of a current supply terminal on the side of the reference layer 21 and the current supply terminal on the side of the second magnetization fixed region 11c and is outputted from the other. Thus, the read current IR passes through the MTJ of the magnetic tunnel junction section 20 and flows through the 0$^{th}$ magnetization fixed region 11a, the second domain wall motion region 13b and the second magnetization fixed region 11c.

When the data "0" has been stored in the magnetization record layer 10 (reference to FIG. 8A), the magnetization direction of the sensor layer 23 is the direction of –x. On the other hand, the magnetization of the reference layer 21 is fixed on the direction of –x. That is, both of the magnetization directions are parallel. Therefore, by the above read current IR flowing, a low resistance value, i.e. "0" is read as the data stored in the magnetic memory device.

On the other hand, when the data "1" has been stored in the magnetization record layer 10 (sec FIG. 8B), the magnetization direction of the sensor layer 23 is the direction of +x. On the other hand, the magnetization of the reference layer 21 is fixed to the direction of –x. That is, both of the magnetization directions are anti-parallel. Therefore, by the above read current IR flowing, a high resistance value, i.e. the data "1" is read as the data in the magnetic memory device.

As mentioned above, the data stored in the magnetization record layer 10 of the magnetic memory device 1 can be read. Also, a relatively large current which is necessary to write data does not flows through the MTJ, and a relatively small current is sufficient to read the data flows through the MTJ. Therefore, the degradation of MTJ can be restrained.

6. Configuration and Operation of Magnetic Memory Cell and MRAM

Figure 9:
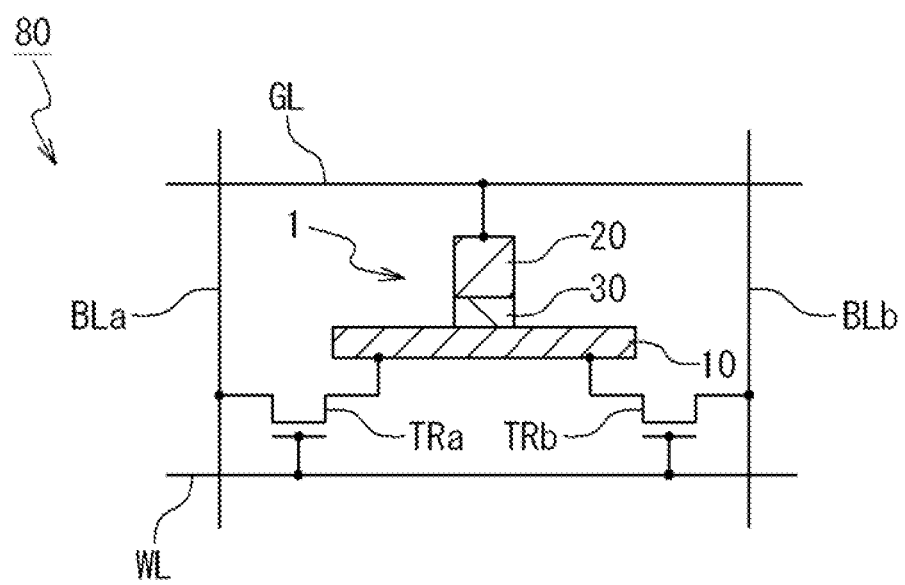
FIG. 9 is a diagram showing the configuration of a memory cell according to the first exemplary embodiment of the present invention.

FIG. 9 is a diagram showing a configuration example of the memory cell in which the magneto-resistance effect element according to the first exemplary embodiment of the present invention is integrated. As shown in FIG. 9, a terminal connected with the reference layer 21 of the magnetic tunnel junction section 20 is connected with a ground line GL for the read operation in the magneto-resistance effect element. One of two terminals connected with the first magnetization fixed region 11b and the second magnetization fixed region 11c in the magnetization record layer 10 is connected with one of source/drain of a MOS transistor Tra and the other of the two terminals is connected with one of source/drain of an MOS transistor TRb. Also, the other of the sources/drains of the MOS transistors Tra and TRb are connected with bit lines BLa and BLb for the write operation, respectively. Moreover, the gates of the MOS transistors TRa and TRb are connected with a word line WL. Here, the configuration of the magnetic memory cell 1 is not limited to this example.

Figure 10:
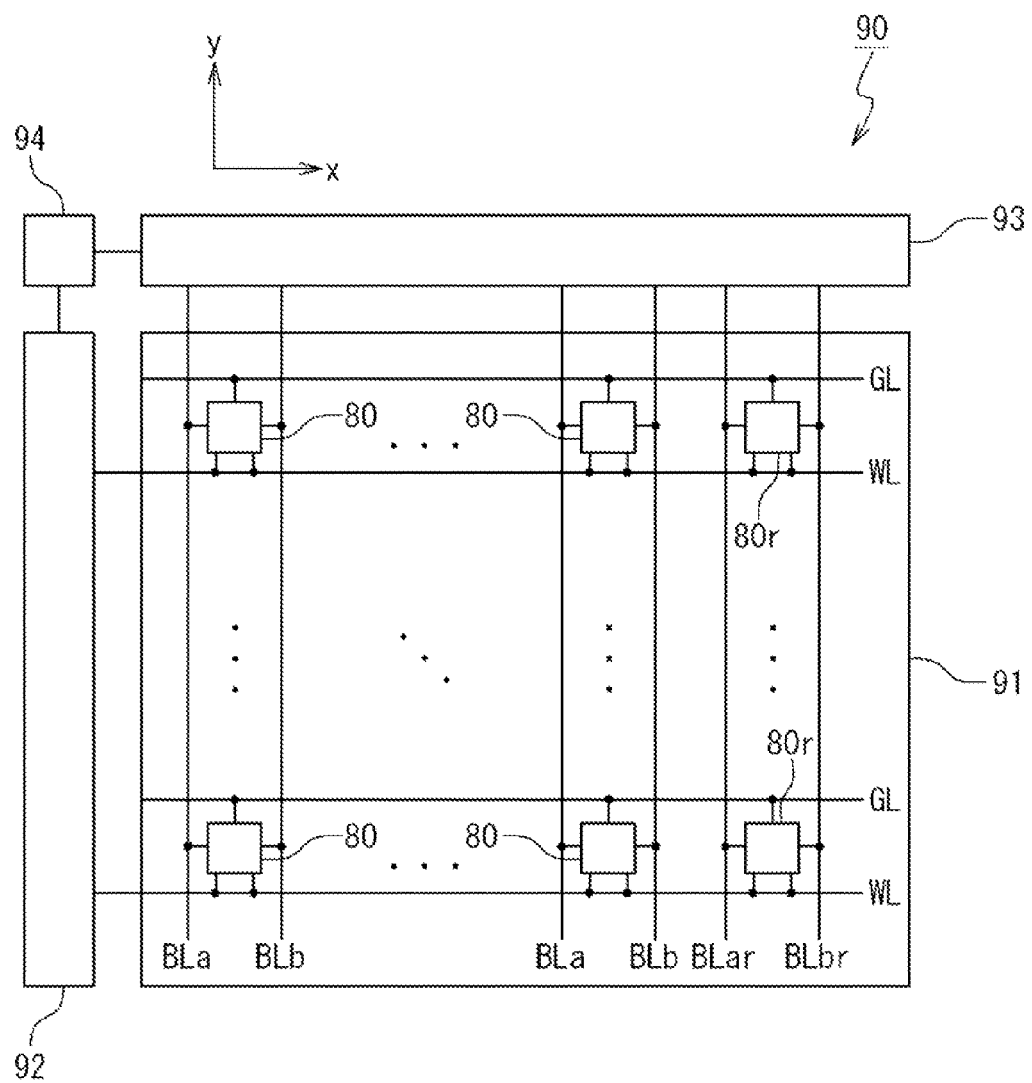
FIG. 10 is a block diagram showing the configuration of an MRAM according to the first exemplary embodiment of the present invention.

FIG. 10 is a block diagram showing the configuration example of the MRAM that the memory cell according to the first exemplary embodiment of the present invention is integrated. In FIG. 10, the MRAM 90 is provided with a memory array 91 in which a plurality of memory cells 80 are arranged in a matrix. The memory array 91 contains memory cells 80 for the data write described with reference to FIG. 9 and reference cells 80r to be referred to in a case of the data read. In an example of FIG. 10, one column is for the reference cells 80r. The structure of the reference cell 80r is the same as that of the memory cell 80. In this case, the MTJ of the reference cell 80r has a resistance value R0.5 as a middle value between a resistance value R0 when the data "0" has been stored and a resistance value R1 when the data "1" has been stored. Here, two columns of reference cells 80r may be provided, and one column may be used as the reference cells 80r for the resistance value R0 and the other column may be used as the reference cell 80r for the resistance value R1. In this case, the resistance value 0.5 is produced from the reference cell 80r for the resistance value R0 and the reference cell 80r for the resistance value R1 and is uses for the read operation.

The word line WL and the ground line GL extend into the X direction. The word line W is connected with an X-side control circuit 92. The X-side control circuit 92 selects the word line WL connected with the memory cell 80 as an object upon the data write operation and the data read operation as a selection word line WL. The bit lines BLa and BLb extend into the Y direction and are connected with the Y-side control circuit 93. The Y-side control circuit 93 selects the bit lines BLa and BLb connected with the memory cell 80 as the object upon the data write operation and the data read operation as selection bit lines BLa and BLb. The control circuit 94 controls the X-side control circuit 92 and the Y-side control circuit 93 in the data write operation and the data read operation.

Next, write and read methods to the MRAM will be described as shown in FIG. 10.

First, the write operation will be described. The X-side control circuit 92 selects the selection word line WL. The selection word line WL is pulled up to a "high" level in response to the selection so that the MOS transistors TRa and TRb are turned "ON". Also, the Y-side control circuit 93 selects the selection bit lines BLa and BLb. One of the selection bit lines BLa and BLb is pulled up to the "high" level and the other is pulled down to a "low" level in response to the selection. Which of the selection bit lines BLa and BLb should be pulled up to the "high" level is determined based on the data to be written in the magneto-resistance effect element 1. That is, the transistor in the high level is determined based on the direction of the write current Iw flowing through the magnetization record layer 10. From the above, the data "0" and the data "1" can be separately written. The X-side control circuit 92 and the Y-side control circuit 93, and the control circuit 94 which controls them, configure a "write current supply circuit" to supply the write current Iw to the memory cell 80.

Next, the read operation will be described. The X-side control circuit 92 selects the selection word line WL. The selection word line WL is pulled up to the "high" level in response to the selection so that the MOS transistors TRa and TRb are turned "ON". Also, the Y-side control circuit 93 selects the selection bit lines BLa and BLb. One of the selection bit lines BLa and BLb is pulled up to the "high" level and the other is set to an "open" state (a floating state). At this time, the read current IR flows from one of the selection bit lines BLa and BLb to the ground line GL through the second magnetization fixed region 11c, the second domain wall motion region 13b, the 0th magnetization fixed region 11a, the contact layer 30 and the magnetic tunnel junction section 20 (MTJ which is composed of sense layer 23, the barrier layer 22 and the reference layer 21). The potential of the bit line BL through which the read current IR flows or the value of the read current IR depends on the change of a resistance value of the magneto-resistance effect element 1 (the magnetic tunnel junction section 20) due to the magneto-resistance effect. By comparing with the output of the reference bit line BLr of the reference cell 80r through which a read current IR flows in the same way, and detecting the change of the resistance value as a voltage signal or a current signal, the read operation becomes possible at a high speed. The X-side control circuit 92 and the Y-side control circuit 93, and the control circuit 94 which controls them, configure a "read current supply and sense circuit" to supply the read current IR to the memory cell 80.

7. Position of Sensor Layer

The sensor layer 23 is provided on the lower side of the magnetization record layer 10 (the side of −z) through the contact layer 30, as shown in FIG. 4A to FIG. 8B. If the magnetization direction of the sensor layer 23 is possible to be inverted with the magnetic field of the first domain wall motion region 13a and the second domain wall motion region 13b, the magnetic tunnel junction section 20 may be provided upside down, i.e. the reference layer 21 may contact the contact layer 30 (not shown).

Also, the sensor layer 23 may be provided on the upper side (the side of +z) of the magnetization record layer 10 through the contact layer 30 (not shown). Moreover, if the magnetization direction of the sensor layer 23 is possible to be inverted with the magnetic field of the first domain wall motion region 13a and the second domain wall motion region 1313, the magnetic tunnel junction section 20 may be provided upside down, i.e. the reference layer 21 may contact the contact layer 30 (not shown).

Moreover, if the magnetization direction of the sensor layer 23 is possible to be inverted with the magnetic field of the first domain wall motion region 13a and the second domain wall motion region 13b, the sensor layer 23 may not be electrically connected with the magnetization record layer 10 (not shown), without providing the contact layer 30 for the magnetic memory device 1. In this case, current supply terminals are provided on the both ends of the magnetization record layer 10 for the write current while current supply terminals are additionally provided on the both ends of the magnetic tunnel junction section 20 for the read current.

Moreover, the sensor layer 23 may be provided directly on the $0^{th}$ magnetization fixed region 11a (the side of +z) of the magnetization record layer 10 or directly under the $0^{th}$ magnetization fixed region 11a (the side of −z) as shown in FIG. 4A to FIG. 8B. That is, the projection of the sensor layer 23 onto the magnetization record layer 10 overlaps with the $0^{th}$ magnetization fixed region 11a. This configuration is desirable in that the magnetization direction of the sensor layer 23 can be inverted more stably with the magnetic field by the first domain wall motion region 13a and the second domain wall motion region 13b.

Also, if the magnetization direction of the sensor layer 23 is possible to be inverted with the magnetic field of the first domain wall motion region 13a and the second domain wall motion region 13b, the sensor layer 23 may be provided on the back side (the side of +y) of the $0^{th}$ magnetization fixed region 11a of the magnetization record layer 10, or on the front side (the side of −y) (not shown). It is desirable that the projection of the sensor layer 23 to the magnetization record layer 10 overlaps with at least a part of the region of the magnetization record layer 10 between the first domain wall motion region 13a and the second domain wall motion region 13b. Such a region is a region which contains a part of the $0^{th}$ magnetization fixed region 11a, and moreover may contains at least one of a part of the first domain wall motion region 13a and a part of the second domain wall motion region 13b.

Also, if the magnetization direction of the sensor layer 23 is possible to be inverted with the magnetic field of the first domain wall motion region 13a and the second domain wall motion region 13b, the sensor layer 23 may be provided on the back side of the $0^{th}$ magnetization fixed region 11a of the magnetization record layer 10 (the side of +y), or on the front-side thereof (the side of −y). Moreover, it may be provided on the left side (the side of −x) or on the right side (the direction of +x) (not shown). At the time, it is desirable that the projection of the sensor layer 23 to the magnetization record layer 10 overlaps with at least a part of a region of the magnetization record layer 10 between the first domain wall motion region 13a and the second domain wall motion region 13b. Such a region contains a part of the $0^{th}$ magnetization fixed region 11a and moreover, it may contain either of a part of the first domain wall motion region 13a and a part of the second domain wall motion region 13b.

In the present exemplary embodiment, the sensor layer 23 and the magnetization record layer 10 are desired to satisfy a position relation of them such that the magnetization direction of the sensor layer 23 is possible to be inverted with the magnetic field of the first domain wall motion region 13a and the second domain wall motion region 13b. Therefore, the degree of freedom of the sensor layer 23 becomes high.

8. Physical Relation of Sensor Layer and Hard Layer

Figure 11:
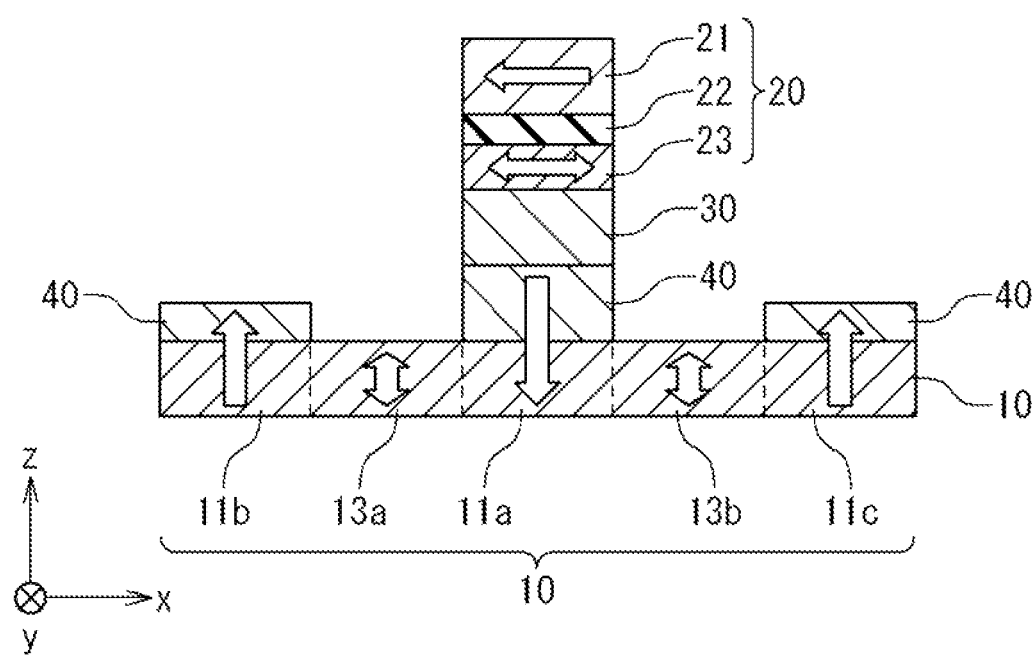
FIG. 11 is a block diagram showing a modification of a position relation between a sensor layer and a hard layer of the magnetic memory device according to the exemplary embodiment of the present invention.

FIG. 11 is a diagram showing a variation of the position relation of the sensor layer and the hard layer in the magnetic memory device according to the exemplary embodiment of the present invention. Here, FIG. 11 is a sectional view.

In the present exemplary embodiment, the position relation of the sensor layer 23 and hard layer 40 to the magnetization record layer 10 is optional. For example, as shown in FIG. 4B, the sensor layer 23 may be provided on the lower side of the magnetization record layer 10 (the side of −z), and the hard layer 40 may be provided on the upper side of the magnetization record layer 10 (the side of +z). Also, although not shown, the sensor layer 23 may be provided on the upper side of the magnetization record layer 10 (the side of +z), and the hard layer 40 may be provided on the lower side of the magnetization record layer 10 (the side of −z). Or, as shown in FIG. 11, the sensor layer 23 may be provided on the upper side of the magnetization record layer 10 (the side of +z), and the hard layer 40 may be provided on the upper side on the magnetization record layer 10 (the side of +z). In this way, in the present exemplary embodiment, there is no constraint in the position relation if the hard layer 40 can realize a predetermined magnetization structure of the magnetization record layer 10 and also the sensor layer 23 can read the magnetization directions of the first domain wall motion region 13a and the second domain wall motion region 13b.

It is desirable that in order to introduce the domain walls into the magnetization record layer 10 and to easily realize the predetermined magnetization structure, the hard layers 40 are provided in adjacent to an upper surface of the magnetization record layer 10. In case of the structure that the hard layers 40 are provided in adjacent to the upper surface of the magnetization record layer 10, strong exchange coupling can be obtained among the hard layer 40 and the magnetization record layer 10, because the magnetization record layer 10 and the hard layer 40 can be continuously formed.

On the other hand, from the viewpoint of a device layout, it is desirable that the magnetic tunnel junction section 20 for the read is provided on the upper-side (the side of +z) of the magnetization record layer 10. The reason is in that the write current must be introduced into the magnetization record layer 10 through the transistor. At this time, the write current is supplied from the lower-side (the side of −z) of the magnetic memory device 1. Therefore, it is desirable that the read wiring is provided on the upper-side (the side of +z) of the magnetic memory device 1. It is possible to lay out the pattern of the device so that the cell area is minimized when the read wiring is provided on the upper-side (the side of +z) of the magnetic memory device 1.

Therefore, from the above-mentioned viewpoint, an example in which both of the hard layer 40 and the sensor layer 23 are arranged on the upper-side (the side of +z) of the magnetization record layer 10 as shown in FIG. 11 would be the most desirable from the initialization of the magnetic memory device 1 and the easiness of the layout.

It should be noted that it is desirable that in order to initialize the memory state of the magnetic memory device 1 more easily, the hard layers 40 are formed as follows. That is, as described above, in the present exemplary embodiment, the magnetization directions of the first magnetization fixed region 11b and the second magnetization fixed region 11c are fixed to a parallel direction to each other and the $0^{th}$ magnetization fixed region 11a is fixed to an anti-parallel direction to these magnetization directions. Therefore, it is desirable that a difference in magnetic property is present between the hard layer 40 neighboring to the first magnetization fixed region 11b or the second magnetization fixed region 11c and the hard layer 40 neighboring to the $0^{th}$ magnetization fixed region 11a. The difference in magnetic property can be given by, for example, a film thickness difference and so on. As a specific example, as shown in FIG. 11, when the film thickness of the hard layer 40 neighboring the first magnetization fixed region 11b or the second magnetization fixed region 11c is formed to be thinner than that of the hard layer 40 neighboring to the $0^{th}$ magnetization fixed region 11a, it is easy to initialize the magnetization record layer 10 to have a predetermined magnetization structure.

Exemplary embodiments in which N is equal to or more than 2 will be described in the subsequent description. Here, position relation between the magnetization record layer 10 and the above-mentioned sensor layer 23 and hard layer 40 is optional and the description is omitted to avoid the double description.

9. Stopping Method of Domain Wall

Figure 12:
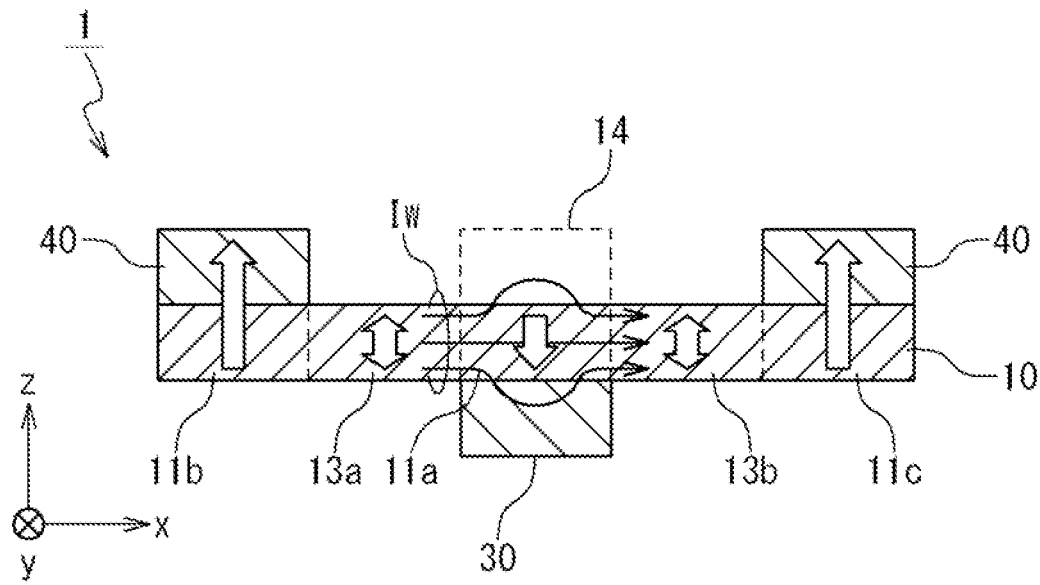
FIG. 12 is a block diagram showing a method of stopping a domain wall according to the exemplary embodiment of the present invention.
Figure 13A:
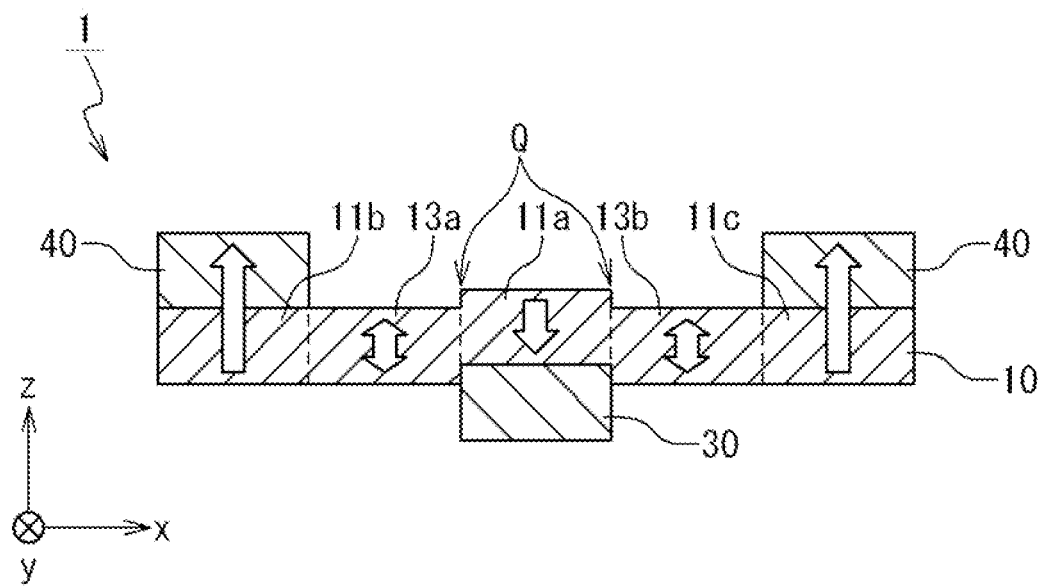
FIG. 13A is a diagram showing the method of stopping the domain wall according to the exemplary embodiment of the present invention.
Figure 13B:
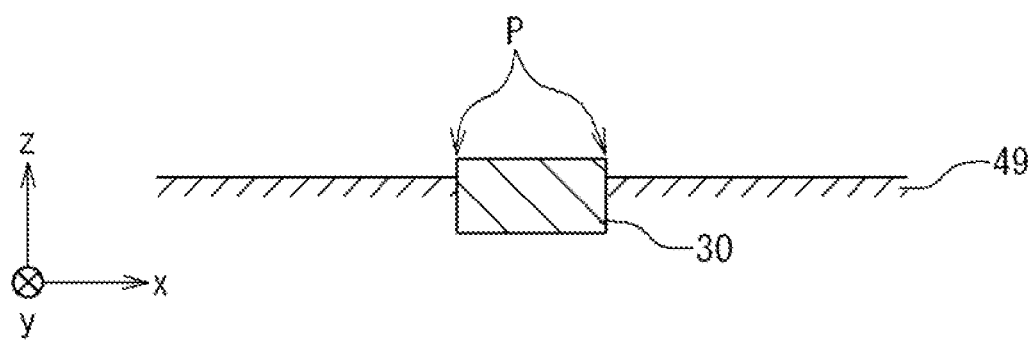
FIG. 13B is a diagram showing the method of stopping the domain wall according to the exemplary embodiment of the present invention.
Figure 13C:
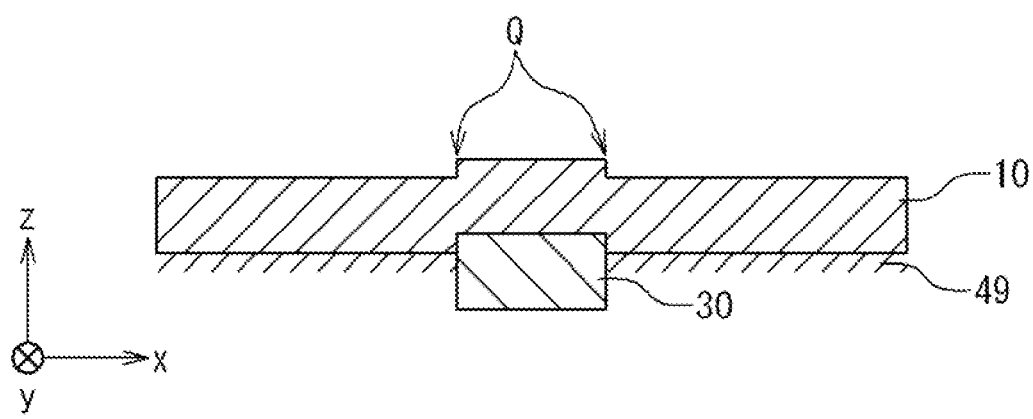
FIG. 13C is a diagram showing the method of stopping the domain wall according to the exemplary embodiment of the present invention.
Figure 14:
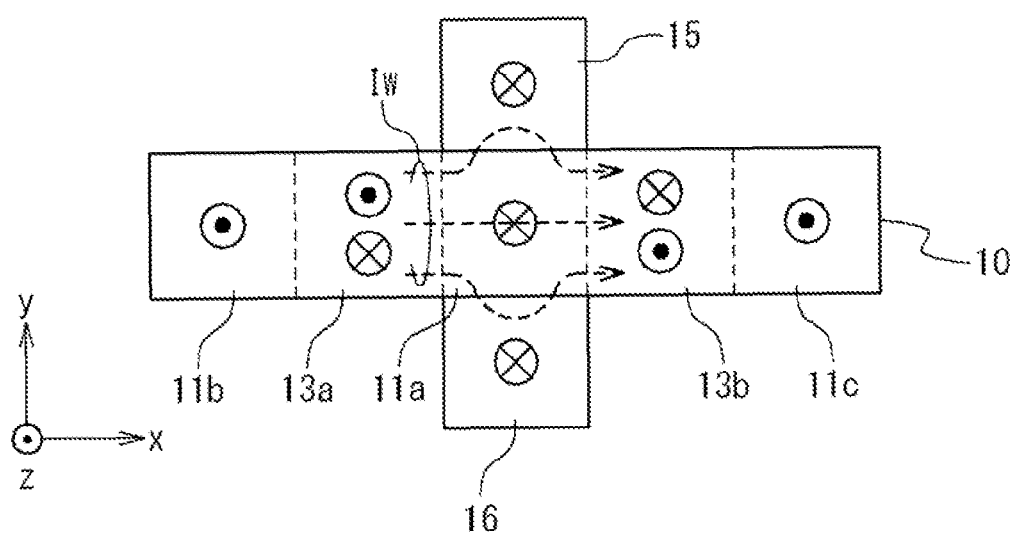
FIG. 14 is a diagram showing the method of stopping the domain wall according to the exemplary embodiment of the present invention.
Figure 15:
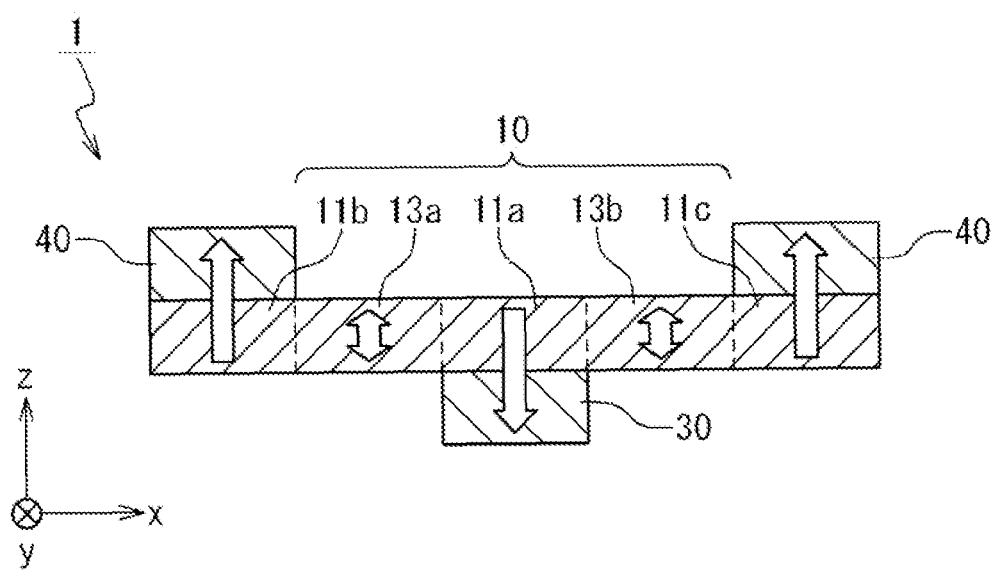
FIG. 15 is a diagram showing the method of stopping the domain wall according to the exemplary embodiment of the present invention.
Figure 16:
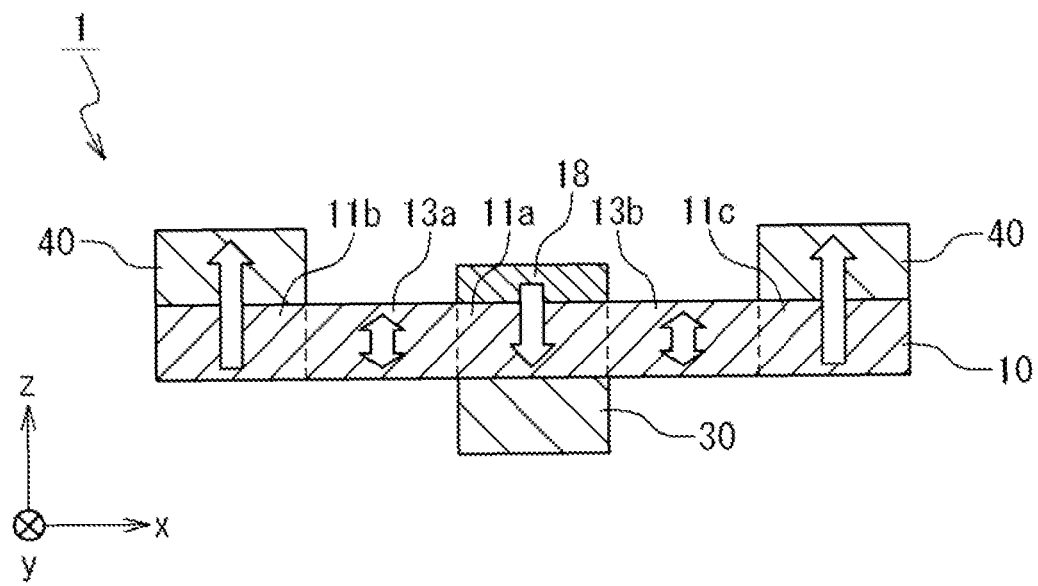
FIG. 16 is a diagram showing the method of stopping the domain wall according to the exemplary embodiment of the present invention.
Figure 17:
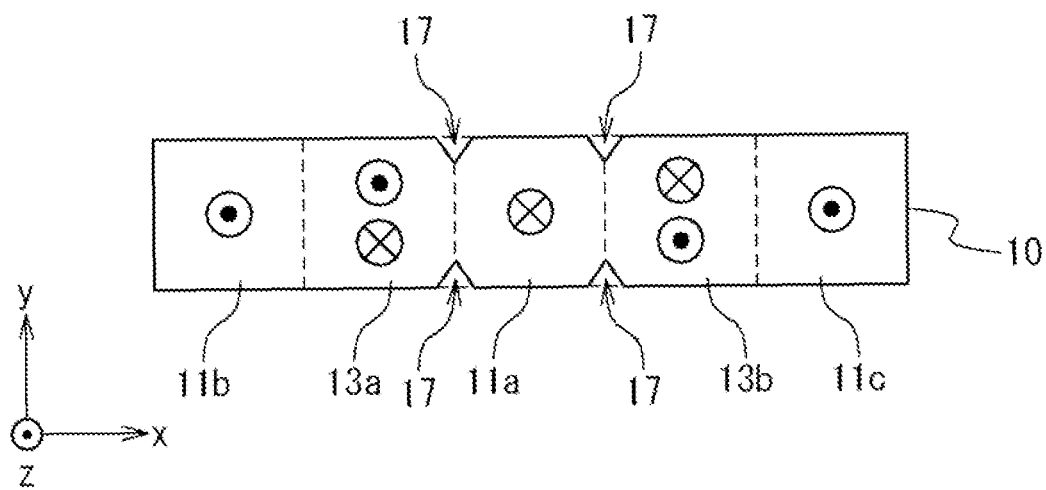
FIG. 17 is a diagram showing the method of stopping the domain wall according to the exemplary embodiment of the present invention.

FIG. 12 to FIG. 17 are diagrams showing a variations of a stopping method of the domain wall in the both ends of the $0^{th}$ magnetization fixed region 11a of the magnetic memory device according to the first exemplary embodiment of the present invention. Here, in each figure, the magnetic tunnel junction section 10 is omitted. Also, FIG. 12, FIG. 13A to FIG. 13C, FIG. 15, and FIG. 16 are sectional views and FIG. 14 and FIG. 17 are plan views.

FIG. 12 shows an example of the method of stopping the above domain wall. Here, two methods are considered.

In a first method, as a material of the contact layer 30, a material of a lower resistance than that of the $0^{th}$ magnetization fixed region 11a is used. For example, as such a material, Au, Ag, Cu, Al, Ru, Pt, Pd, and so on are exemplified. In this case, a more part of the write current Iw which flows through the first domain wall motion region 13a (or the second domain wall motion region 13b) flows into the contact layer 30 in addition to the $0^{th}$ magnetization fixed region 11a. That is, the write current Iw is divided into a part flowing through the $0^{th}$ magnetization fixed region 11a and a part flowing through the contact layer 30. At this time, because a total amount of write current Iw does not change, a current density decreases in the $0^{th}$ magnetization fixed region 11a. However, the current density more than a threshold value is required to start domain wall motion. In an example of this figure, the current density of write current Iw is more than the threshold value in the first domain wall motion region 13a (or the second domain wall motion region 13b), and less than the threshold value in the $0^{th}$ magnetization fixed region 11a for the reason of divisional flow. Therefore, the domain wall moves in the first domain wall motion region 13a (or the second domain wall motion region 13b) where the current density of the write current is more than the threshold value and stops at the end of the $0^{th}$ magnetization fixed region 11a where the current density of the write current is less than the threshold value.

Also, in a second method, as a material of the contact layer 30, a material in which spin scattering is easy to be caused is used. For example, the material such as Pt and Pd is exemplified. In this case, the write current Iw (electrons) which flows through the first domain wall motion region 13a (or the second domain wall motion region 13b) divisionally flows through the contact layer 30 as well as through the $0^{th}$ magnetization fixed region 11a. That is, the write current Iw (electrons) is divided into the $0^{th}$ magnetization fixed region 11a and the contact layer 30. At this time, the electrons which flow into the contact layer 30 are spin-scattered in the contact layer 30 and a part of the write current Iw turns to the $0^{th}$ magnetization fixed region 11a. As a result, the spins of the electrons in the $0^{th}$ magnetization fixed region 11a become non-uniform due to influence of the electrons that have been spin-scattered and the electrons cannot move a domain wall. In the example of this figure, the spins of electrons are uniform in the second domain wall motion region 13b (or the first domain wall motion region 13a) but they are disturbed in the $0^{th}$ magnetization fixed region 11a so that they are un-uniform. Therefore, the domain wall moves through the first domain wall motion region 13a (or the second domain wall motion region 13b) where the electron spins are uniform and stops in the neighborhood of the end of the $0^{th}$ magnetization fixed region 11a where the electron spins are disturbed.

It should be noted that in FIG. 12, this stopping method is attained by using the material of a low resistance or the material by which the spin scattering is easy to be caused for the contact layer 30 on the lower-side of the $0^{th}$ magnetization fixed region 11a (on the side of −z). However, the present invention is not limited to this example. That is, if an auxiliary layer 14 which uses the above-mentioned low resistance material or the material by which the spin scattering is easy to be caused is provided in the neighborhood of the $0^{th}$ magnetization fixed region 11a, the contact layer 30 is not necessary to be provided and also it may be provided for any position. In FIG. 12, an example in which the auxiliary layer 14 (a broken line) is provided on the upper-side (on the side of +z) of the $0^{th}$ magnetization fixed region 11a. In this case, the effect similar to the effect by the contact layer 30 shown in the above two methods can be obtained. The methods shown in FIG. 12 do not require any special process for manufacturing and can be attained through only the selection of the material of the contact layer 30.

FIG. 13A to FIG. 13C show another example of the above method of stopping the domain wall.

In a method shown in FIG. 13A, steps Q are intentionally provided on the both ends of the $0^{th}$ magnetization fixed region 11a in the magnetization record layer 10. Therefore, a surface on the upper-side (on the side of +z) of the $0^{th}$ magnetization fixed region 11a is present on a position higher than the surfaces of the first magnetization fixed region 11b, the first domain wall motion region 13a, the second domain wall motion region 13b and the second magnetization fixed region 11c. As a result, the steps Q are formed in the boundary between the $0^{th}$ magnetization fixed region 11a and the second domain wall motion region 13b and in the boundary between the $0^{th}$ magnetization fixed region 11a and the first domain wall motion region 13a. Such a step Q functions as a pin potential to the domain wall and can operate to stop the domain wall at the position.

It should be noted that in an example of FIG. 13A, the steps are formed to be convex in the upper direction (in the direction of +z) but the steps may be formed to be concave in the lower direction (in the direction of −z). Also, FIG. 13A shows that a part of the contact layer 30 protrudes from the lower surface of the magnetic recording layer 10 in the lower direction, but the part of the contact layer 30 may not protrude from the lower surface on the lower-side of the magnetic recording layer 10.

As shown in FIG. 13B, the contact layer 30 is formed by forming a metal film on the interlayer insulating layer 49 which has a hole such as a via-hole and by polishing by a CMP method, in the manufacturing process. In a case of polishing by the CPM method, it is difficult to avoid the steps P formed between the surface of the interlayer insulating layer 49 and the surface of the contact layer 30 on the nature of the process. Therefore, in an example of FIG. 13A, the steps P are positively used. That is, the magnetization record layer 10 is formed to cover the interlayer insulating layer 49 and the contact layer 30, in a state that the steps P are left, as shown in FIG. 13C. In this case, the steps Q are formed in this film, due to the step P in the contact layer 30. Therefore, if this film is patterned to have a shape of the magnetization record layer 10, the shape shown in FIG. 13A can be obtained. It should be noted that such a step may be provided for the first magnetization fixed region 11b and the second magnetization fixed region 11c on the both ends of the magnetization record layer 10 to fix the domain wall. This method does no require for any special process in the manufacture and is easy to realize.

FIG. 14 shows another example of the above method of stopping the domain wall in a more detail.

In the method shown in FIG. 14, a cross sectional region of the $0^{th}$ magnetization fixed region 11a is increased (to have a large shape and a wide width) in order to reduce the current density of the $0^{th}$ magnetization fixed region 11a to a value less than the threshold value which is necessary to cause the domain wall motion. In this case, the write current by which flows through the first domain wall motion region 13a (or the second domain wall motion region 13b) flows through the $0^{th}$ increased magnetization fixed region 11a having an increased sectional region. At this time, because a total amount of write current Iw does not change, the current density is decreased in the $0^{th}$ magnetization fixed region 11a. In an example of this figure, the width of the $0^{th}$ magnetization fixed region 11a is made wide by protrusion sections 15 and 16 to the ±y direction. The current density of write current Iw is more than the threshold value in the first domain wall motion region 13a (or the second domain wall motion region 13b), and is decreased in the $0^{th}$ magnetization fixed region 11a to a value less than threshold value. Therefore, the domain wall moves through the first domain wall motion region 13a (or the second domain wall motion region 13b) in the current density more than the threshold value and stops in the neighborhood of the end of the $0^{th}$ magnetization fixed region 11a in the current density less than the threshold value.

It should be noted that in FIG. 14, although the width of the $0^{th}$ magnetization fixed region 11a is made wide into the ±y direction, but the present invention is not limited to this example. That is, the width may be extended to either of the direction of +y or the direction of −y, or the direction of or the direction of −z, if the sectional area of the $0^{th}$ magnetization fixed region 11a can be increased. In this case, the same effect as shown in the FIG. 14 can be attained. This method docs not require any special change of the process in the manufacture and is sufficient to change a part of a pattern of the magnetization record layer 10, and is easy to be attained.

FIG. 15 shows another example of the method of stopping the above domain wall in more detail.

In the method shown in FIG. 15, the contact layer 30 is formed of a perpendicular magnetic anisotropy material which is same as that of the $0^{th}$ magnetization fixed region 11a, to have the magnetization direction which is same as the $0^{th}$ magnetization fixed region 11a. According to this method, because an amount of magnetization of the $0^{th}$ magnetization fixed region 11a is enhanced, it could make the domain wall motion difficult. As a result, the domain wall which is moved through the first domain wall motion region 13a (or the second domain wall motion region 13b) where the amount of magnetization is relatively less, stops in the neighborhood of the end of the $0^{th}$ magnetization fixed region 11a where the amount of magnetization is more. This method does not require any special process in the manufacture and can be attained through only selection of the material of the contact layer 30, and the process is easy.

FIG. 16 shows another example of the above method of stopping the domain wall.

In the method shown in FIG. 16, a hard layer (a second hard layer 18) is provided for the $0^{th}$ magnetization fixed region 11a, as well as the first magnetization fixed region 11b and the second magnetization fixed region 11c. Here, the second hard layer 18 is not harder (smaller in corrosive force) than the first hard layer 40. This is to make the above-mentioned initializing method applicable. In this way, because an amount of magnetization of the $0^{th}$ magnetization fixed region 11a increases, it could be made difficult to cause the domain wall motion. As a result, the domain wall which is moved through the first domain wall motion region 13a (or the second domain wall motion region 13b) where the amount of magnetization is relatively less, stop in the neighborhood of the end of the $0^{th}$ magnetization fixed region 11a wherein the amount of magnetization is more.

FIG. 17 shows another example of the above method of stopping the domain wall in the more.

In the method shown in FIG. 17, pin sites like notches 17 which function as pin potentials to the domain wall motion are provided in the boundary part of the $0^{th}$ magnetization fixed region 11a and the first domain wall motion region 13a and in the boundary part of the $0^{th}$ magnetization fixed region 11a and the second domain wall motion region 13b. The manufacture of such pin sites is difficult due to the miniaturization of the magnetization record layer 10 but it is possible to use the pin site if the magnetization record layer 10 has a size to some extent. By adopting this method, the notch 17 functions as the pin potential and can stop the domain wall in the position.

The stopping methods described above can be applied to not only stopping of the domain wall in the boundary between the $0^{th}$ magnetization fixed region and the first domain wall motion region or the second domain wall motion region, but also in the boundary between the first magnetization fixed region and the first domain wall motion region and in the boundary between the second magnetization fixed region and the second domain wall motion region.

10. Method of Fixing Magnetization

FIG. 18 to FIG. 22 are diagrams showing variations of a method of fixing magnetization in the first magnetization fixed region and the second magnetization fixed region of in the magnetic memory device according to the first exemplary embodiment of the present invention. Here, in each figure, the magnetic tunnel junction section 10 is omitted. Also, FIG. 18 to FIG. 20, FIG. 21B, and FIG. 22 are sectional views, and FIG. 21A is a plan view.

Figure 18:
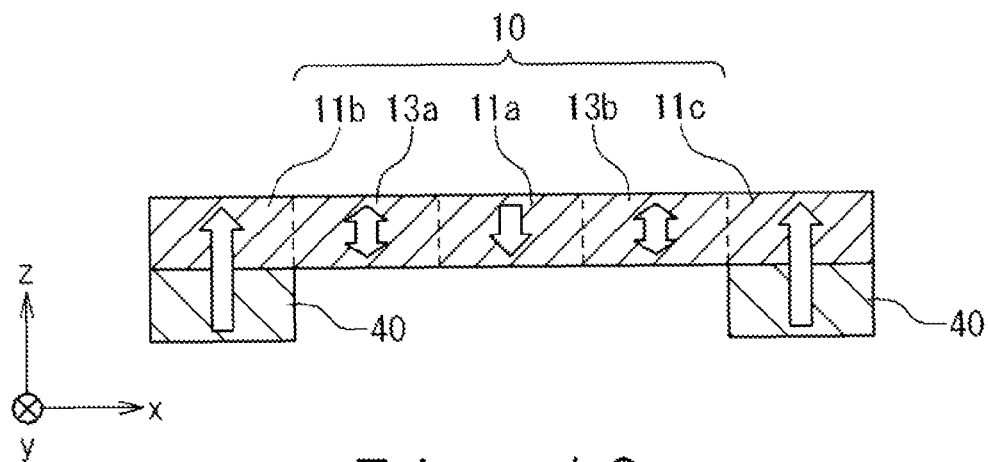
FIG. 18 is a diagram showing a method of fixing magnetization according to the exemplary embodiment of the present invention.

FIG. 18 shows an example of the above method of fixing magnetization. In the examples shown in FIG. 4A to FIG. 8B, the first hard layer 40 is provided on the upper-side (on the side of +z) of the first magnetization fixed region 11b and the second magnetization fixed region 11c. However, as shown in FIG. 18, the first hard layers 40 may be provided on the lower-side (on the side of −z) of the first magnetization fixed region 11b and the second magnetization fixed region 11c. This method is desirable in a case that the hard layer is to be provided on the lower-side, for the convenience of the manufacturing process.

Figure 19:
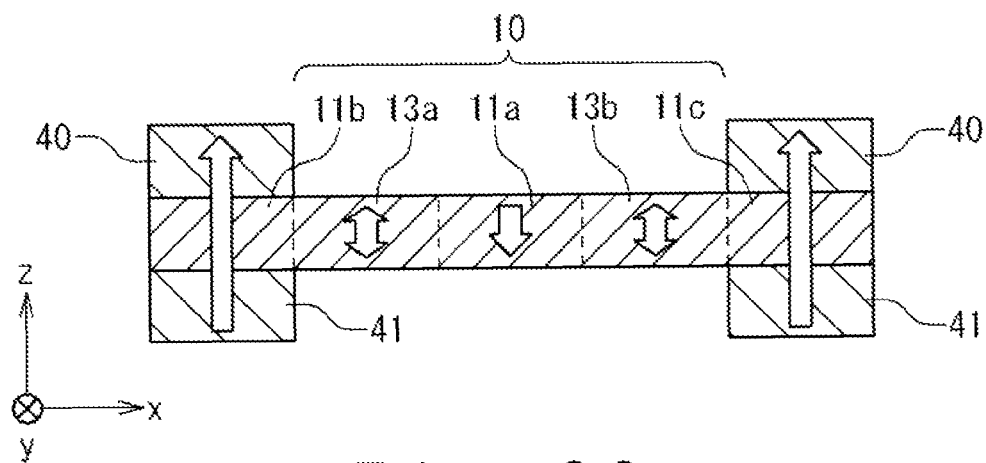
FIG. 19 is a diagram showing the method of fixing the magnetization according to the exemplary embodiment of the present invention.

FIG. 19 shows another example of the above method of fixing magnetization.

As shown in FIG. 19, the first hard layers 40 may be provided on both of the upper-side (on the side of +z) and the lower-side (on the side of −z) of each of the first magnetization fixed region 11b and the second magnetization fixed region 11c. This method is desirable in a case that the thin hard layers are formed on the upper-side and the lower-side when a thick hard layer cannot be formed only on either one of the upper-sides or the lower-sides for the convenience of the manufacturing process, and that the magnetizations of the first magnetization fixed region 11b and the second magnetization fixed region 11c should be fixed more firmly.

Figure 20:
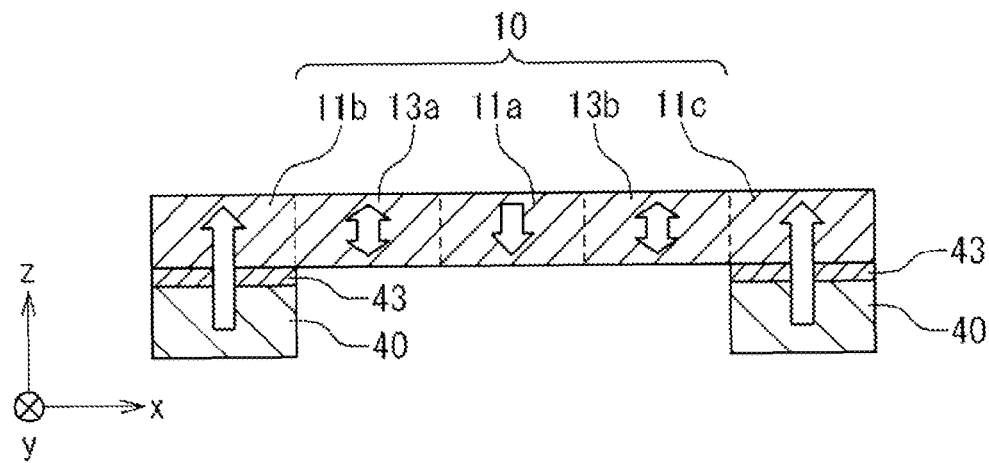
FIG. 20 is a diagram showing the method of fixing the magnetization according to the exemplary embodiment of the present invention.

FIG. 20 shows another example of the above method of fixing the magnetization in more detail.

As shown in FIG. 20, if the first hard layer 40 is magnetically coupled to the first magnetization fixed region 11b or the second magnetization fixed region 11c, it is not required that the first hard layers 40 directly contact the first magnetization fixed region 11b and the second magnetization fixed region 11c. That is, it is sufficient that the first hard layers 40 are formed in the neighborhood of the first magnetization fixed region 11b and the second magnetization fixed region 11c on at least one of the upper-side and the lower-side so as to be possible to magnetically couple. In an example of this figure, the first hard layers 40 are provided on the lower-side of the first magnetization fixed region 11b and the second magnetization fixed region 11c through other interlayer films 43. This method is desirable in a cast that the first hard layer 40 cannot be formed to directly contact the magnetization record layer 10 for the convenience of the manufacturing process.

Figure 21A:
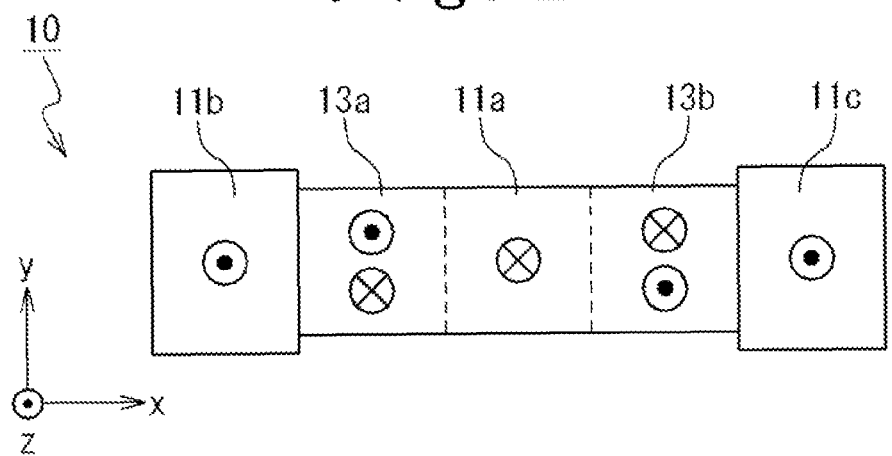
FIG. 21A is a diagram showing the method of fixing the magnetization according to the exemplary embodiment of the present invention.
Figure 21B:
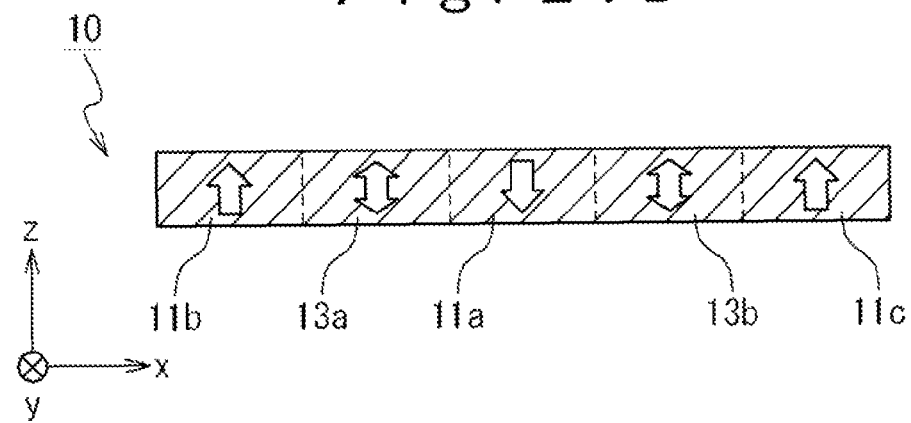
FIG. 21B is a diagram showing the method of fixing the magnetization according to the exemplary embodiment of the present invention.

FIG. 21A (plan view) and FIG. 21B (sectional view) show another example of the above method of fixing magnetization.

As shown in FIG. 21A and FIG. 21B, a desired magnetization state can be generated by devising the shape even if the first hard layer is not used. In an example of this figure, the width of the first magnetization fixed region 11b on the side of the first domain wall motion region 13a and the width of the second magnetization fixed region 11c on the side of the second domain wall motion region 13b are wider than the width of the first domain wall motion region 13a or the second domain wall motion region 13b. With this, the domain wall is difficult to invade the first magnetization fixed region 11b and the second magnetization fixed region 11c and each boundary functions as the pin potential to the domain wall. That is, the magnetization directions of the first magnetization fixed region 11b and the second magnetization fixed region 11c are fixed. The manufacturing process can be simplified so that a manufacturing cost can be reduced, because this method does not require the first hard layer and the magnetization record layer 10 is only chanced in the shape.

Figure 22:
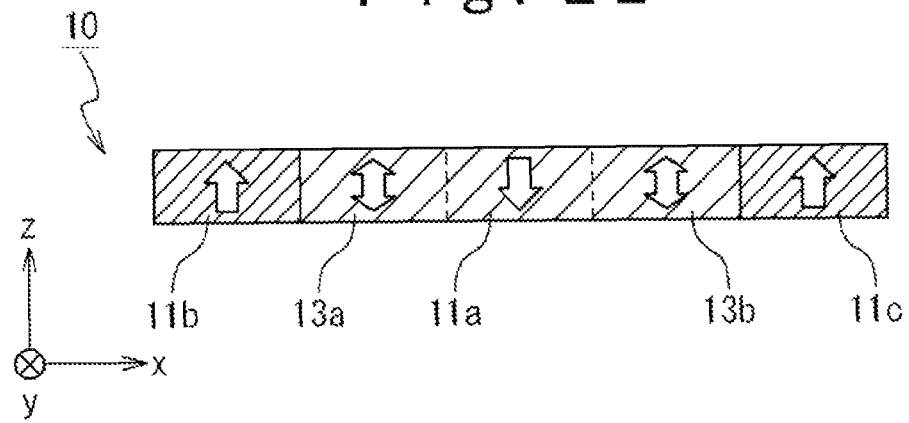
FIG. 22 is a diagram showing the method of fixing the magnetization according to the exemplary embodiment of the present invention.

FIG. 22 shows another example of the above method of fixing the magnetization in more detail.

As shown in FIG. 22, the desired magnetization state can be generated through devising the material even if the first hard layer is not used. In an example of this figure, the material which is different from the material of the first domain wall motion region 13a and the second domain wall motion region 13b is used as the material of the first magnetization fixed region 11b and the second magnetization fixed region 11c. As such a material, the material having relatively large coercive force is exemplified. Also, it is possible to realize the above state by performing ion implantation into the first magnetization fixed region 11b and the second magnetization fixed region 11c to change the magnetic property of their portions.

11. Anisotropy of Sensor Layer

The sensor layer 23 is formed of a material having the in-plane magnetic anisotropy. Here, the direction of the magnetic anisotropy of the sensor layer 23 may be the ±x directions or the ±y direction (not shown) in plane as shown in FIG. 4A to FIG. 8B. The magnetic anisotropy of the sensor layer 23 may be given in the shape (shape magnetic anisotropy), it may be given by the crystal structure (crystal magnetic anisotropy) and it may be given by stress by appropriately adjusting magnetic warp (stress inducing magnetic anisotropy).

When the direction of the magnetic anisotropy of the sensor layer 23 is the ±x directions, the operation to invert the magnetization of the sensor layer 23 is performed as an easy axis operation. The maximum MR ratio can be obtained. Here, when the leakage magnetic field from the magnetization record layer 10 (the first domain wall motion region 13a and the second domain wall motion region 13b) is small, there is a possibility that it is difficult to invert. On the other hand, when the direction of the magnetic anisotropy of the sensor layer 23 is the ±y direction, the operation to invert the magnetization direction of the sensor layer 23 is a difficult axis operation. Even when the leakage magnetic field from the magnetization record layer 10 (the first domain wall motion region 13a and the second domain wall motion region 13b) is small not to cause the magnetization inversion by the easy axis operation, it is possible to perform a read operation (magnetization inversion). Here, the MR ratio becomes relatively small and the variation becomes easy.

12. Modification Example

Figure 23:
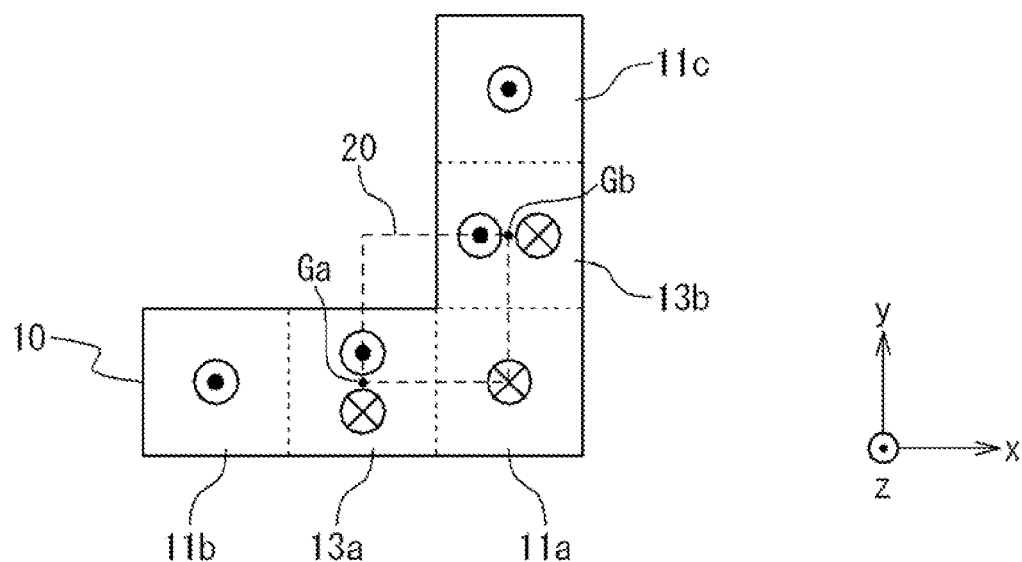
FIG. 23 is a plan view showing a modification example of the configuration of the magnetization record layer according to the first exemplary embodiment of the present invention.

FIG. 23 is a plan view showing a modification example of the configuration of the magnetization record layer of the magnetic memory device according to the first exemplary embodiment of the present invention. In the configuration of the magnetization record layer of FIG. 4A, the first domain wall motion region 13a and the second domain wall motion region 13b are arranged in symmetrical positions (the opposing positions) to put the 0$^{th}$ magnetization fixed region 11a between them. However, the present invention is not limited to the example, and as shown in FIG. 23, the first domain wall motion region 13a and the second domain wall motion region 13b may be arranged in the positions on which a right angle is formed between them with respect to the 0$^{th}$ magnetization fixed region. That is, the direction into which the first domain wall motion region 13a extends and the direction into which the second domain wall motion region 13b extends are orthogonal to each other.

In this case, the position of the magnetic tunnel junction section 20 to the magnetic recording layer 10 may be directly above the 0$^{th}$ magnetization fixed region 11a (on the side of +z) or may be a position shined from a concerned position into the direction of and the direction of −x, as shown by a broken line in the figure. Also, it may be provided through the contact layer 30. Also, it is desirable that the magnetization direction of the reference layer 21 of the magnetic tunnel junction section 20 is the direction of a straight line of the first domain wall motion region 13a and the second domain wall motion region 13b. In an example of this figure, it is desirable that the magnetization direction of the reference layer 21 is the direction of the straight line which links (center of gravity Ga of) the first domain wall motion region 13a and (center of gravity Gb of) the second domain wall motion region 13b. In this case, the magnetization direction of the sensor layer 23 can take a parallel or anti-parallel direction to the magnetization direction of the reference layer 21 in accordance with the stored data (0, 1).

Because the other configuration and operation are as previously mentioned, the description is omitted. When the configuration of this FIG. 23 is used, the effect similar to the above exemplary embodiment can be obtained.

As described above, in the current drive domain wall motion type MRAM in the present exemplary embodiment in which the magnetic anisotropy of the magnetization record layer is a perpendicular direction, because the three magnetization fixed regions are provided by using two domain wall motion regions, it is easy to perform the magnetization fixation, including the magnetization fixed regions on the both sides. That is, the magnetization fixed regions can be easily formed. Also, the boundaries between the two domain wall motion regions and the three magnetization fixed regions can be set as the pinning sites of the domain walls. That is, the pinning site of the domain wall can be easily formed. Also, because the magnetic tunnel junction section is provided to read data from the magnetization record layer, separately from the magnetization record layer having the perpendicular magnetic anisotropy, the reliability of the read can improve.

Second Exemplary Embodiment

Figure 24:
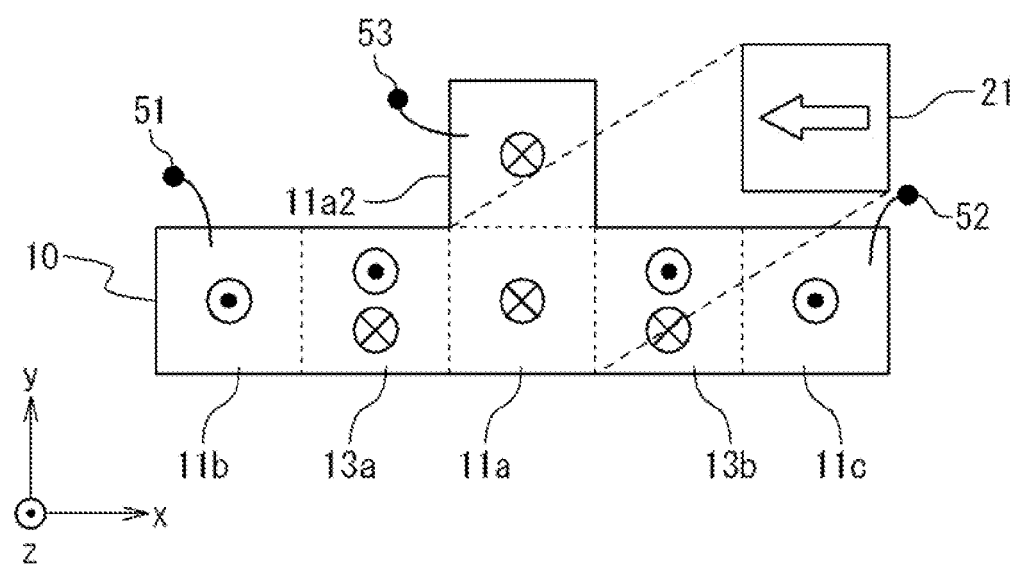
FIG. 24 is a plan view showing the configuration of the magnetization record layer according to a second exemplary embodiment of the present invention.

In a second exemplary embodiment, the magnetic memory cell and the MRAM in a case of N=2 will be described.
1. Basic Configuration of Magnetic Memory Device FIG. 24 is a plan view showing an example of the configuration of the magnetization record layer of the magnetic memory device according to the second exemplary embodiment of the present invention. The magnetic memory device 1 in the present exemplary embodiment is provided with the magnetization record layer 10 and the magnetic tunnel junction section 20, and is basically the same as the magnetic memory device I in the first exemplary embodiment. Here, the present exemplary embodiment differs from the first exemplary embodiment in that an auxiliary magnetization fixed region 11a2 is connected to the 0$^{th}$ magnetization fixed region 11a. The auxiliary magnetization fixed region 11a2 is formed of the same material as the 0$^{th}$ magnetization fixed region 11a, has the same perpendicular magnetization anisotropy and is magnetized into the same direction. The 0$^{th}$ magnetization fixed region 11a can be regarded as one body with the auxiliary magnetization fixed region 11a2. In an example of this figure, the auxiliary magnetization fixed region 11a2 is connected with the 0$^{th}$ magnetization fixed region 11a on the back side (the side of +y) and is magnetized to the direction of −z. Here, a connection position of the auxiliary magnetization fixed region 11a2 to the 0$^{th}$ magnetization fixed region 11a is not limited to this example.

The magnetic memory device 1 is provided with current supply terminals 51 and 52 which supply the currents to the first magnetization fixed region 11b and the second magnetization fixed region 11c, like the magnetic memory device 1 in the first exemplary embodiment. Moreover, the magnetic memory device 1b is provided with a current supply terminal 53 which supplies current to the auxiliary magnetization fixed region 11a2. These terminals can be use for the supply of the write current and the read current, as mentioned later.

Figure 25A:
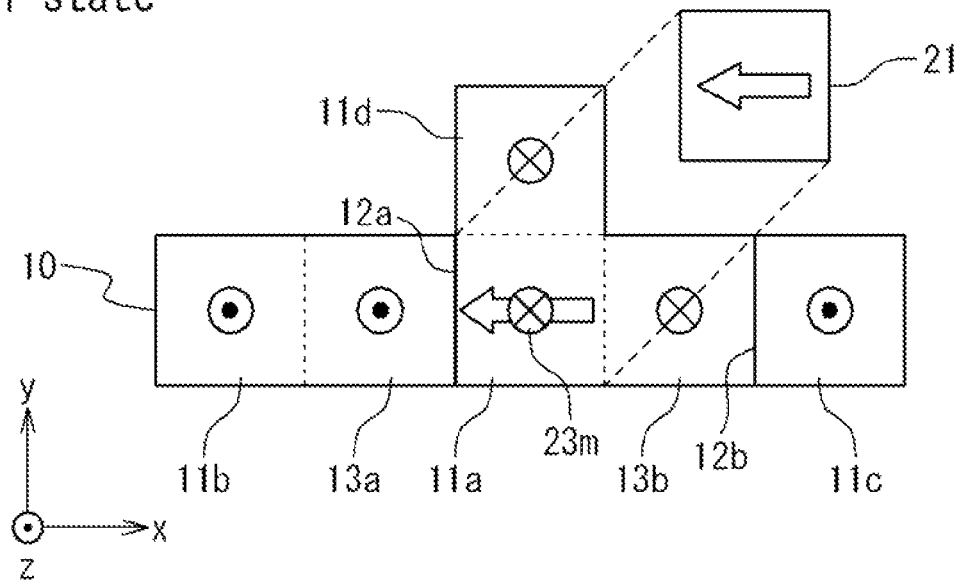
FIG. 25A is a plan view showing the configuration of the magnetic memory device according to the second exemplary embodiment of the present invention.
Figure 25B:
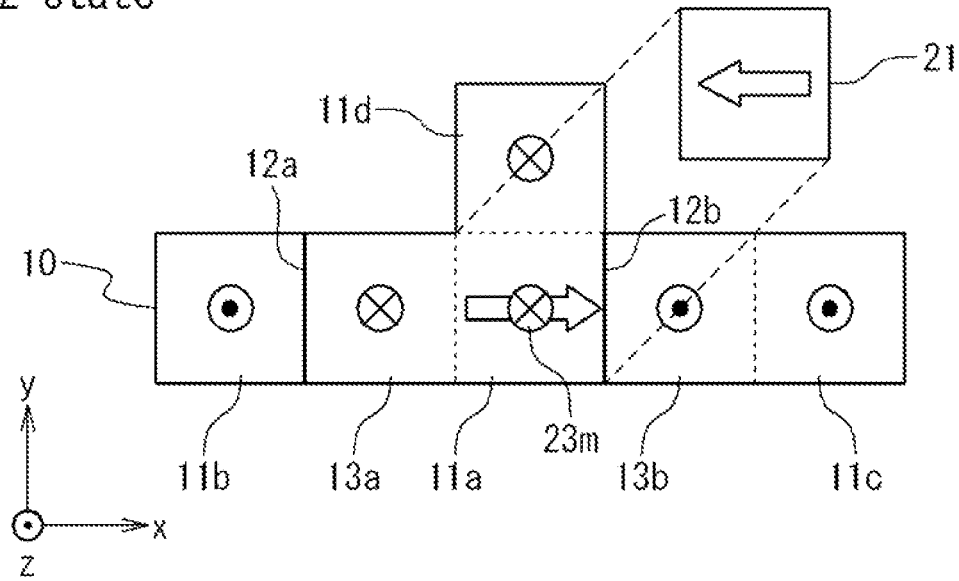
FIG. 25B is a plan view showing the configuration of the magnetic memory device according to the second exemplary embodiment of the present invention.
Figure 25C:
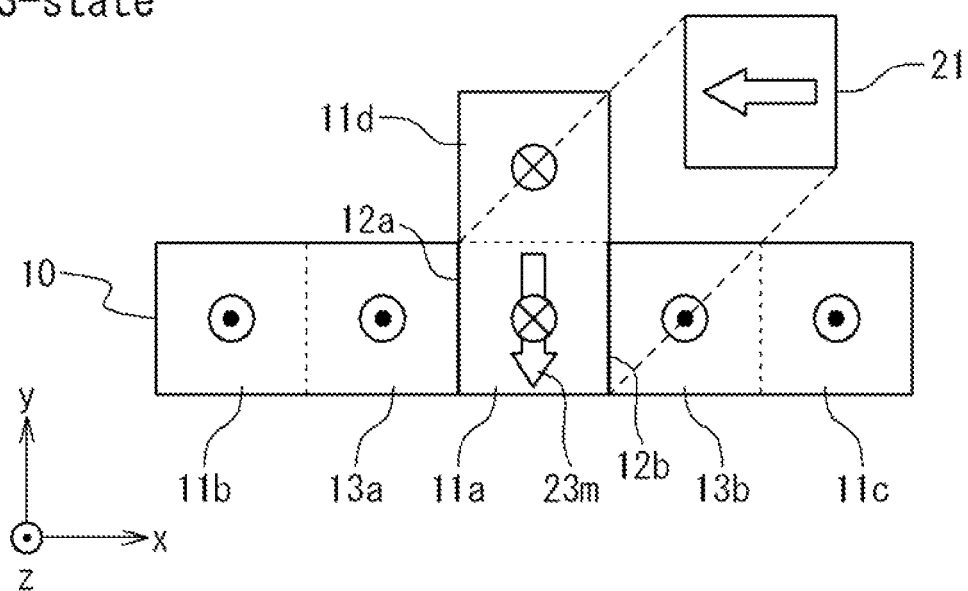
FIG. 25C is a plan view showing the configuration of the magnetic memory device according to the second exemplary embodiment of the present invention.

The remaining configuration of the magnetic memory device 1 is same as in the first exemplary embodiment and the description is omitted.
2. Storage State of Data FIG. 25A to FIG. 25C are plan views showing an example of the configuration of the magnetic memory device according to the second exemplary embodiment of the present invention. In the present exemplary embodiment, the magnetization record layer 10 retains data based on a relation of the magnetization directions of domain wall motion regions. The magnetic memory device 1 in the present exemplary embodiment can take three states and can store three kinds of data. FIG. 25A shows a case (α1-state) when first data is stored, FIG. 25B shows a case (α2-state) when second data is stored, and FIG. 25C shows a case (α3-state) when third data is stored. Three kinds of data may be assigned to optional data. For example, they are "00", "01", and "10".

As shown in FIG. 25A, when the magnetization record layer 10 stores first data, the magnetization direction of the first domain wall motion region 13a is the direction of +z and the magnetization direction of the second domain wall motion region 13b is the direction of −z, i.e. (+z, −z). The domain walls 12a and 12b are respectively formed between the first domain wall motion region 13a and the 0$^{th}$ magnetization fixed region 11a and between the second domain wall motion region 13b and the second magnetization fixed region 11c. At this time, the magnetic field H is generated in the neighborhood of the sensor layer 23 on the lower-side (on the side of −z) of the magnetization record layer 10 to direct from the second domain wall motion region 13b to the first domain wall motion region 13a (in the direction of −x). Thus, magnetization 23m of the sensor layer 23 can take a component in the direction of −x. As a result, the direction of the magnetization 23m of the sensor layer 23 and the magnetization direction of the reference layer 21 can take a parallel state in the magnetic tunnel junction section 20. Therefore, this parallel state can be detected by detecting a resistance value R0 in the direction of ±z of the magnetic tunnel junction section 20. That is, the first data (α1-state) stored in the magnetization record layer 10 can be read.

On the other hand, as shown in FIG. 25B, when the magnetization record layer 10 stores second data, the magnetization direction of the first domain wall motion region 13a is the direction of −z, and the magnetization direction of the second domain wall motion region 13b is the direction of +z, i.e. (−z, +z). Thus, the domain wall 12a and 12b are formed between the first magnetization fixed region 11b and the first domain wall motion region 13a and between the $0^{th}$ magnetization fixed region 11a and the second domain wall motion region 13b, respectively. At this time, the magnetic field H is generated in the neighborhood of the sensor layer 23 on the lower-side of the magnetization record layer 10 (on the side of −z) to direct from the first domain wall motion region 13a to the second domain wall motion region 13b (in the direction of +x). Thus, the magnetization 23m of the sensor layer 23 can take a component in the direction of +x. As a result, the direction of the magnetization 23m of the sensor layer 23 and the magnetization direction of the reference layer 21 can take anti-parallel components in the magnetic tunnel junction section 20. Therefore, by detecting the resistance value R1 into the direction of ±z of the magnetic tunnel junction section 20, this anti-parallel state can be detected. That is, the second data (α2-state) stored in the magnetization record layer 10 can be read.

As shown in FIG. 25C, when the magnetization record layer 10 stores third data, the magnetization direction of the first domain wall motion region 13a is the direction of +z and the magnetization direction of the second domain wall motion region 13b is the direction of +z, i.e. (+z, +z). Thus, the domain wall 12a and 12b are formed between the first domain wall motion region 13a and the $0^{th}$ magnetization fixed region 11a and between the $0^{th}$ magnetization fixed region 11a and the second domain wall motion region 13b, respectively. At this time, the magnetic field H is generated in the neighborhood of the sensor layer 23 on the lower-side of the magnetization record layer 10 (on the side of −z) to direct a direction (in the direction of ±y) of a line which links the $0^{th}$ magnetization fixed region 11a and the auxiliary magnetization fixed region 11a2. Thus, the direction of the magnetization 23m of the sensor layer 23 is the direction of −y (or the direction of +y). As a result, the direction of the magnetization 23m of the sensor layer 23 and the magnetization direction of the reference layer 21 form a right angle in the magnetic tunnel junction section 20. Therefore, this orthogonal state can be detected by detecting the resistance value R0.5 in the direction of ±z of the magnetic tunnel junction section 20. That is, the third data (α3-state) stored in the magnetization record layer 10 can be read.

It should be noted that although not illustrating, when the magnetization record layer 10 stores the third data, the magnetization direction of the first domain wall motion region 13a may be the direction of −z and the magnetization direction of the second domain wall motion region 13b may be the direction of −z, i.e. (−z, −z).

Figure 26:
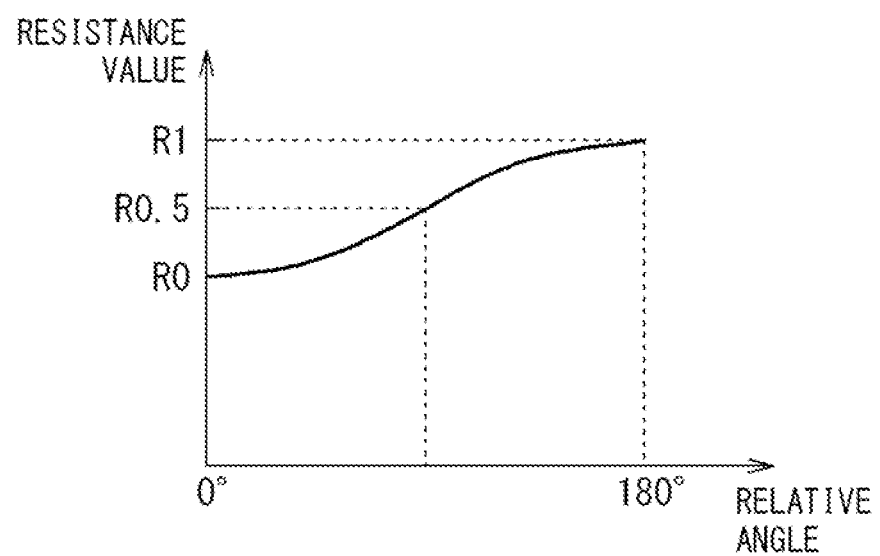
FIG. 26 is a graph showing a relation between a relative angle between the magnetization direction of a sensor layer and the magnetization direction of a reference layer and a resistance value of magnetic tunnel junction section.

FIG. 26 is a graph showing relation of a relative angle between the magnetization direction of the sensor layer and the magnetization direction of the reference layer and a resistance value of the magnetic tunnel junction section. The horizontal axis shows the relative angle (0 to 180 degrees) between magnetization direction of the sensor layer 23 and magnetization direction of the reference layer 30 and the vertical axis shows the resistance value in the direction of ±z of the magnetic tunnel junction section 20. As shown in this figure, the resistance value of the magnetic tunnel junction section 20 increases monotonously to the relative angle between magnetization direction of the sensor layer 23 and magnetization direction of the reference layer 30. Therefore, the relative angle and the resistance value have one-to-one correspondence relation. A plurality of data can be read based on a plurality of resistance values if a plurality of relative angles are set, and a plurality of data are set in correspondence to the plurality of relative angles. That is, the plurality of data can be stored by one magnetic storage element and the magnetic storage device can be made multi-valued.

In the present exemplary embodiment, the α1-state of FIG. 25A corresponds to the resistance value R0, the α2-state of FIG. 25B corresponds to the resistance value R1 and the α3-state of FIG. 25C corresponds to the resistance value R0.5. In this way, the magnetic memory device 1 in the present exemplary embodiment is three-valued and can store three kinds of data. It should be noted that the direction of the reference layer 21 is not limited to the direction shown in FIG. 25A to FIG. 25C (the direction of −x) and another direction may be used if the relative angle between the magnetization direction of the sensor layer 23 and the magnetization direction of the reference layer 30 takes three kinds of angles.

3. Initializing Method in Magnetization Fixed Region

For example, the initializing method of the magnetic memory device according to the second exemplary embodiment of the present invention can be performed as in the first exemplary embodiment (FIG. 6A to FIG. 6C). Therefore, the description is omitted.

4. Write Operation

Next, the data write principle into the magnetic memory device will be described. In the write, a current is supplied through a route, e.g. electrons are supplied from the magnetization fixed region on the side of the domain wall motion region whose magnetization should turn to the direction of +z, and the electrons are drawn out from the magnetization fixed region on the side of the domain wall motion region whose magnetization should turn to the direction of −z. A plurality of routes may be used, according to necessary. Hereinafter, the description will be given in detail.

Figure 27A:
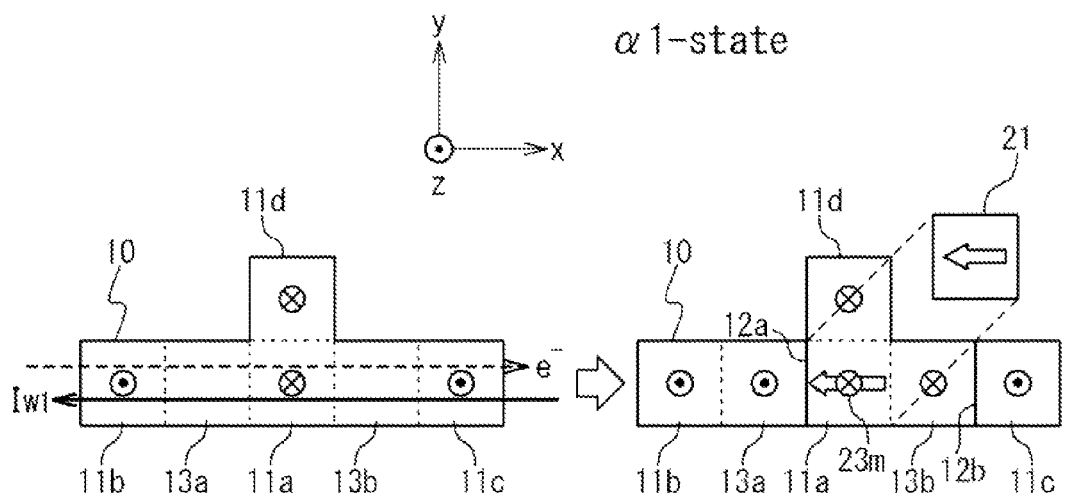
FIG. 27A is a plan view showing a data write principle according to the second exemplary embodiment of the present invention.
Figure 27B:
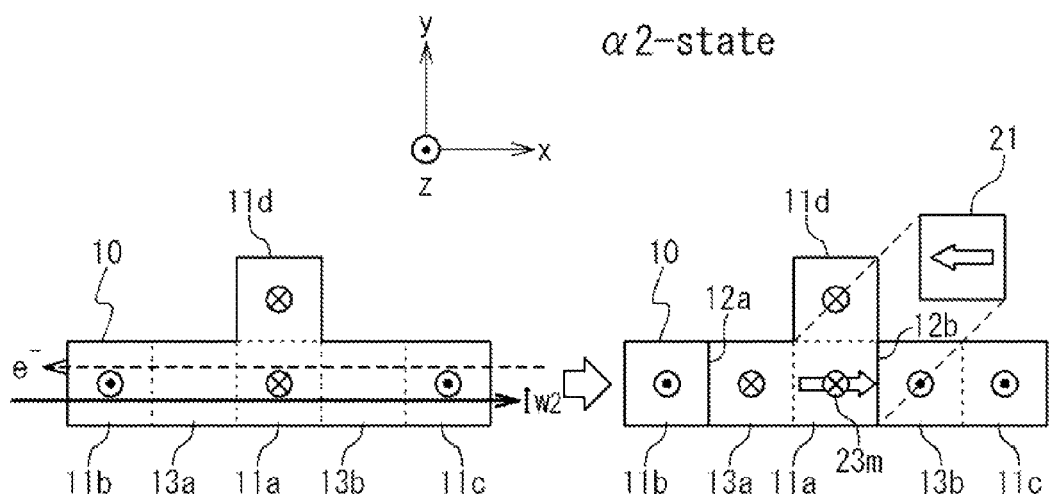
FIG. 27B is a plan view showing the data write principle according to the second exemplary embodiment of the present invention.
Figure 27C:
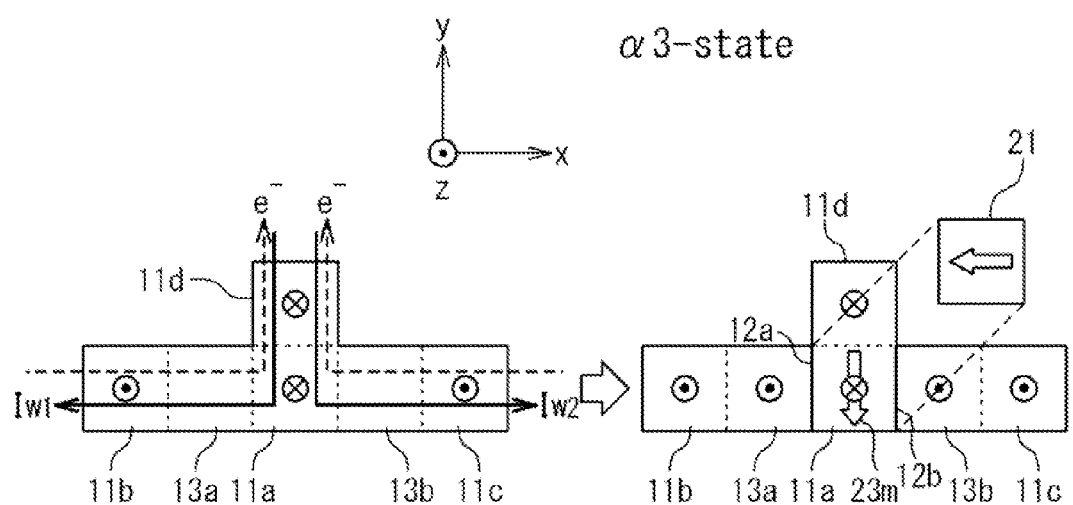
FIG. 27C is a plan view showing the data write principle according to the second exemplary embodiment of the present invention.

FIG. 27A to FIG. 27C are plan views showing the data write principle into the magnetic memory device according to the second exemplary embodiment of the present invention. The data write is performed by the domain wall motion method using spin transfer. The write current Iw flows not a direction of passing through the MTJ (magnetic tunnel junction section 20) but passing through the domain walls 12a and 12b of the magnetization record layer 10 in a plane. The write current Iw is supplied to the magnetization record layer 10 from any of: a current supply terminal (not shown) connected with the first magnetization fixed region 11b, a current supply terminal (not shown) connected with the second magnetization fixed region 11c and a current supply terminal (not shown) connected with the auxiliary magnetization fixed region 11a2.

As shown in the left side of FIG. 27A, in a case of the write operation of the first data (α1-state), the write current Iw1 (solid line arrow) flows from the second magnetization fixed region 11c to the first magnetization fixed region 11b through the second domain wall motion region 13b, the $0^{th}$ magnetization fixed region 11a and the first domain wall motion region 13a in this order. In this case, the motion of electrons e⁻ (broken line arrow) is opposite to the direction of the write current Iw1. As a result, spin electrons e⁻ are injected into the first domain wall motion region 13a from the first magnetization fixed region 11b. The domain wall 12a is driven due to spin of the injected electrons e⁻ from the boundary between the first magnetization fixed region 11b and the first domain wall motion region 13a to the boundary between the $0^{th}$ magnetization fixed region 11a and the first domain wall motion region 13a. As a result, the magnetization direction of the first domain wall motion region 13a is inverted to the direction of +z by the spin transfer effect. Then, the domain wall 12a is moved to the boundary between the first domain wall motion region 13a and the $0^{th}$ magnetization fixed region 11a. Moreover, spin electrons e⁻ are injected into the second domain wall motion region 13b from the $0^{th}$ magnetization fixed region 11a. The domain wall 12b is driven due to the spin of the injected electrons e⁻ from the boundary between the $0^{th}$ magnetization fixed region 11a and the second domain wall motion region 13b to the boundary between the second magnetization fixed region 11c and the second domain wall motion region 13b. As a result, the magnetization direction of the second domain wall motion region 13b is inverted to the direction of −z by the spin transfer effect. Thus, the domain wall 12b is moved to the boundary between the second domain wall motion region 13b and the second magnetization fixed region 11c. Thus, the first data (α1-state) is written as shown in the right side of FIG. 27A.

As shown in the left side of FIG. 27B, in a case of the write operation of second data (α2-state), the write current Iw2 (solid line arrow) flows from the first magnetization fixed region 11b to the second magnetization fixed region 11c through the first domain wall motion region 13a, the $0^{th}$ magnetization fixed region 11a and the second domain wall motion region 13b in this order. In this case, the motion of electrons e⁻ (broken line arrow) is opposite to the direction of write current Iw2. As a result, spin electrons e⁻ are injected into the second domain wall motion region 13b from the second magnetization fixed region 11c. The domain wall 12b is driven due to spin of injected electrons e⁻ from the boundary between the second magnetization fixed region 11c and the second domain wall motion region 13b, to the boundary between the $0^{th}$ magnetization fixed region 11a and the second domain wall motion region 13b. As a result, the magnetization direction of the second domain wall motion region 13b is inverted to the direction of +z by the spin transfer effect. Thus, the domain wall 12b is moved to the boundary between the second domain wall motion region 13b and the $0^{th}$ magnetization fixed region 11a. Moreover, spin electrons e⁻ are injected into the first domain wall motion region 13a from the $0^{th}$ magnetization fixed region 11a. The domain wall 12a is driven due to spin of injected electrons e⁻ from the boundary between the $0^{th}$ magnetization fixed region 11a and the first domain wall motion region 13a to the boundary between the first magnetization fixed region 11b and the first domain wall motion region 13a. As a result, the magnetization direction of the first domain wall motion region 13a is inverted to the direction of −z by the spin transfer effect. Thus, the domain wall 12a is moved to the boundary between the first domain wall motion region 13a and the first magnetization fixed region 11b. Thus, the second data (α2-state) is written as shown in the right side of FIG. 27B.

As shown in the left side of FIG. 27C, in a case of the write operation of the third data (α3-state), the first write current Iw1 (solid line arrow) flows from the auxiliary magnetization fixed region 11a2 to the first magnetization fixed region 11b through the $0^{th}$ magnetization fixed region 11a and the first domain wall motion region 13a in this order. In this case, the motion of electrons e⁻ (broken line arrow) is opposite to the direction of the write current Iw1. As a result, spin electrons e⁻ are injected into the first domain wall motion region 13a from the first magnetization fixed region 11b. The domain wall 12a is driven due to spin of injected electrons e⁻ from the boundary between the first magnetization fixed region 11b and the first domain wall motion region 13a to the boundary between the $0^{th}$ magnetization fixed region 11a and the first domain wall motion region 13a. As a result, the magnetization direction of the first domain wall motion region 13a is inverted to the direction of +z by the spin transfer effect. Thus, the domain wall 12a is moved to the boundary between the first domain wall motion region 13a and the $0^{th}$ magnetization fixed region 11a. Moreover, the second write current Iw2 (solid line arrow) flows from the auxiliary magnetization fixed region 11a2 to the second magnetization fixed region 11c through the $0^{th}$ magnetization fixed region 11a and the second domain wall motion region 13b in this order. As a result, spin electrons e⁻ are injected into the second domain wall motion region 13b from the second magnetization fixed region 11c. The domain wall 12b is driven due to spin of injected electrons e⁻ from the boundary between the second magnetization fixed region 11c and the second domain wall motion region 13b to the boundary between the $0^{th}$ magnetization fixed region 11a and the second domain wall motion region 13b. As a result, the magnetization direction of the second domain wall motion region 13b is inverted to the direction of +z by the spin transfer effect. Thus, the domain wall 12b is moved to the boundary between the second domain wall motion region 13b and the $0^{th}$ magnetization fixed region 11a. Thus, the third data (α3-state) is written as shown in the right side of FIG. 27C.

In this way, the write currents Iw1 and Iw2 which flow through the magnetization record layer 10 in plane invert the magnetization directions of the first domain wall motion region 13a and the second domain wall motion region 13b, respectively. As combination of the magnetization directions, the first data to the third data can be grouped and can be stored. At this time, the magnetization fixed regions on both sides of each domain wall motion region are anti-parallel to each other in magnetization direction to function as different supply sources of the spin electrons to the domain wall motion regions. It should be noted that when each domain wall 12 is in a position after the write, the state is maintained regardless of the injection of spin electrons e⁻. Therefore, overwrite, too, is possible. Also, in any case of FIG. 27A to FIG. 27C, the first write current Iw1 and the second write current Iw2 may be supplied at the same time or at different timing, and they may be supplied in an opposite order. Also, the write currents Iw1 and Iw2 may pass wherever later if passing through the domain wall 12a and 12b.

5. Read Operation

The read principle of data from the magnetic memory device according to the second exemplary embodiment of the present invention is same as in the first exemplary embodiment, excluding that the third relative angle is used in addition to the relative angles of 0 degrees and 180 degrees as shown in FIG. 26. Therefore, the description is omitted.

In this case, too, because it is sufficient for a relatively small amount of current to flow through the MTJ and it is not necessary for a relatively large amount of current to flow through the MTJ, the degradation of MTJ can be restrained.

6. Configuration and Operation of Magnetic Memory Cell and MRAM

Figure 28:
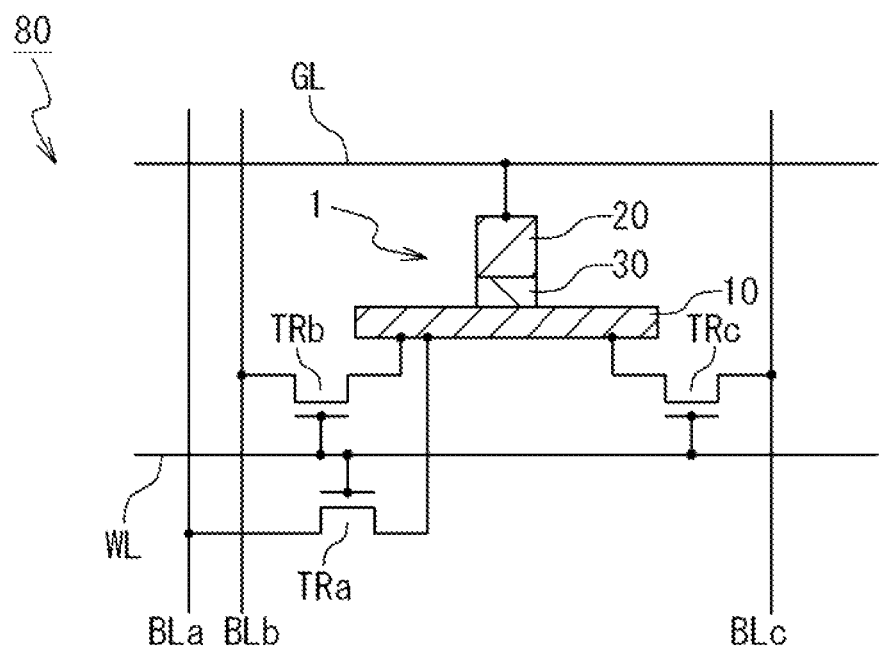
FIG. 28 is a circuit diagram showing the configuration of the memory cell according to the second to fourth exemplary embodiments of the present invention.

FIG. 28 is a block diagram showing the configuration of a memory cell integrated with the magneto-resistance effect element according to the second exemplary embodiment of the present invention. As shown in FIG. 28, a terminal connected with the reference layer 21 of the magnetic tunnel junction section 20 in magneto-resistance effect element 1 is connected with the ground line GL for the read. Three terminals connected with the auxiliary magnetization fixed region 11a2, the first magnetization fixed region 11b and the second magnetization fixed region 11c in the magnetization record layer 10 are connected with one of source/drain of a MOS transistor Tra, one of source/drain of a MOS transistor TRb and one of source/drain of a MOS transistor TRc, respectively. Also, the others of the sources/drains of the MOS transistors TRa and TRb and TRc are connected with bit lines Bla, BLb and BLc for the write, respectively. Moreover, the gates of MOS transistors Tra. TRb and TRc are connected with word line WL. Here, the configuration of the magnetic memory cell is not limited to this example.

Figure 29:
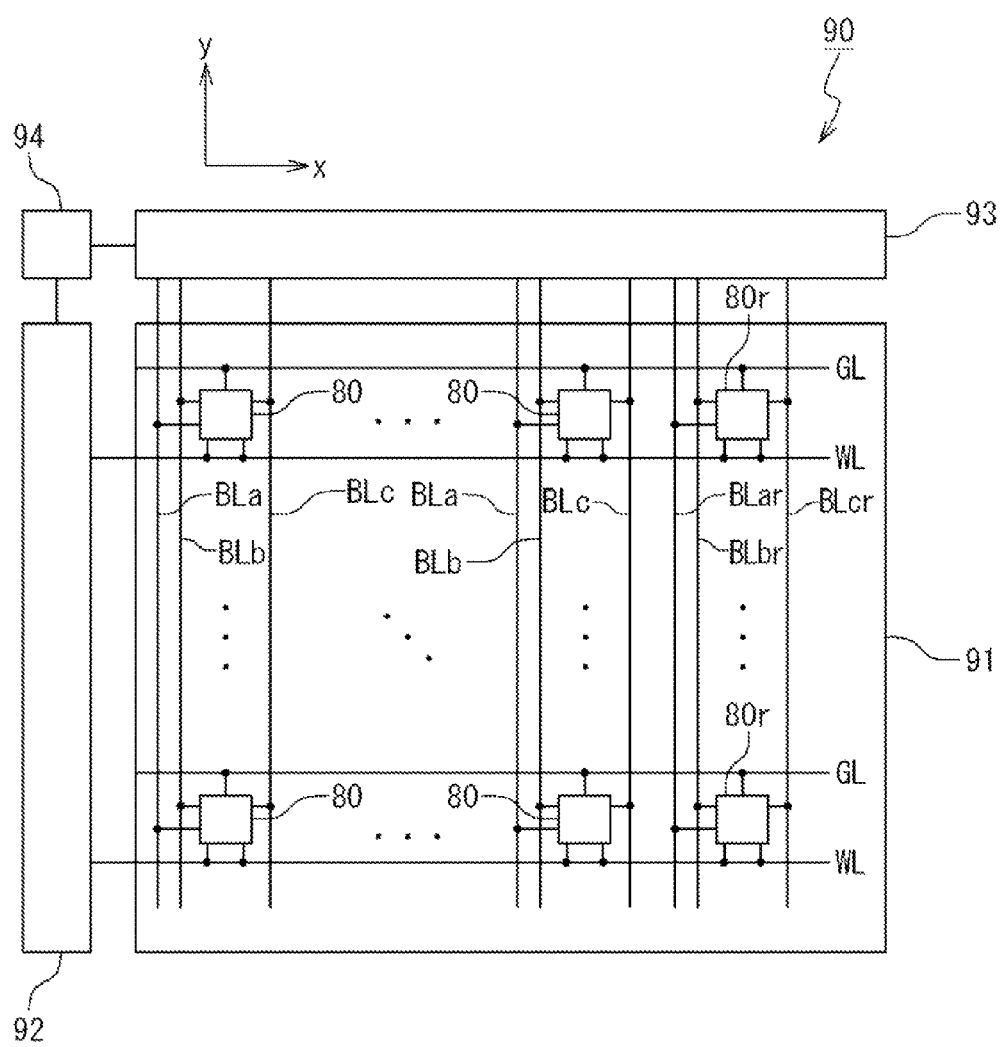
FIG. 29 is a block diagram showing the configuration of the MRAM according to the second to fourth exemplary embodiments of the present invention.

FIG. 29 is a block diagram showing the configuration of an MRAM in which the memory cells are integrated according to the second exemplary embodiment of the present invention. In FIG. 29, the MRAM 90 is provided with a memory array 91 in which a plurality of memory cells 80 are arranged in a matrix. The memory array 91 contains the reference cells 80r to be referred to in a case of the data read, together with the memory cells 80 used for the data write as shown in FIG. 28. In an example of FIG. 29, one column is of reference cells 80r. The configuration of reference cell 80r is same as the memory cell 80. In this case, the MTJ of the reference cell 80r has the resistance value R0.5.

The word line WL and the ground line GL extend into the X direction. The word line W is connected with an X-side control circuit 92 in the one end. The X-side control circuit 92 selects one of word lines WL which is connected with a target memory cell 80, as selection word line WL, in the data write operation and the data read operation. The bit lines BLa and BLb, BLc extend into the Y direction, and are connected with a Y-side control circuit 93 in the one end. The Y-side control circuit 93 selects the bit lines Bla, BLb, and BLc which are connected with the target memory cell 80 as selection bit lines Bla, BLb, and BLc in the data write operation and the data read operation. The control circuit 94 controls the X-side control circuit 92 and the Y-side control circuit 93 in the data write operation and the data read operation.

Next, a write method and a read method in the MRAM shown in FIG. 29 will be described. First, the write method will be described. The X-side control circuit 92 selects the selection word line WL. Thus, the selection word line WL is pulled up to the "high" level and the MOS transistors TRa, TRb and TRc are turned "ON". Also, the Y-side control circuit 93 selects the selection bit lines BLa, BLb and BLc. Either of the selection bit lines BLa, BLb and BLc is pulled up to the "high" level, either of the remaining bit lines BLa, BLb and BLc is pulled down to the "low" level and the remaining bit line BLa, BLb and BLc is set to am "Open" (floating) state. Which of the selection bit lines BLa, BLb and BLc is set to a "high", "low", and "Open" state is determined based on the data to be written in the magneto-resistance effect element 1. That is, it is determined based on the direction of the write current Iw to flow through the magnetization record layer 10. In this way, the first data to the third data are written separately.

Next, the data read operation will be described. The X-side control circuit 92 selects the selection word line WL. Thus, the selection word line WL is pulled up to the "high" level and the MOS transistors TRa, TRb and TRc are turned "ON". Also, the Y-side control circuit 93 selects the selection bit lines BLa. BLb and BLc. Thus, either of the selection bit lines BLa, BLb and BLc is pulled up to the "high" level and the remaining two bit lines are set to an "open" (floating) state. At this time, the read current IR flows from one of the selection bit lines BLa, BLb and BLc to the ground line GL through the second magnetization fixed region 11c, the second domain wall motion region 13b, the $0^{th}$ magnetization fixed region 11a, the contact layer 30 and the magnetic tunnel junction section 20 (MTJ composed of the sense layer 23, the barrier layer 22 and the reference layer 21). The potential of the bit line BL through which the read current IR flows or the value of the read current depend on a change of the resistance value of the magneto-resistance effect element 1 (the magnetic tunnel junction section 20) due to the magneto-resistance effect. Therefore, the data read operation at a high speed is made possible by comparing the output of the bit line with the output of the reference bit line BLr of the reference cell 80r through which a read current IR flows similarly and by detecting the change of the resistance value as a voltage signal or a current signal.

7. Position of Sensor Layer
8. Domain Wall Stopping Method
9. Magnetization Fixing Method
10. Anisotropy of sensor layer The position of the sensor layer a domain wall stopping method, a magnetization fixing method and the anisotropy of the sensor layer in the magnetic memory device according to the second exemplary embodiment of the present invention are same as those in the first exemplary embodiment and therefore the description is omitted.

11. Modification Example

Figure 30:
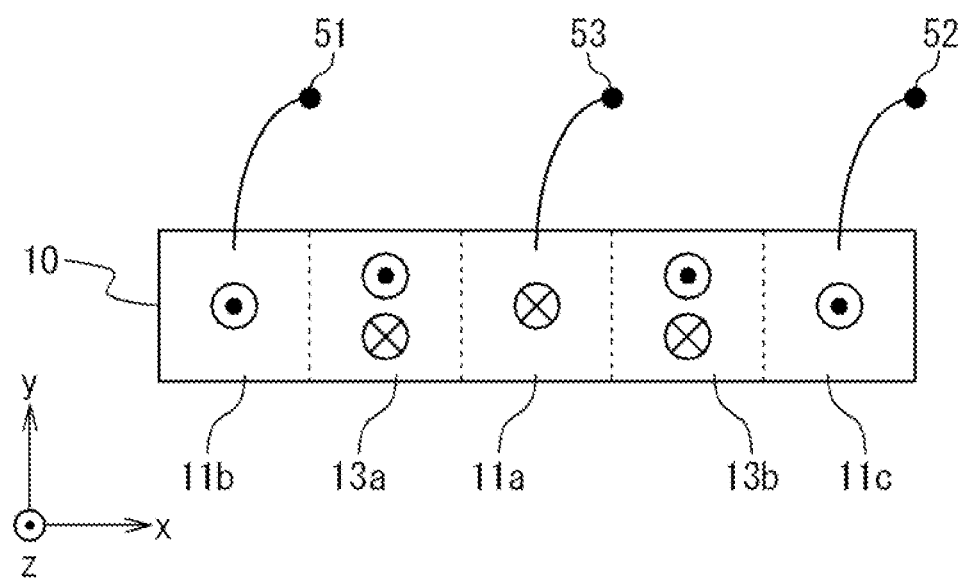
FIG. 30 is a plan view showing the modification example of the configuration of the magnetization record layer according to the second exemplary embodiment of the present invention.

FIG. 30 is a plan view showing the configuration of the magnetization record layer of the magnetic memory device according to a modification of the second exemplary embodiment of the present invention. In the configuration of the magnetization record layer of FIG. 24, the auxiliary magnetization fixed region 11a2 is connected with the $0^{th}$ magnetization fixed region 11a, and the current supply terminal 53 is connected with the auxiliary magnetization fixed region 11a2. However, the present invention is not limited to this example, and as shown in FIG. 30, the current supply terminal 53 may be directly connected with the $0^{th}$ magnetization fixed region 11a without passing through the auxiliary magnetization fixed region 11a2. In this case, the magnetic anisotropy of the sensor layer 23 needs to turn to the direction of ±y.

Because the remaining portion of the configuration and the operations is same as that mentioned previously, the description is omitted.

When the configuration of FIG. 30 is used, too, the same effect as in the above exemplary embodiments can be obtained.

As described above, in the present exemplary embodiment, too, the same effect as in the first exemplary embodiment can be obtained. That is, in the MRAM of the current drive domain wall motion type in which the magnetic anisotropy of the magnetization record layer is of a perpendicular direction, the magnetization fixed region can be easily formed, the read operation can be performed with high reliability and the pinning site of the domain wall can be set easily. Also, in addition, because the current can be supplied or taken out from the $0^{th}$ magnetization fixed region, mutual relation (combination) of the magnetization directions of the domain wall motion regions can be set for three kinds. Thus, three kinds of data can be stored in the magnetization record layer. That is, the magnetic memory device can be made multi-valued. Through the multi-valued configuration, a data capacity (an amount of data) per unit area of the semiconductor chip can be increased.

Third Exemplary Embodiment

Figure 31A:
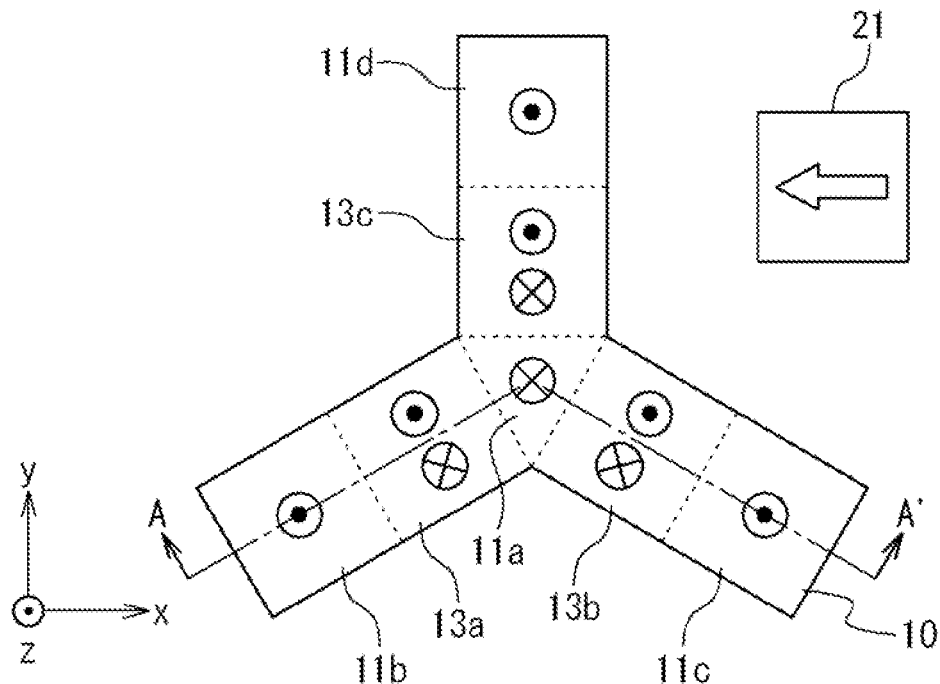
FIG. 31A is a plan view showing the configuration of the magnetization record layer according to a third exemplary embodiment of the present invention.
Figure 31B:
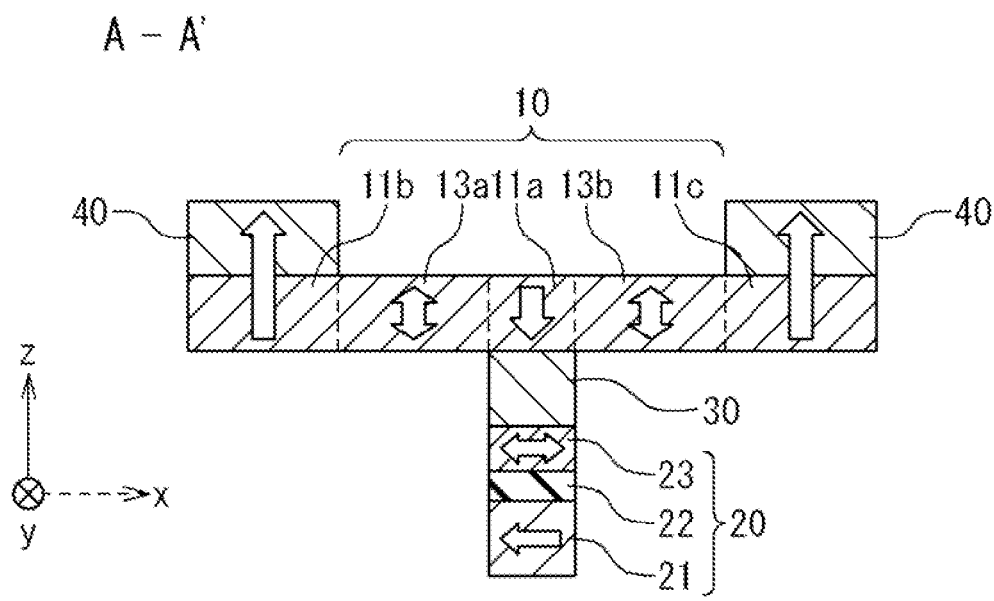
FIG. 31B is a sectional view showing the configuration of the magnetic memory device according to the third exemplary embodiment of the present invention.

In the third exemplary embodiment, the magnetic memory cell and the MRAM in a case of N=3 will be described.
1. Basic Configuration of Magnetic Memory Device FIG. 31A is a plan view showing an example of the configuration of the magnetization record layer in the magnetic memory device according to the third exemplary embodiment of the present invention. FIG. 31B is a sectional view showing an example of the configuration of the magnetic memory device according to the third exemplary embodiment of the present invention. Here, FIG. 31B is a sectional view of the magnetic memory device along the line AA' in FIG. 31A.

The magnetic memory device 1 of the present exemplary embodiment is provided with the magnetization record layer 10 and the magnetic tunnel junction section 20. Here, the present exemplary embodiment differs from the first exemplary embodiment in that the number of domain wall motion regions extending from the $0^{th}$ magnetization fixed region 11a and the number of magnetization fixed regions next to the motion regions is three (N=3).

Because the magnetic tunnel junction section 20 is same as in the first exemplary embodiment, the description is omitted.

The magnetization record layer 10 is provided with the $0^{th}$ magnetization fixed region 11a, the first magnetization fixed region 11b, the second magnetization fixed region 11c, a third magnetization fixed region 11d and the first domain wall motion region 13a, the second domain wall motion region 13b and a third domain wall motion region 13c. The first domain wall motion region 13a to the third domain wall motion region 13c are connected with the sides of the $0^{th}$ magnetization fixed region 11a, respectively. Moreover, the first magnetization fixed region 11b to the third magnetization fixed region 11d are connected with the first domain wall motion region 13a to the third domain wall motion region 13c on the outer sides, respectively. When a sectional shape in the xy plane of the $0^{th}$ magnetization fixed region 11a is an almost equilateral triangle, the magnetic recording layer 10 has a rotation symmetry to the $0^{th}$ magnetization fixed region 11a.

The $0^{th}$ magnetization fixed region 11a to the third magnetization fixed region 11d are ferromagnetic regions, in each of which the magnetization direction is fixed and which has the perpendicular magnetic anisotropy. The magnetization directions of the first magnetization fixed region 11b to the third magnetization fixed region 11d are substantially identical and the magnetization direction of the $0^{th}$ magnetization fixed region 11a is opposite to it. That is, the magnetization directions of the first magnetization fixed region 11b to the third magnetization fixed region 11d are parallel to each other. The magnetization directions of the first magnetization fixed region 11b to the third magnetization fixed region 11d and the magnetization direction of the $0^{th}$ magnetization fixed region 11a are anti-parallel to each other. It should be noted that the magnetization directions of the first magnetization fixed region 11b to the third magnetization fixed region 11d and the magnetization direction of the $0^{th}$ magnetization fixed region 11a are sufficient to attain a function of generating the domain walls 12a, 12b and 12c, and do not mean a same and opposite states in strict meaning. Also, in the example of this figure, the magnetization directions of the first magnetization fixed region 11b to the third magnetization fixed region 11d are the direction of +z and the magnetization direction of the $0^{th}$ magnetization fixed region 11a is the direction of −z. These magnetization directions may be opposite to each other.

It is desirable that the first magnetization fixed region 11b to the third magnetization fixed region 11d are substantially identically formed. The reason is in that it is the easiest to use the same manufacturing process from the viewpoint of the manufacturing method, and it is desirable that the symmetric property is high in the view of stability and reliability in a case of the data write operation and the data retaining operation to be mentioned later. Here, the phrase of "substantially same" means the shape and material, containing a film thickness are identical in a range of variation in the manufacturing process. In this case, a magnetization fixing method (to be described later) is same, too.

It is desirable that the first hard layers 40 are formed in the neighborhood of the first magnetization fixed region 11b to the third magnetization fixed region 11d, respectively. The first hard layers 40 are formed to effectively increase the coercive forces of the first magnetization fixed region 11b to the third magnetization fixed region 11d compared with the coercive forces of the $0^{th}$ magnetization fixed region 11a and the first domain wall motion region 13a to the third domain wall motion region 13c, to facilitate the initialization. In a case that the first hard layers 40 are provided, it is desirable the a fixed portion of the magnetization, including the first hard layer 40 is substantially the same in the above-mentioned meaning among a set of the first magnetization fixed region 11b and the first hard layers 40, a set of the second magnetization fixed region 11c and the first hard layers 40, and a set of the third magnetization fixed region 11d and the first hard layer 40.

The first domain wall motion region 13a to the third domain wall motion region 13c are ferromagnetic regions which have invertible magnetizations, in which the domain walls are movable and which have perpendicular magnetic anisotropy. Therefore, a combination of the magnetization directions that the first domain wall motion region 13a to the third domain wall motion region 13c can be directed is $2^3$ (=8). In the exemplary embodiment of the present invention, among these, the three combinations of the three magnetization directions (−z, +z, −z), (+z, −z, −z), (−z, −z, +z) are used according to data to be stored.

The magnetic tunnel junction section 20 is provided in the neighborhood of the $0^{th}$ magnetization fixed region 11a. The magnetization direction of the reference layer 21 in the magnetic tunnel junction section 20 is different from the direction in which each of the first domain wall motion region 13a to the third domain wall motion region 13c extends from the $0^{th}$ magnetization fixed region 11a. In an example of this figure, the magnetization direction of the reference layer 21 is the direction of −x. This direction is different from each of directions extending from the first domain wall motion region 13a to the third domain wall motion region 13c. The magnetization direction of the sensor layer 23 will be described later.

The xy-plane sectional shape of the magnetic tunnel junction section 20 is not limited to the above example, if it is possible for the magnetization direction of the sensor layer 23 to appropriately reflect the magnetization states of the first domain wall motion region 13a, the second domain wall motion region 13b and the third domain wall motion region 13c. For example, the sectional shape may be equilateral triangular and it may be rectangular.

The remaining portion of the configuration of the magnetic memory device 1 is same as in the first exemplary embodiment and the description is omitted.

2. Storage State of Data

Figure 32A:
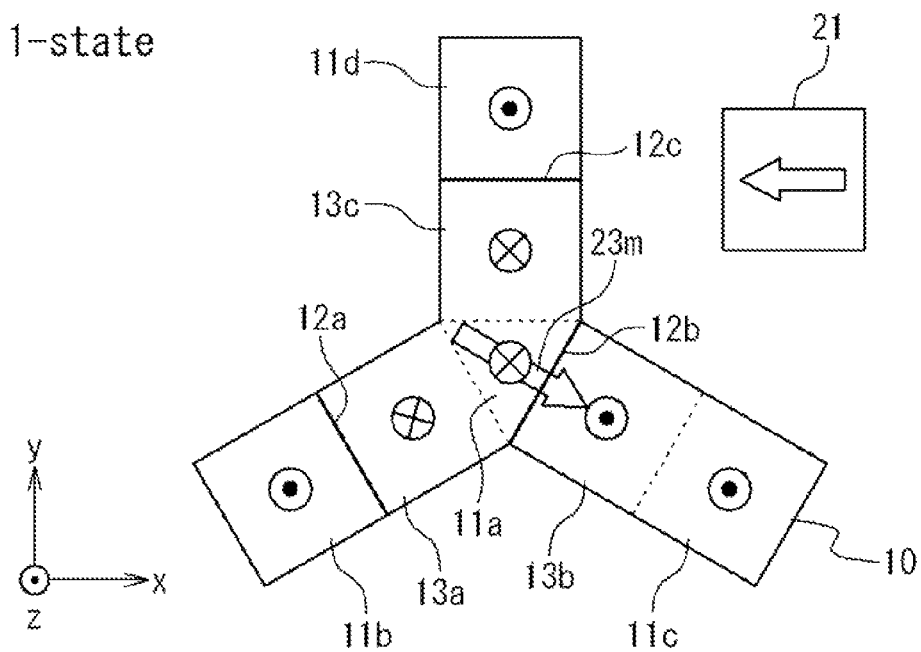
FIG. 32A is a plan view showing the configuration of the magnetic memory device according to the third exemplary embodiment of the present invention.
Figure 32B:
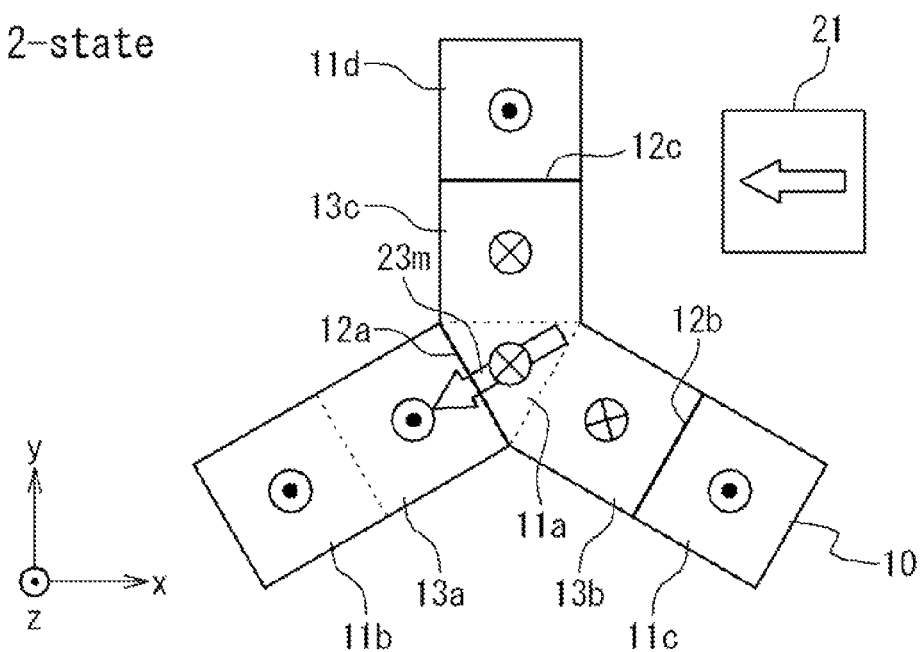
FIG. 32B is a plan view showing the configuration of the magnetic memory device according to the third exemplary embodiment of the present invention.
Figure 32C:
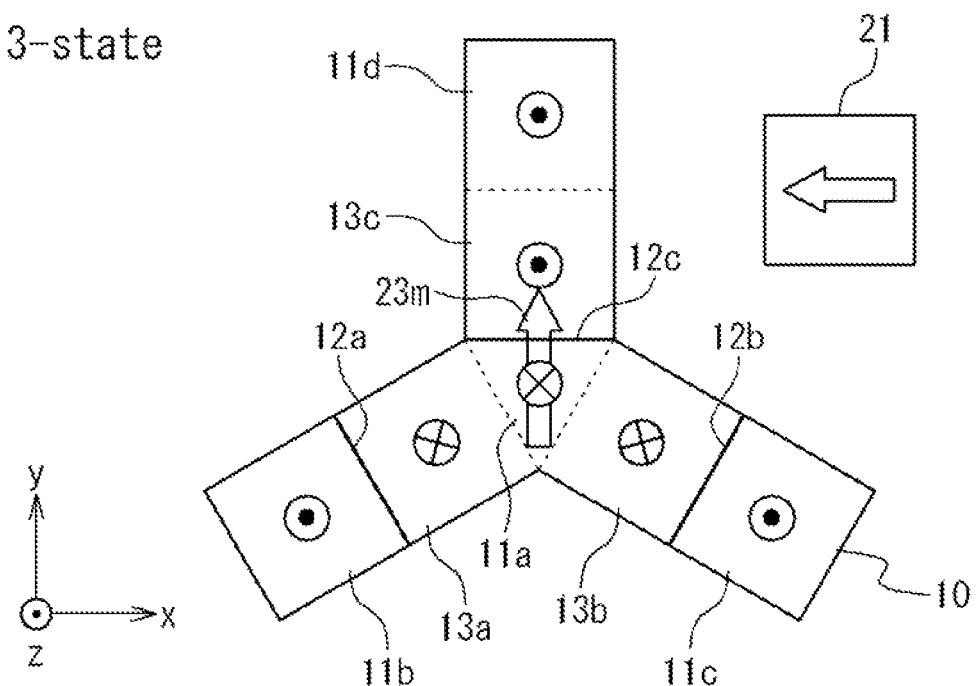
FIG. 32C is a plan view showing the configuration of the magnetic memory device according to the third exemplary embodiment of the present invention.

FIG. 32A to FIG. 32C are plan views showing an example of the configuration of the magnetic memory device according to the third exemplary embodiment of the present invention. In the present exemplary embodiment, the magnetization record layer 10 retains data depending on the mutual relation of the magnetization directions of the domain wall motion regions. The magnetic memory device 1 of the present exemplary embodiment can take three states and can store three kinds of data. Here, it is supposed that the planar shape of the $0^{th}$ magnetization fixed region 11a is an equilateral triangle. FIG. 32A shows a state (β1-state) when the first data is stored, FIG. 32B shows a state (β2-state) when the second data is stored, and FIG. 32C shows a state (β3-state) when the third data is stored. Three kinds of data may correspond to optional data.

As shown in FIG. 32A, when the magnetization record layer 10 stores the first data, the magnetization direction of the first domain wall motion region 13a is the direction of −z, the magnetization direction of the second domain wall motion region 13b is the direction of +z, and the magnetization direction of the third domain wall motion region 13c is the direction of −z, i.e. (−z, +z, −z). With this, the domain walls 11a, 12b and 12c are formed between the first magnetization fixed region 11b and the first domain wall motion region 13a, between the $0^{th}$ magnetization fixed region 11a and the second domain wall motion region 13b, and between the third domain wall motion region 13c and the third magnetization fixed region 11d, respectively. At this time, magnetic field H is generated in the neighborhood of the sensor layer 23 on the lower-side of the magnetization record layer 10 (on the side of −z), to direct from the first domain wall motion region 13a and the third wall movement region 13c to the second domain wall motion region 13b. Because the $0^{th}$ magnetization fixed region 11a is an equilateral triangle, the direction of the magnetic field H is a first direction shined by about 30 degrees to the direction of −y from the direction of +x. Thus, the direction of the magnetization 23m of the sensor layer 23 is the first direction in the same way. As a result, the relative angle between the direction of the magnetization 23m of the sensor layer 23 and the direction of the magnetization of the reference layer 21 is about 120 degrees in the magnetic tunnel junction section 20. Therefore, this state that the relative angle is about 120 degrees can be detected by detecting a resistance value in the ±z direction of the magnetic tunnel junction section 20. That is, the first data (β1-state) stored in the magnetization record layer 10 can be read.

On the other hand, as shown in FIG. 32B, when the magnetization record layer 10 stores the second data, the magnetization direction of the first domain wall motion region 13a is the direction of +z, the magnetization direction of the second domain wall motion region 13b is the direction of −z, and the magnetization direction of the third domain wall motion region 13c is the direction of −z, i.e. (+z, −z, −z). The domain walls 12a, 12b and 12c are formed between the first domain wall motion region 13a and the $0^{th}$ magnetization fixed region 11a, between the second domain wall motion region 13b and the second magnetization fixed region 11c, and between the third domain wall motion region 13c and the third magnetization fixed region 11d, respectively. At this time, the magnetic field H is generated in the neighborhood of the sensor layer 23 on the lower-side of the magnetization record layer 10 (on the side of −z), to direct from the second domain wall motion region 13b and the following third wall movement region 13c to the first domain wall motion region 13a. The direction of this magnetic field H is a second direction shifted by about 30 degrees to the direction of −y from the direction of −x. Thus, the direction of the magnetization 23m of the sensor layer 23 is the second direction in the same way. As a result, in the magnetic tunnel junction section 20, the relative angle between the direction of the magnetization 23m of the sensor layer 23 and the direction of the magnetization of the reference layer 21 is about 30 degrees. Therefore, the state that the relative angle is about 30 degrees can be detected by detecting a resistance value in the direction of ±z of the magnetic tunnel junction section 20. That is, the second data (β2-state) stored in the magnetization record layer 10 can be read.

Moreover, as shown in FIG. 32C, when the magnetization record layer 10 stores the third data, the magnetization direction of the first domain wall motion region 13a is the direction of −z, the magnetization direction of the second domain wall motion region 13b is the direction of −z, and the magnetization direction of the third domain wall motion region 13c is the direction of +z, i.e. (−z, −z, +z). The domain walls 12a, 12b and 12c are formed between the first magnetization fixed region 11b and the first domain wall motion region 13a, between the second domain wall motion region 13b and the second magnetization fixed region 11e, and between the $0^{th}$ magnetization fixed region 11a and the third domain wall motion region 13c, respectively. At this time, the magnetic field H is generated in the neighborhood of the sensor layer 23 on the lower-side of the magnetization record layer 10 (on the side of −z), to direct from the following second wall movement region 13b and the first domain wall motion region 13a to the third domain wall motion region 13c. The direction of this magnetic field H is a third direction in the direction of +y. Thus, the direction of the magnetization 23m of the sensor layer 23 is the second direction in the same way. As a result, in the magnetic tunnel junction section 20, the relative angle between the direction of the magnetization 23m of the sensor layer 23 and the direction of the magnetization of the reference layer 21 is about 90 degrees. In a case of this figure, the relative angle becomes about 90 degrees. Therefore, by detecting a resistance value in the direction of ±z of the magnetic tunnel junction section 20, the relative angle of an about 90 degrees can be detected. That is, the third data (β3-state) stored in the magnetization record layer 10 can be read.

It should be noted that a relation between the relative angle between the direction of the magnetization of the sensor layer 23 and the direction of the magnetization of the reference layer 21 and the resistance value of the magnetic tunnel junction section 20 is as shown in FIG. 26, excluding that the relative angles in the β1-state to the β3-state are 120 degrees, 30 degrees, and 90 degrees, the description is omitted.

The magnetic memory device 1 of the present exemplary embodiment is made trinary and can store three kinds of data. It should be noted that the magnetization direction of the reference layer 21 is not limited to the example shown in FIG. 32A to FIG. 32C and may be another direction if the relative angle between the magnetization direction of the sensor layer 23 and the magnetization direction of the reference layer 30 is of three kinds.

3. Initializing Method of Magnetization Fixed Region

For example, the initializing method of the magnetic memory device according to the third exemplary embodiment of the present invention can be performed as in the first exemplary embodiment (FIG. 6A to FIG. 6C). Therefore, the description is omitted.

4. Write Operation

Next, the data write principle into the magnetic memory device will be described. The write operation is performed by supplying a current to a route such that electrons are supplied from the magnetization fixed region on the side of the domain wall motion region whose magnetization direction should be turned to the direction of +z and the electrons are drawn out from the other magnetization fixed region on the side of the domain wall motion region whose magnetization direction should be turned to the −z direction. According to the necessity, a plurality of routes may be used. Hereinafter, the write operation will be described in detail.

Figure 33A:
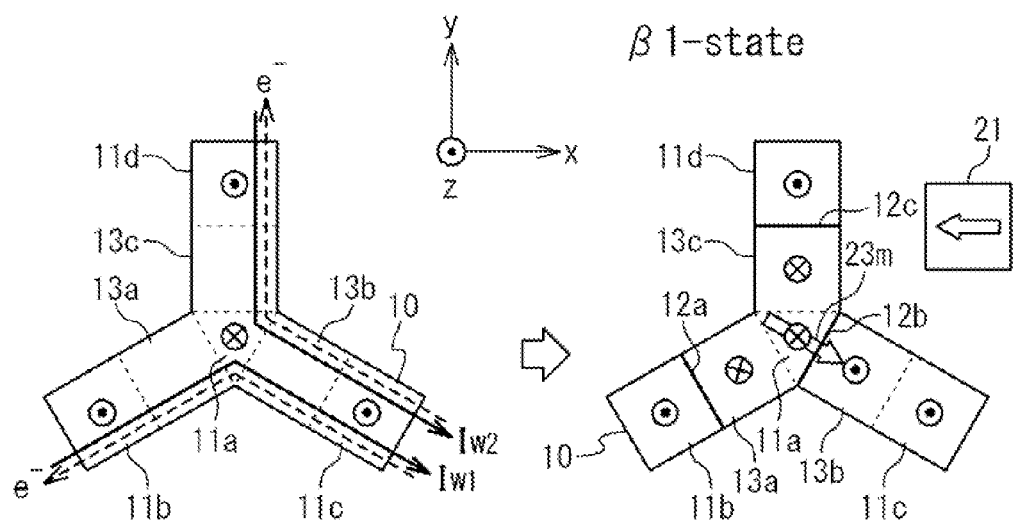
FIG. 33A is a plan view showing the data write principle according to the third exemplary embodiment of the present invention.
Figure 33B:
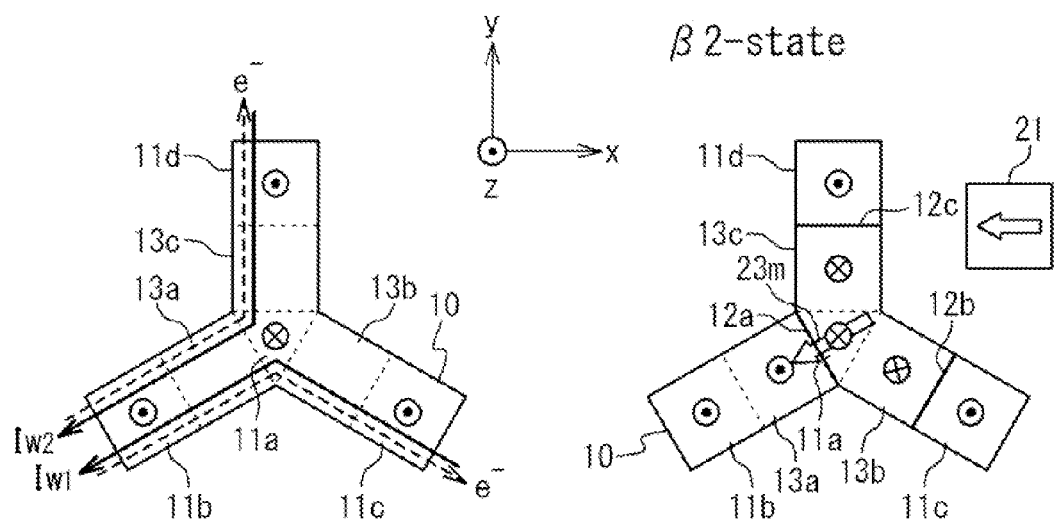
FIG. 33B is a plan view showing the data write principle according to the third exemplary embodiment of the present invention.
Figure 33C:
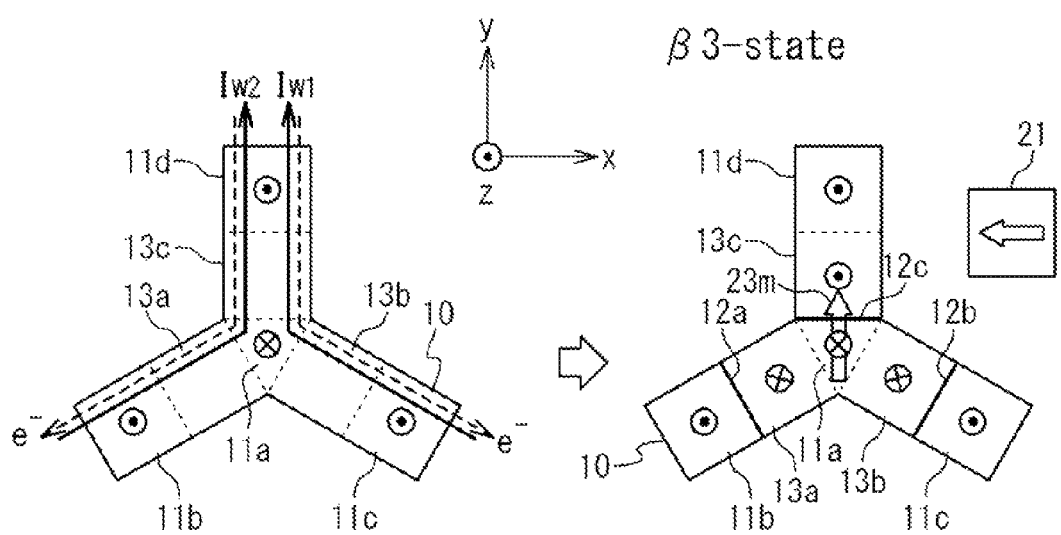
FIG. 33C is a plan view showing the data write principle according to the third exemplary embodiment of the present invention.

FIG. 33A to FIG. 33C are plan views showing the data write principle into the magnetic memory device according to the third exemplary embodiment of the present invention. The data write operation is performed by the domain wall motion method using spin transfer. The write current Iw flows into the magnetization record layer 10 in plane to pass through the domain walls 12a, 12b and 12c, not a direction to pass through the MTJ (magnetic tunnel junction section 20). The write current Iw is supplied to the magnetization record layer 10 from either of the current supply terminal (not shown) connected with the first magnetization fixed region 11b, the current supply terminal (not shown) connected with the second magnetization fixed region 11e, and the current supply terminal (not shown) connected with the third magnetization fixed region 11d.

As shown in the left side of FIG. 33A, in a case of the write operation of the first data (β1-state), the first write current Iw1 (solid line arrow) flows from the first magnetization fixed region 11b to the second magnetization fixed region 11c through the first domain wall motion region 13a, the $0^{th}$ magnetization fixed region 11a and the second domain wall motion region 13b in this order. In this case, the motion of electrons e⁻ (broken line arrow) is opposite to the flow direction of the write current Iw1. As a result, spin electrons c are injected into the second domain wall motion region 13b from the second magnetization fixed region 11c. The domain wall 12b is driven due to spin of injected electrons e⁻ from the boundary between the second magnetization fixed region 11e and the second domain wall motion region 13b to the boundary between the $0^{th}$ magnetization fixed region 11a and the second domain wall motion region 13b. As a result, the magnetization direction of the second domain wall motion region 13b is inverted to the direction of +z by the spin transfer effect. Thus, the domain wall 12b is moved to the boundary between the second domain wall motion region 13b and the $0^{th}$ magnetization fixed region 11a. Moreover, spin electrons e⁻ are injected into the first domain wall motion region 13a from the $0^{th}$ magnetization fixed region 11a. The domain wall 12a is driven due to spin of injected electrons e⁻ from the boundary between the $0^{th}$ magnetization fixed region 11a and the first domain wall motion region 13a to the boundary between the first magnetization fixed region 11b and the first domain wall motion region 13a. As a result, the magnetization direction of the first domain wall motion region 13a is inverted to the direction of −z by the spin transfer effect. Thus, the domain wall 12a is moved to the boundary between the first domain wall motion region 13a and the first magnetization fixed region 11b.

In addition, the second write current Iw2 flows from the third magnetization fixed region 11d to the second magnetization fixed region 11c through the third domain wall motion region 13c, the $0^{th}$ magnetization fixed region 11a and the second domain wall motion region 13b in this order (solid line arrow). As a result, spin electrons e⁻ are injected into the third domain wall motion region 13c from the $0^{th}$ magnetization fixed region 11a. The domain wall 12c is driven due to spin of injected electrons e⁻ from the boundary between the $0^{th}$ magnetization fixed region 11a and the third domain wall motion region 13c to the boundary between the third magnetization fixed region 11d and the third domain wall motion region 13c. As a result, the magnetization direction of the third domain wall motion region 13c is inverted to the direction of −z by the spin transfer effect. Thus, the domain wall 12c is moved to the boundary between the third domain wall motion region 13c and the third magnetization fixed region 11d. The first data (β1-state) is written in as shown in the right side of FIG. 33A.

As shown in the left side of FIG. 33B, in a case of the write operation of the second data (β2-state), the first write current Iw1 flows from the second magnetization fixed region 11c to the first magnetization fixed region 11b through the second domain wall motion region 13b, the $0^{th}$ magnetization fixed region 11a and the first domain wall motion region 13a in this order (solid line arrow). In this case, the motion of electrons (broken line arrow) is opposite to the direction of the write current Iw1. As a result, spin electrons e⁻ is injected into the first domain wall motion region 11 from the first magnetization fixed region 11b. The domain wall 12a is driven due to spin of injected electrons e⁻ from the boundary between the first magnetization fixed region 11b and the first domain wall motion region 13a to the boundary between the $0^{th}$ magnetization fixed region 11a and the first domain wall motion region 13a. As a result, the magnetization direction of the first domain wall motion region 13a is inverted to the direction of +z by the spin transfer effect. Thus, the domain wall 12a is moved to the boundary between the first domain wall motion region 13a and the $0^{th}$ magnetization fixed region 11a. Moreover, spin electrons c are injected into the second domain wall motion region 13b from the $0^{th}$ magnetization fixed region 11a. The domain wall 12b is driven due to spin of injected electrons e⁻ from the boundary between the $0^{th}$ magnetization fixed region 11a and the second domain wall motion region 13b to the boundary between the second magnetization fixed region 11c and the second domain wall motion region 13b. As a result, the magnetization direction of the second domain wall motion region 13b is inverted to the direction of −z by the spin transfer effect. Thus, the domain wall 12b is moved to the boundary between the second domain wall motion region 13b and the second magnetization fixed region 11c.

Moreover, the second write current Iw2 flows from the third magnetization fixed region 11d to the first magnetization fixed region 11b through the third domain wall motion region 13c, the $0^{th}$ magnetization fixed region 11a and the first domain wall motion region 13a in this order (solid line arrow). As a result, spin electrons e⁻ are injected into the third domain wall motion region 13c from the $0^{th}$ magnetization fixed region 11a. The domain wall 12c is driven due to spin of injected electrons e⁻ from the boundary between the $0^{th}$ magnetization fixed region 11a and the third domain wall motion region 13c to the boundary between the third magnetization fixed region 11d and the third domain wall motion region 13c. As a result, the magnetization direction of the third domain wall motion region 13c is inverted to the direction of −z by the spin transfer effect. Thus, the domain wall 12c is moved to the boundary between the third domain wall motion region 13c and the third magnetization fixed region 11d. In this way, as shown in the right side of FIG. 33B, the second data (β2-state) is written.

As shown in the left side of FIG. 33C, in a case of the write operation of the third data (β3-state), the first write current Iw1 flows from the second magnetization fixed region Ile to the third magnetization fixed region 11d through the second domain wall motion region 13b, the $0^{th}$ magnetization fixed region 11a and the third domain wall motion region 13c in this order (solid line arrow). In this case, the motion of electrons e⁻ (broken line arrow) is opposite to the direction of the write current Iw1. As a result, spin electrons e⁻ are injected into the third domain wall motion region 13e from the third magnetization fixed region 11d. The domain wall 12c is driven due to spin of injected electrons e⁻ from the boundary between the third magnetization fixed region 11d and the third domain wall motion region 13c to the boundary between the $0^{th}$ magnetization fixed region 11a and the third domain wall motion region 13c. As a result, the magnetization direction of the third domain wall motion region 13c is inverted to the direction of +z by the spin transfer effect. Thus, the domain wall 12c is moved to the boundary between the third domain wall motion region 13e and the $0^{th}$ magnetization fixed region 11a. Moreover, spin electrons e⁻ are injected into the second domain wall motion region 13b from the $0^{th}$ magnetization fixed region 11a. The domain wall 12b is driven due to spin of injected electrons e⁻ from the boundary between the $0^{th}$ magnetization fixed region 11a and the second domain wall motion region 13b to the boundary between the second domain wall motion region 13b and the second magnetization fixed region 11c. As a result, the magnetization direction of the second domain wall motion region 13b is inverted to the direction of −z by the spin transfer effect. Thus, the domain wall 12b is moved to the boundary between the second domain wall motion region 13b and the second magnetization fixed region 11c.

Furthermore, the second write current Iw2 from the first magnetization fixed region 11b to the third magnetization fixed region 11d through the first domain wall motion region 13a, the $0^{th}$ magnetization fixed region 11a and the third domain wall motion region 13c in this order (solid line arrow). As a result, spin electrons e⁻ are injected into the first domain wall motion region 13a from the $0^{th}$ magnetization fixed region 11a. The domain wall 12a is driven due to spin of injected electrons e⁻ from the boundary between the $0^{th}$ magnetization fixed region 11a and the first domain wall motion region 13a to the boundary between the first domain wall motion region 13a and the first magnetization fixed region 11b. As a result, the magnetization direction of the first domain wall motion region 13a is inverted to the direction of −z by the spin transfer effect. Thus, the domain wall 12a is moved to the boundary between the first domain wall motion region 13a and the first magnetization fixed region 11b. The third data (β3-state) is written as shown in the right side of FIG. 33C.

In this way, the magnetization directions of the first domain wall motion region 13a to the third domain wall motion region 13c are inverted by the write currents Iw1 and Iw2 which flow through the magnetization record layer 10 in plane. Thus, the first data to the third data are separately written as combinations of the magnetization directions. At this time, the magnetization fixed regions on both sides of each domain wall motion region have the magnetization direction anti-parallel to each other and attain roles as the different supply sources of the spin electrons to the domain wall motion regions. It should be noted that when the domain wall 12 is positioned initially in the position after the write operation, the state of the domain wall 12 is maintained regardless of the injection of spin electrons e⁻. Therefore, overwrite is possible. Also, even in any case of FIG. 33A to FIG. 33C, the first write current Iw1 and the second write current Iw2 may be supplied at the same time, or a different times, and the supply order may be opposite. Also, the write currents Iw1 and Iw2 may pass wherever later if passing through the domain wall 12a and 12b.

5. Read Operation

The read principle of the data from the magnetic memory device according to the third exemplary embodiment of the present invention is the same as in the first exemplary embodiment, excluding that 30 degrees. 90 degrees and 120 degrees of the relative angles in the range shown in FIG. 26 are used. Therefore, the description is omitted.

In this case, too, it is not necessary to supply a relatively large amount of current for the write operation into the MTJ but it is sufficient to supply a relatively small amount of current for the read operation into the MTJ. Therefore, the degradation of MTJ can be restrained.

6. Configuration and Operation of Magnetic Memory Cell and MRAM

The configuration and operation of the magnetic memory cell and MRAM according to the third exemplary embodiment of the present invention are the same as the second exemplary embodiment, the description is omitted.

7. Position of Sensor Layer
8. Domain Wall Stopping Method
9. Magnetization Fixing Method
10. Anisotropy of Sensor Layer The position of the sensor layer, the domain wall stopping method, the magnetization fixing method and the anisotropy of the sensor layer in the magnetic memory device according to the third exemplary embodiment of the present invention are same as those of the first exemplary embodiment and therefore the description is omitted.

As described above, the same effect as in the second exemplary embodiment can be obtained even in the present exemplary embodiment. That is, in the MRAM of the current drive domain wall motion type in which the magnetic anisotropy of the magnetization record layer is of the perpendicular direction, the magnetization fixed region can be easily formed, the read operation can be performed in a high reliability and the pinning site of the domain wall can be easily formed. In addition, multi-valued storage can be attained such that the magnetization record layer stores three kinds of data. Thus, it is possible to increase a data amount per unit area in the semiconductor chip.

Fourth Exemplary Embodiment

Figure 34A:
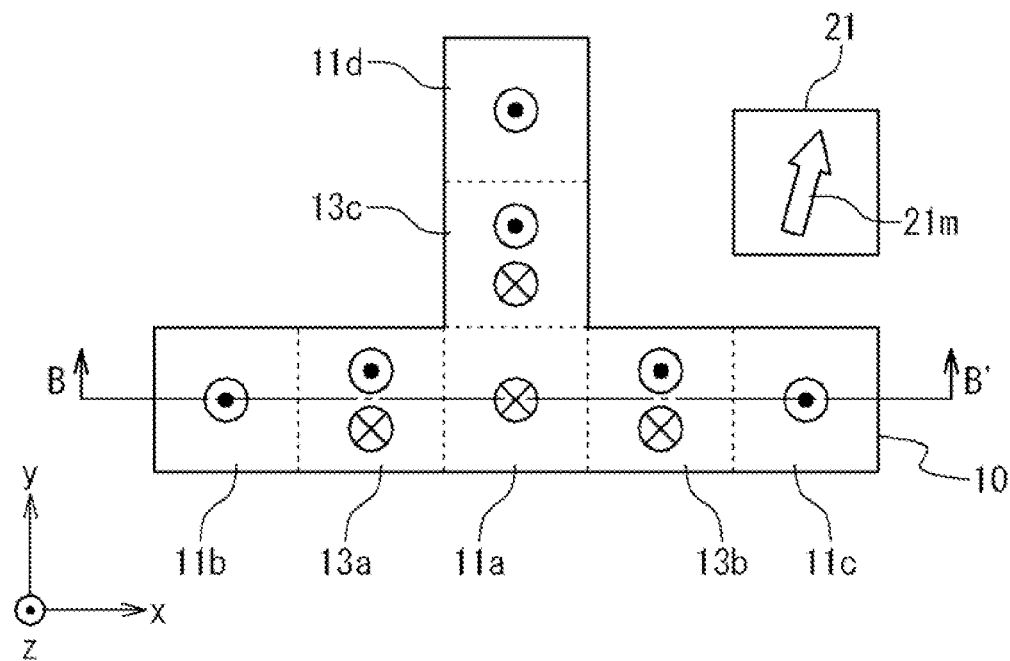
FIG. 34A is a plan view showing the configuration of the magnetization record layer according to a fourth exemplary embodiment of the present invention.
Figure 34B:
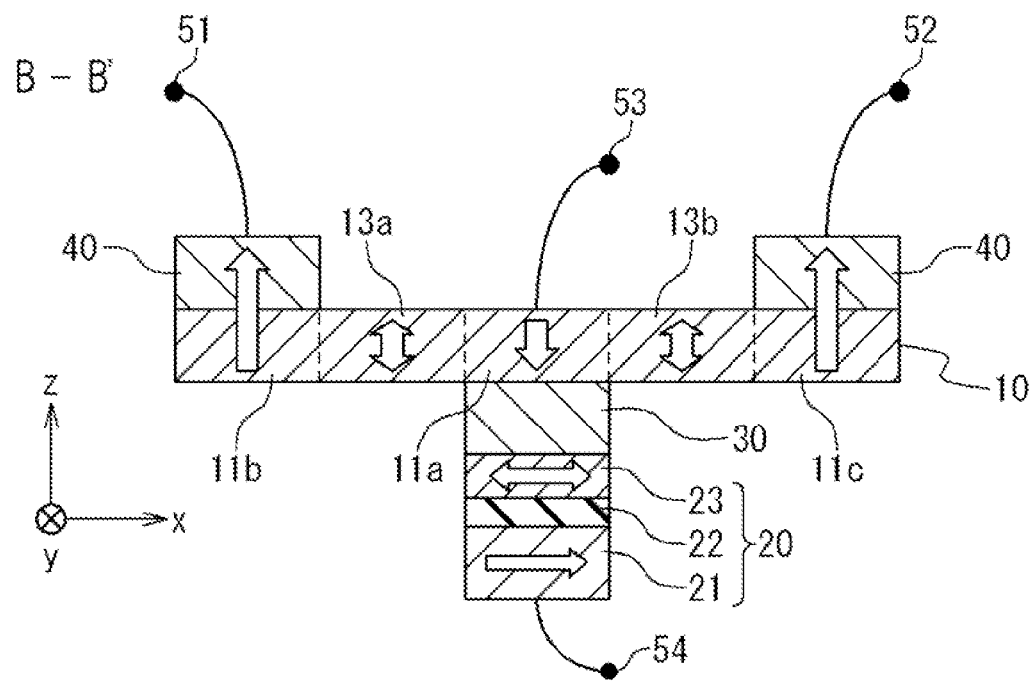
FIG. 34B is a sectional view showing the configuration of the magnetic memory device according to the fourth exemplary embodiment of the present invention.

In a fourth exemplary embodiment, the magnetic memory cell and the MRAM in case of the N=3 will be described.
1. Basic Configuration of Magnetic Memory Device FIG. 34A is a plan view showing an example of the configuration of the magnetization record layer of the magnetic memory device according to the fourth exemplary embodiment of the present invention. FIG. 34B is a sectional view showing the example of the configuration of the magnetic memory device according to the fourth exemplary embodiment of the present invention. Here, FIG. 34B is a sectional view of the magnetic memory device along the line BB' in FIG. 34A.

The magnetic memory device 1 of the present exemplary embodiment is provided with the magnetization record layer 10 and the magnetic tunnel junction section 20. Here, the present exemplary embodiment differs from the first exemplary embodiment in that the number or sets of domain wall motion region extending from the magnetization fixed region 11a and the number of regions next to the domain wall motion regions are three (N=3) like the third exemplary embodiment.

In the present exemplary embodiment, the magnetic memory device 1 of a T character type that the number of magnetization fixed regions is three (N=3) will be described. Here, if the number of magnetization fixed regions is three (N=3) and the magnetization direction of the reference layer 21 satisfies the condition to be described later, for example, another three forked structure such as the Y-type three forked structure described in the third exemplary embodiment can be applied.

Figure 35:
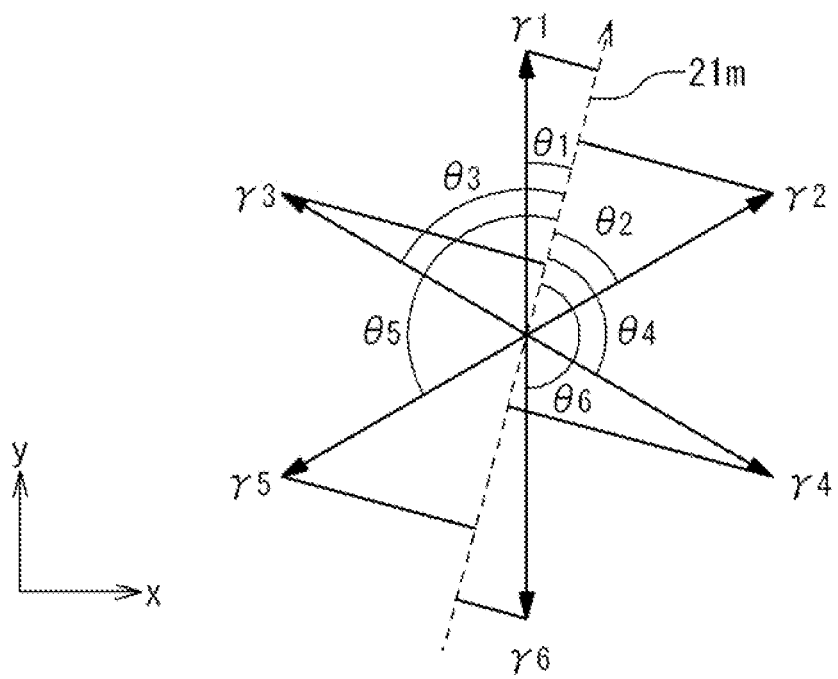
FIG. 35 is a conceptual diagram showing a relation between the magnetization direction of the reference layer according to the fourth exemplary embodiment of the present invention and a direction of synthetic magnetic field of domain wall motion regions.

In the present exemplary embodiment, in order to further improve the of multi-valued function, the magnetization direction of the reference layer 21 of the magnetic tunnel junction section 20 is shifted from the direction of ±y by a small angle. FIG. 35 is a conceptual diagram showing a relation between the magnetization direction of the reference layer according to the fourth exemplary embodiment of the present invention and the direction of a synthetic magnetic field by the domain wall motion region. The magnetic recording layer 10 can take six kinds of states such as γ1-state to γ6-state to be mentioned later. At that time, the directions of the synthetic magnetic fields of the first domain wall motion region 13a to the third domain wall motion region 13c are six kinds of directions (solid line arrow of γ1-γ6). Therefore, the magnetization direction of the sensor layer 23 of the magnetic tunnel junction section 20 takes these six kinds of directions. Here, the magnetization direction 21m of the reference layer 21 (broken line arrow) is set to a direction shifted from the direction of +y by a little angle (about θ1). In this case, six kinds of angles, θ1 to θ6 (θ1<θ2<θ3<θ4<θ5<θ6), can be set as the relative angles between the magnetization 21m direction of the reference layer 21 and the magnetization direction (γ1-γ6) of the sensor layer 23. Therefore, by assigning six kinds of data to the six kinds of relative angles, the magnetic memory device of the present exemplary embodiment can be made to have 6 values, as shown in FIG. 26.

The remaining portion of the configuration of the magnetic memory device 1 is the same as in the third exemplary embodiment, and the description is omitted.

2. Storage State of Data

FIG. 36A to FIG. 36F are plan views showing an example of the configuration of the magnetic memory device according to the fourth exemplary embodiment of the present invention. In the present exemplary embodiment, the magnetization record layer 10 retains data as a mutual relation between the magnetization directions of the respective domain wall motion regions. The magnetic memory device 1 of the present exemplary embodiment can take six states and can store six kinds of data. Here, it is supposed that the shape of the 0$^{th}$ magnetization fixed region 11a is square. For example. FIG. 36A to FIG. 36F show a state (γ1-state) when the first data is stored to a state (γ6-state) when the sixth data is stored, respectively. The six kinds of data may be optional data.

Figure 36A:
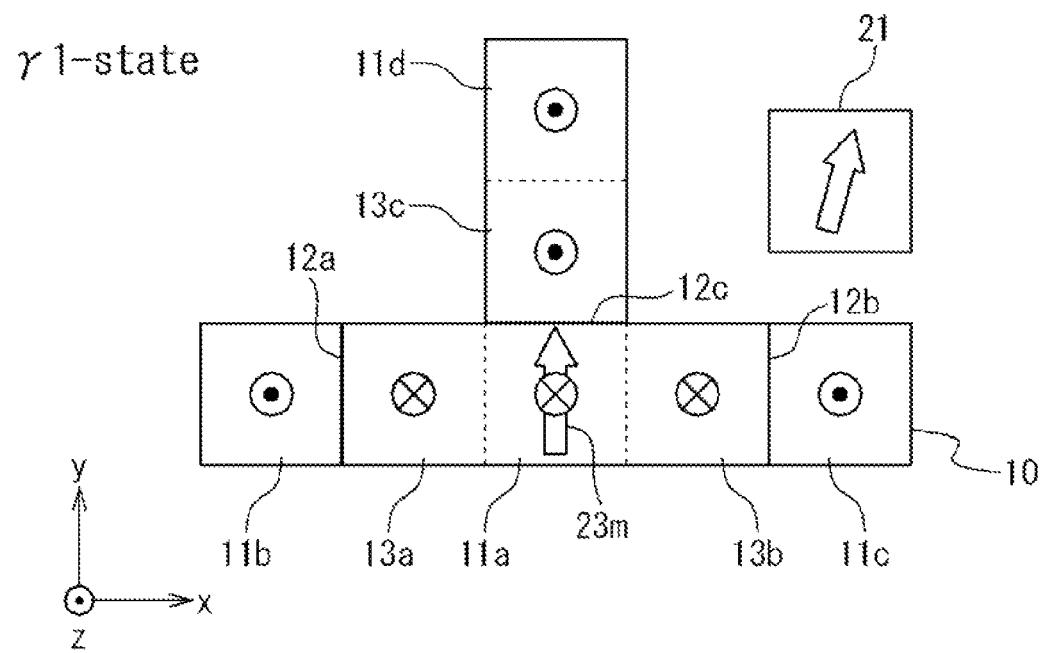
FIG. 36A is a plan view showing the configuration of the magnetic memory device according to the fourth exemplary embodiment of the present invention.

As shown in FIG. 36A, when the magnetization record layer 10 stores the first data, the magnetization direction of the first domain wall motion region 13a is the direction of −z, the magnetization direction of the second domain wall motion region 13b is the direction of −z and the magnetization direction of the third domain wall motion region 13c is the direction of +z, i.e. (−z, −z, +z). The domain walls 12a, 12b and 12c are formed between the first magnetization fixed region 11b and the first domain wall motion region 13a, between the second domain wall motion region 13b and the second magnetization fixed region 11c, and between the 0$^{th}$ magnetization fixed region 11a and the third domain wall motion region 13c, respectively. At this time, the magnetic field H is generated in the neighborhood of the sensor layer 23 on the lower-side of the magnetization record layer 10 (on the side of −z), to direct to the first direction as the direction of +y. Thus, the direction of the magnetization 23m of the sensor layer 23 is the first direction in the same way. As a result, in the magnetic tunnel junction section 20, the relative angle is θ1 (FIG. 35) between the direction of the magnetization 23m of the sensor layer 23 and the magnetization direction of the reference layer 21. Therefore, the state that the relative angle is θ1 can be detected by detecting a resistance value in the direction of ±z of the magnetic tunnel junction section 20. That is, the first data (γ1-state) stored in the magnetization record layer 10 can be read.

Figure 36B:
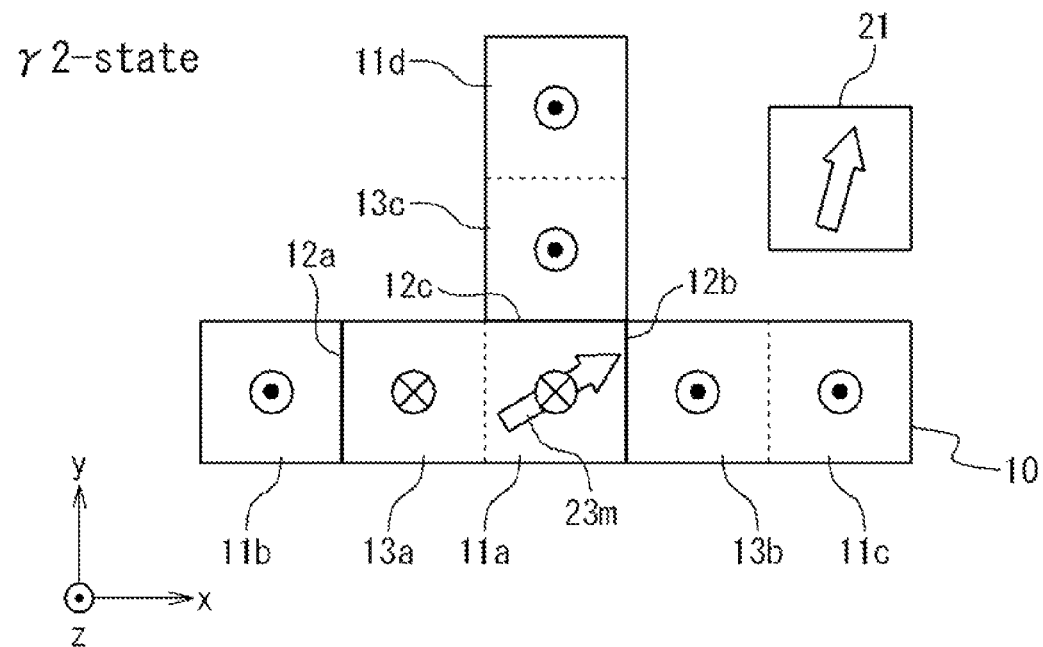
FIG. 36B is a plan view showing the configuration of the magnetic memory device according to the fourth exemplary embodiment of the present invention.

As shown in FIG. 36B, when the magnetization record layer 10 stores the second data, the magnetization direction of the first domain wall motion region 13a is the direction of −z, the magnetization direction of the second domain wall motion region 13b is the direction of +z and the magnetization direction of the third domain wall motion region 13c is the direction of +z, i.e. (−z, +z, +z). The domain walls 12a, 12b and 12c are formed between the first magnetization fixed region 11b and the first domain wall motion region 13a, between the 0$^{th}$ magnetization fixed region 11a and the second domain wall motion region 13b, and between and the 0$^{th}$ magnetization fixed region 11a and the third domain wall motion region 13c, respectively. At this time, the magnetic field H is generated in the neighborhood of the sensor layer 23 on the lower-side of the magnetization record layer 10 (on the side of −z), to direct to a second direction shifted to the direction of +y by about 30 degrees from the direction of +x. Thus, the direction of the magnetization 23m of the sensor layer 23 is the second direction in the same way. As a result, in the magnetic tunnel junction section 20, the relative angle is about θ2 (FIG. 35) between the direction of the magnetization 23m of the sensor layer 23 and the magnetization direction of the reference layer 21. Therefore, the state that the relative angle is about θ2 can be detected by detecting a resistance value in the direction of ±z of the magnetic tunnel junction section 20. That is, the second data (γ2-state) stored in the magnetization record layer 10 can be read.

Figure 36C:
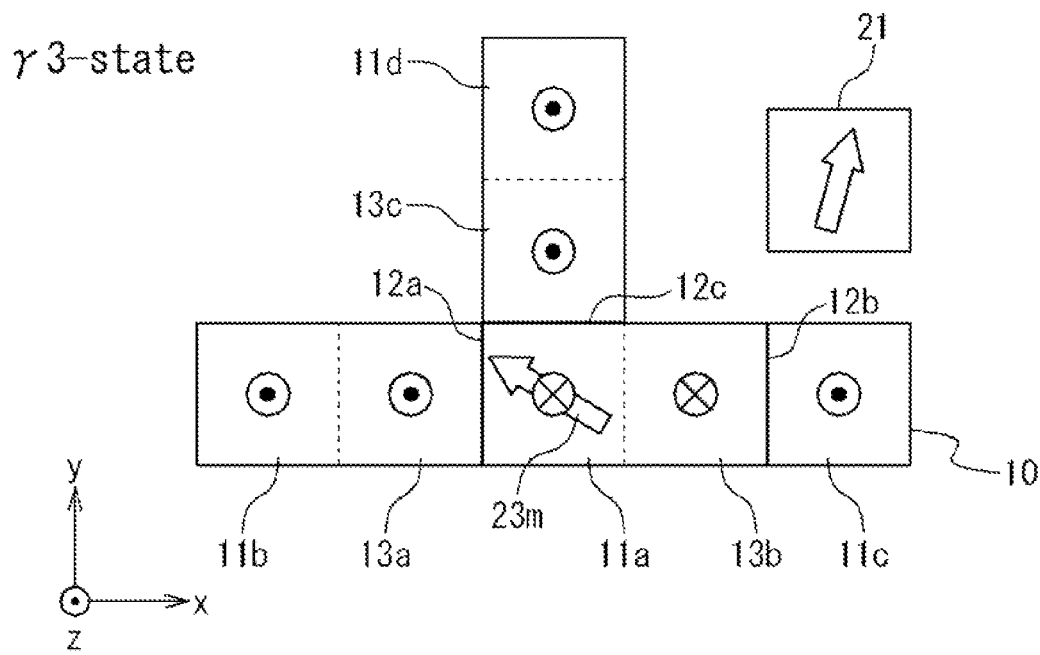
FIG. 36C is a plan view showing the configuration of the magnetic memory device according to the fourth exemplary embodiment of the present invention.

As shown in FIG. 36C, when the magnetization record layer 10 stores the third data, the magnetization direction of the first domain wall motion region 13a is the direction of +z, the magnetization direction of the second domain wall motion region 13b is the direction of −z, and the magnetization direction of the third domain wall motion region 13c is the direction of +z, i.e. (+z, −z, +z). The domain walls 12a, 12b and 12c are formed between the first domain wall motion region 13a and the 0$^{th}$ magnetization fixed region 11a, between the second domain wall motion region 13b and the second magnetization fixed region 11e, and between and the magnetization fixed region 11a and the third domain wall motion region 13c, respectively. At this time, the magnetic field H is generated in the neighborhood of the sensor layer 23 on the lower-side of the magnetization record layer 10 (on the side of −z) to direct to the third direction shifted to the direction of +y by about 30 degrees from the direction of −x. Thus, the direction of the magnetization 23m of the sensor layer 23 is the third direction in the same way. As a result, in the magnetic tunnel junction section 20, the relative angle is about θ3 (FIG. 35) between the direction of the magnetization 23m of the sensor layer 23 and the magnetization direction or the reference layer 21. Therefore, the state that the relative angle is about θ3 can be detected by detecting a resistance value in the direction of ±z of the magnetic tunnel junction section 20. That is, the third data (γ3-state) stored in the magnetization record layer 10 can be read.

Figure 36D:
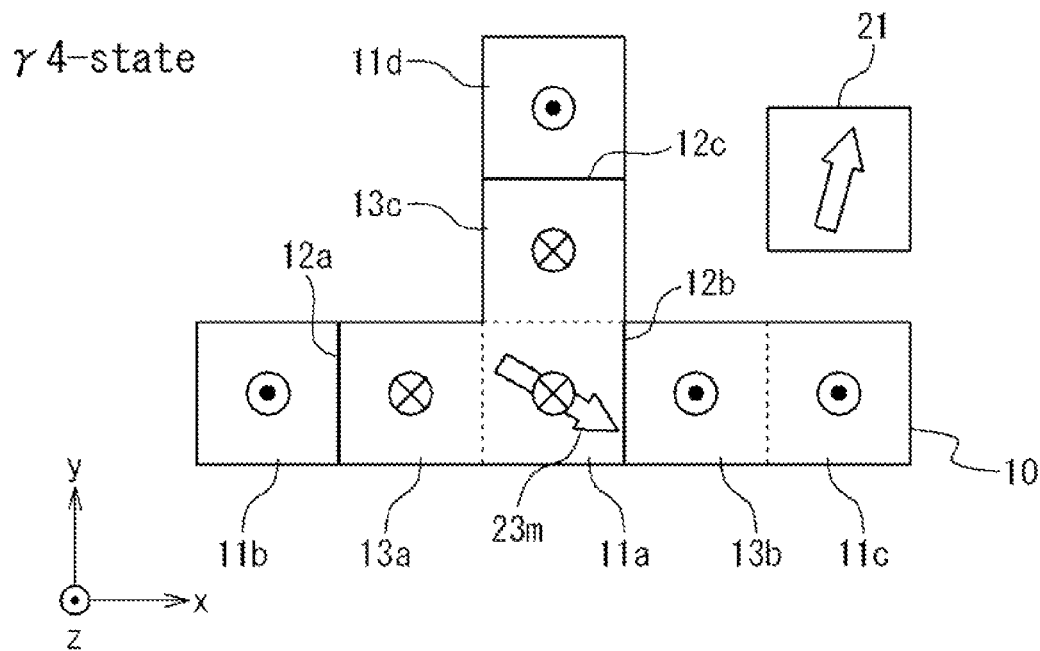
FIG. 36D is a plan view showing the configuration of the magnetic memory device according to the fourth exemplary embodiment of the present invention.

As shown in FIG. 36D, when the magnetization record layer 10 stores fourth data, the magnetization direction of the first domain wall motion region 13a is the direction of −z, the magnetization direction of the second domain wall motion region 13b is the direction of +z, and the magnetization direction of the third domain wall motion region 13c is the direction of −z, i.e. (−z, +z, −z). Thus, the domain walls 12a, 12b and 12c are formed between the first magnetization fixed region 11b and the first domain wall motion region 13a, between the 0$^{th}$ magnetization fixed region 11a and the second domain wall motion region 13b, and between and the third domain wall motion region 13c and the third magnetization fixed region 11d, respectively. At this time, the magnetic field H is generated in the neighborhood of the sensor layer 23 on the lower-side of the magnetization record layer 10 (on the side of −z), to direct to the fourth direction shifted to the direction of −y by about 30 degrees from the direction of +x. Thus, the direction of the magnetization 23m of the sensor layer 23 is the fourth direction in the same way. As a result, the relative angle is about θ4 (FIG. 35) between the direction of the magnetization 23m of the sensor layer 23 and the magnetization direction of the reference layer 21 in the magnetic tunnel junction section 20. Therefore, the state that the relative angle is about θ4 can be detected by detecting a resistance value in the direction of ±z of the magnetic tunnel junction section 20. That is, the fourth data (γ4-state) stored in the magnetization record layer 10 can be read.

Figure 36E:
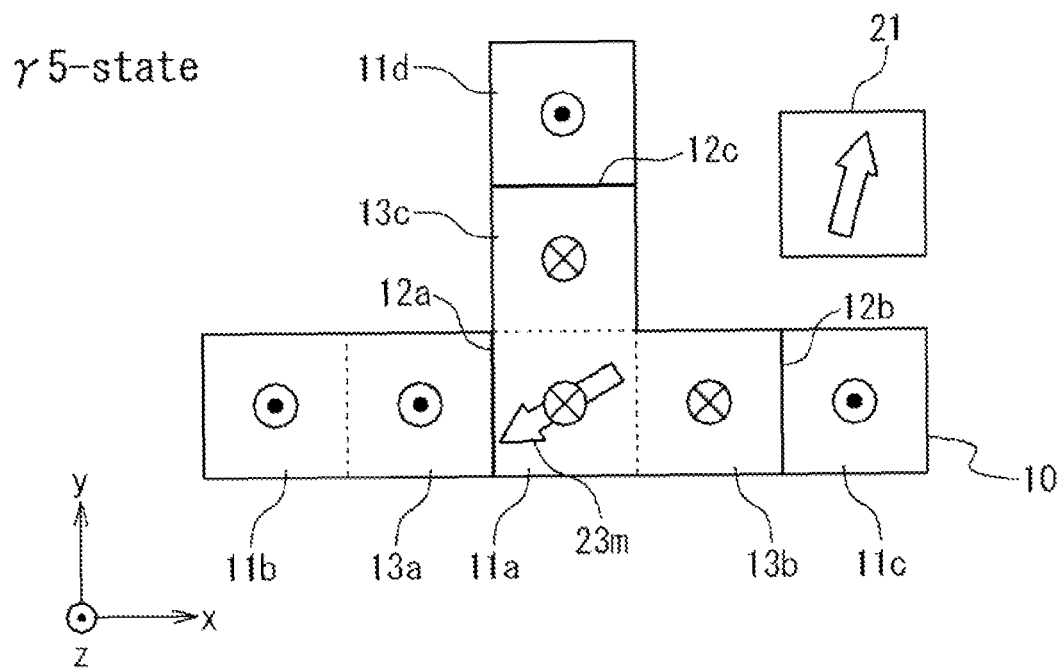
FIG. 36E is a plan view showing the configuration of the magnetic memory device according to the fourth exemplary embodiment of the present invention.

As shown in FIG. 36E, when the magnetization record layer 10 stores the fifth data, the magnetization direction of the first domain wall motion region 13a is the direction of +z, the magnetization direction of the second domain wall motion region 13b is the direction of −z, and the magnetization direction of the third domain wall motion region 13c is the direction of −z, i.e. (+z, −z, −z). Thus, the domain walls 12a, 12b and 12c are formed between the first domain wall motion region 13a and the $0^{th}$ magnetization fixed region 11a, between the second domain wall motion region 13b and the second magnetization fixed region 11c, and between and the third domain wall motion region 13c and the third magnetization fixed region 11d, respectively. At this time, the magnetic field H is generated in the neighborhood of the sensor layer 23 on the lower-side of the magnetization record layer 10 (on the side of −z) to direct to a fifth direction shifted to the direction of −y by about 30 degrees from the direction of −x. The direction of the magnetization 23m of the sensor layer 23 is the fifth direction in the same way. As a result, in the magnetic tunnel junction section 20, the relative angle is about θ5 (FIG. 35) between the direction of the magnetization 23m of the sensor layer 23 and the magnetization direction of the reference layer 21. Therefore, the state that this relative angle is about θ5 can be detected by detecting a resistance value in the direction of ±z of the magnetic tunnel junction section 20. That is, the fifth data (γ5-state) stored in the magnetization record layer 10 can be read.

Figure 36F:
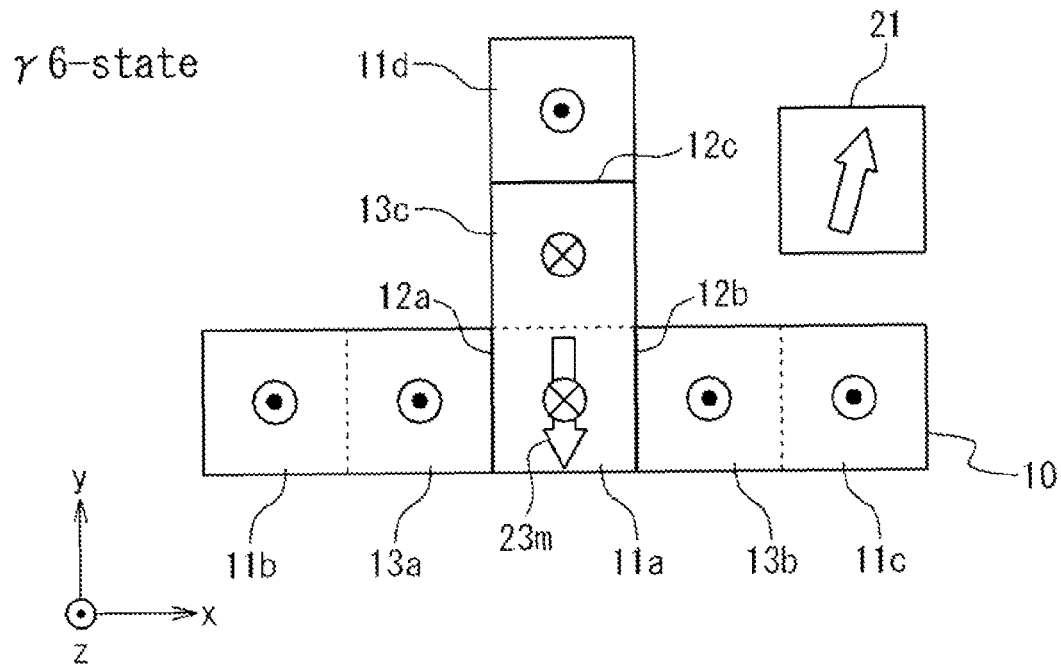
FIG. 36F is a plan view showing the configuration of the magnetic memory device according to the fourth exemplary embodiment of the present invention.

As shown in FIG. 36F, when the magnetization record layer 10 stores the sixth data, the magnetization direction of the first domain wall motion region 13a is the direction of +z, the magnetization direction of the second domain wall motion region 13b is the direction of +z and the magnetization direction of the third domain wall motion region 13c is the direction of −z, i.e. (+z, +z, −z). Thus, the domain walls 12a, 12b and 12c are formed between the first domain wall motion region 13a and the $0^{th}$ magnetization fixed region 11a, between the $0^{th}$ magnetization fixed region 11a and the second domain wall motion region 13b, and between the third domain wall motion region 13c and the third magnetization fixed region 11d, respectively. At this time, the magnetic field H is generated in the neighborhood of the sensor layer 23 on the lower-side of the magnetization record layer 10 (on the side of −z) to direct to a sixth direction as the direction of −y. Thus, the direction of the magnetization 23m of the sensor layer 23 is the sixth direction in the same way. As a result, in the magnetic tunnel junction section 20, the relative angle is about θ6 (FIG. 35) between the direction of the magnetization 23m of the sensor layer 23 and the magnetization direction of the reference layer 21. Therefore, the state that the relative angle is about θ6 can be detected by detecting a resistance value in the direction of ±z of the magnetic tunnel junction section 20. That is, the sixth data (γ6-state) stored in the magnetization record layer 10 can be read.

It should be noted that a relation between a relative angle between magnetization direction of the sensor layer 23 and the magnetization direction of the reference layer 21 and a resistance value of the magnetic tunnel junction section 20 is similar to that of FIG. 26, excluding that the relative angles in γ1-state to γ6-state are θ1 to θ6, respectively. Therefore, the description is omitted.

The magnetic memory device 1 of the present exemplary embodiment is made 6-valued and can store six kinds of data. It should be noted that the magnetization direction of the reference layer 21 is not limited to cases of FIG. 36A to FIG. 36F and may be another magnetization direction if the relative angle of the magnetization direction of the sensor layer 23 and the magnetization direction of the reference layer 30 is of six kinds.

3. Initializing Method of Magnetization Fixed Region

For example, the initializing method of the magnetic memory device according to the fourth exemplary embodiment of the present invention, can be performed as in the first exemplary embodiment (FIG. 6A to FIG. 6C). Therefore, the description is omitted.

4. Write Operation

Next, the data write principle into the magnetic memory device will be described. The data write principle of the present exemplary embodiment is basically same as that of the third exemplary embodiment. That is, a current is supplied to a route such that electrons are supplied from the domain wall motion region for the magnetization to be directed to the direction of +z and the electrons are drawn out from the domain wall motion region for the magnetization to be directed to the direction of −z. According to necessity, a plurality of routes are used. Here, a combination of a write current supply destination and a write current supplying source is different depending on the combinations of the magnetization directions of the first, second and third domain wall motion regions 13a, 13b and 13 in γ1-state to γ6-state. Hereinafter, the data write principle will be described in detail.

FIG. 37A to FIG. 37F are plan views showing the data write principle into the magnetic memory device according to the fourth exemplary embodiment of the present invention. The data write operation is performed by the domain wall motion method using spin transfer. The write current Iw is supplied into not a direction passing through the MTJ (magnetic tunnel junction section 20) but a direction passing through the magnetization record layer 10 in plane to pass through the domain walls 12a, 12b and 12c. The write current Iw is supplied to the magnetization record layer 10 from either of the current supply terminal (not shown) connected with the first magnetization fixed region 11b, the current supply terminal (not shown) connected with the second magnetization fixed region 11c and the current supply terminal (not shown) connected with the third magnetization fixed region 11d.

Figure 37A:
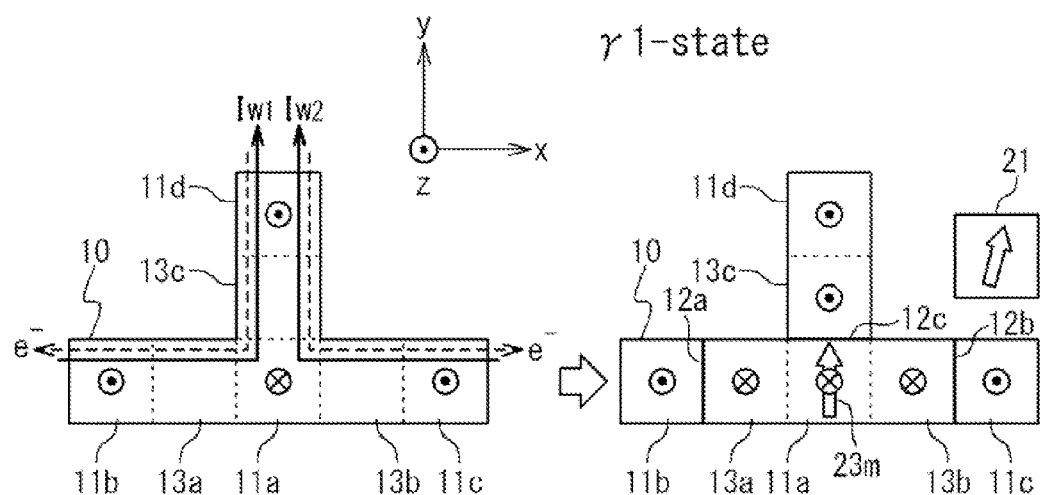
FIG. 37A is a plan view showing the data write principle according to the fourth exemplary embodiment of the present invention.

As shown in the left side of FIG. 37A, in a case of the write operation of the first data (γ1-state), the first write current Iw1 flows from the first magnetization fixed region 11b to the third magnetization fixed region 11d through the first domain wall motion region 13a, the $0^{th}$ magnetization fixed region 11a and the third domain wall motion region 13c in this order (solid line arrow). In addition, the second write current Iw2 flows from the second magnetization fixed region 11c to the third magnetization fixed region 11d through the second domain wall motion region 13b, the $0^{th}$ magnetization fixed region 11a and the third domain wall motion region 13c in this order (solid line arrow). In this case, the motion of electrons e⁻ (broken line arrow) is opposite to the write currents Iw1 and Iw2. As a result, by the spin transfer effect, the magnetization direction of the first domain wall motion region 13a is inverted to the direction of −z, the magnetization direction of the second domain wall motion region 13b is inverted to the direction of −z, and the magnetization direction of the third domain wall motion region 13c is inverted to the direction of +z. The domain wall 12a is moved to the boundary between the first magnetization fixed region 11b and the first domain wall motion region 13a, the domain wall 12b is moved to the boundary between the second domain wall motion region 13b and the second magnetization fixed region 11c, and the domain wall 12c is moved to the boundary between the third domain wall motion region 13c and the $0^{th}$ magnetization fixed region 11a. In this way, the first data (γ1-state) is written in as shown in the right side of FIG. 37A.

Figure 37B:
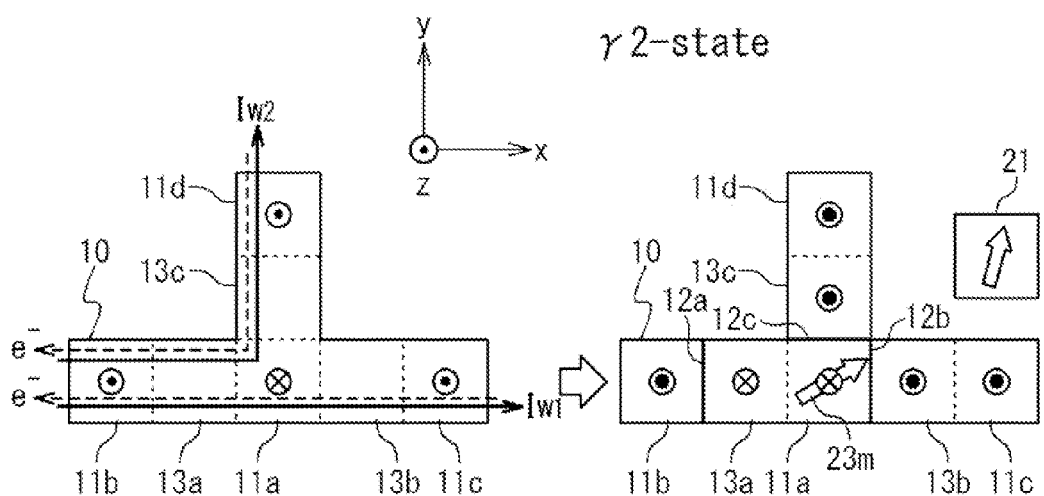
FIG. 37B is a plan view showing the data write principle according to the fourth exemplary embodiment of the present invention.

As shown in the left side of FIG. 37B, in a case of the write operation of the second data (γ2-state), the first write current Iw1 flows from the first magnetization fixed region 11b to the second magnetization fixed region Ile through the first domain wall motion region 13a, the $0^{th}$ magnetization fixed region 11a and the second domain wall motion region 13b in this order (solid line arrow). In addition, the second write current Iw2 flows from the first magnetization fixed region 11b to the third magnetization fixed region 11d through the first domain wall motion region 13a, the $0^{th}$ magnetization fixed region 11a, and the third domain wall motion region 13c in this order (solid line arrow). In this case, the motion of electrons e⁻ (broken line arrow) is opposite to that of the write currents Iw1 and Iw2. As a result, by the spin transfer effect, the magnetization direction of the first domain wall motion region 13a is inverted to the direction of −z, the magnetization direction of the second domain wall motion region 13b is inverted to the direction of +z and the magnetization direction of the third domain wall motion region 13c is inverted to the direction of +z. The domain wall 12a is moved to the boundary between the first magnetization fixed region 11b and the first domain wall motion region 13a, the domain wall 12b is moved to the boundary between the $0^{th}$ magnetization fixed region 11a and the second domain wall motion region 13b, and the domain wall 12c is moved to the boundary between the third domain wall motion region 13c and the $0^{th}$ magnetization fixed region 11a. In this way, the second data (γ2-state) is written as shown in the right side of FIG. 37B.

Figure 37C:
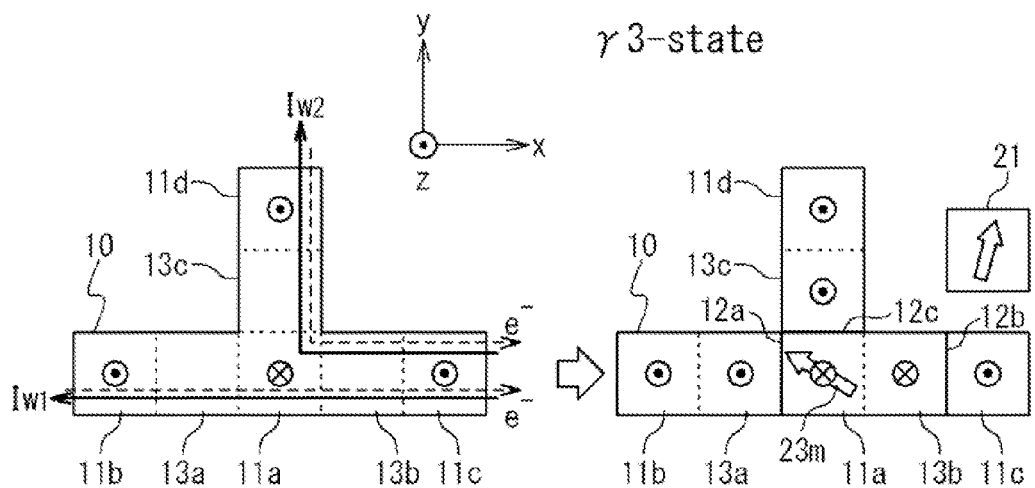
FIG. 37C is a plan view showing the data write principle according to the fourth exemplary embodiment of the present invention.

As shown in the left side of FIG. 37C, in a case of the write operation of the third data (γ3-state), the first write current Iw1 flows from the second magnetization fixed region 11c to the first magnetization fixed region 11b through the second domain wall motion region 13b, the $0^{th}$ magnetization fixed region 11a and the first domain wall motion region 13a in this order (solid line arrow). In addition, the second write current Iw2 flows from the second magnetization fixed region 11c to the third magnetization fixed region 11d through the second domain wall motion region 13b, the $0^{th}$ magnetization fixed region 11a and the third domain wall motion region 13c in this order (solid line arrow). In this case, the motion of electrons e⁻ (broken line arrow) is opposite to the direction of the write currents Iw1 and Iw2. As a result, by the spin transfer effect, the magnetization direction of the first domain wall motion region 13a is inverted to the direction of +z, the magnetization direction of the second domain wall motion region 13b is inverted to the direction of −z and the magnetization direction of the third domain wall motion region 13c is inverted to the direction of +z. The domain wall 12a is moved to the boundary between then the first domain wall motion region 13a and the $0^{th}$ magnetization fixed region 11a, the domain wall 12b is moved to the boundary between the second domain wall motion region 13b and the second magnetization fixed region 11e, and the domain wall 12c is moved to the boundary between the third domain wall motion region 13c and the $0^{th}$ magnetization fixed region 11a. In this way, the third data (γ3-state) is written as shown in the right side of FIG. 37C.

Figure 37D:
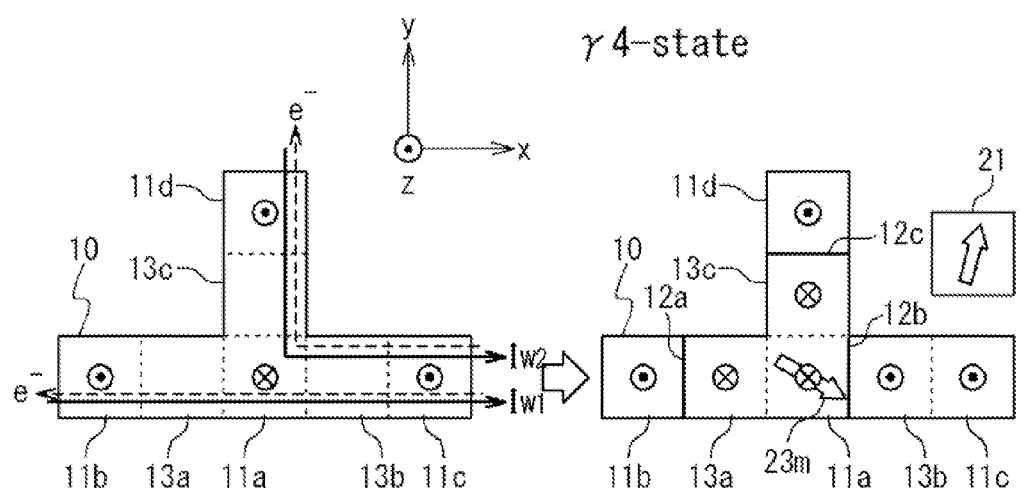
FIG. 37D is a plan view showing the data write principle according to the fourth exemplary embodiment of the present invention.

As shown in the left side of FIG. 37D, in a case of the write operation of the fourth data (γ4-state), the first write current Iw1 flows from the first magnetization fixed region 11b to the second magnetization fixed region 11c through the first domain wall motion region 13a, the $0^{th}$ magnetization fixed region 11a, and the second domain wall motion region 13b in this order (solid line arrow). In addition, the second write current Iw2 flows from the third magnetization fixed region 11d to the second magnetization fixed region 11c through the third domain wall motion region 13c, the $0^{th}$ magnetization fixed region 11a and the second domain wall motion region 13b in this order (solid line arrow). In this case, the motion of electrons e⁻ (broken line arrow) is opposite to the direction of the write currents Iw1 and Iw2. As a result, by the spin transfer effect, the magnetization direction of the first domain wall motion region 13a is inverted to the direction of −z, the magnetization direction of the second domain wall motion region 13b is inverted to the direction of and the magnetization direction of the third domain wall motion region 13c is inverted to the direction of −z. The domain wall 12a is moved to the boundary between then the first magnetization fixed region 11b and the first domain wall motion region 13a, the domain wall 12b is moved to the boundary between the $0^{th}$ magnetization fixed region 11a and the second domain wall motion region 13b, and the domain wall 12c is moved to the boundary between the third magnetization fixed region 11d and the third domain wall motion region 13c. In this way, the fourth data (γ4-state) is written as shown in the right side of FIG. 37D.

Figure 37E:
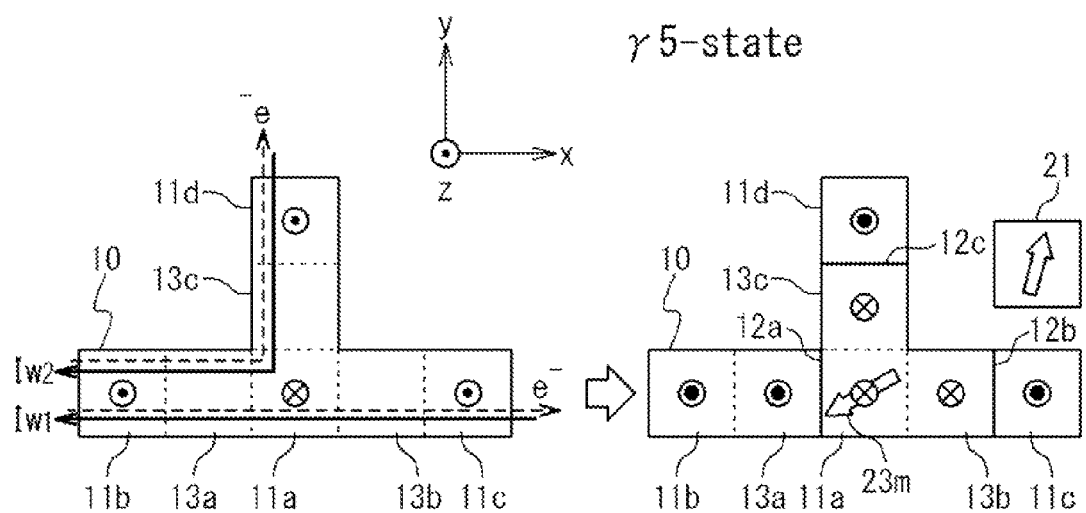
FIG. 37E is a plan view showing the data write principle according to the fourth exemplary embodiment of the present invention.

As shown in the left side of FIG. 37E, in a case of write operation of the fifth data (γ5-state), the first write current Iw1 flows from the second magnetization fixed region 11c to the first magnetization fixed region 11b through the second domain wall motion region 13b, the $0^{th}$ magnetization fixed region 11a and the first domain wall motion region 13a in this order (solid line arrow). In addition, the second write current Iw2 flows from the third magnetization fixed region 11d to the first magnetization fixed region 11b through the third domain wall motion region 13c, the $0^{th}$ magnetization fixed region 11a and the first domain wall motion region 13a in this order (solid line arrow). In this case, the motion of electrons e⁻ (broken line arrow) is opposite to that of the write currents Iw1 and Iw2. As a result, by the spin transfer effect, the magnetization direction of the first domain wall motion region 13a is inverted to the direction of +z. The magnetization direction of the second domain wall motion region 13b is inverted to the direction of −z and the magnetization direction of the third domain wall motion region 13c is inverted to the direction of −z. The domain wall 12a is moved to the boundary between then the first domain wall motion region 13a and the $0^{th}$ magnetization fixed region 11a, the domain wall 12b is moved to the boundary between the second domain wall motion region 13b and the second magnetization fixed region 11c, and the domain wall 12c is moved to the boundary between the third magnetization fixed region 11d and the third domain wall motion region 13c. In this way, the fifth data (γ5-state) is written as shown in the right side of FIG. 37E.

Figure 37F:
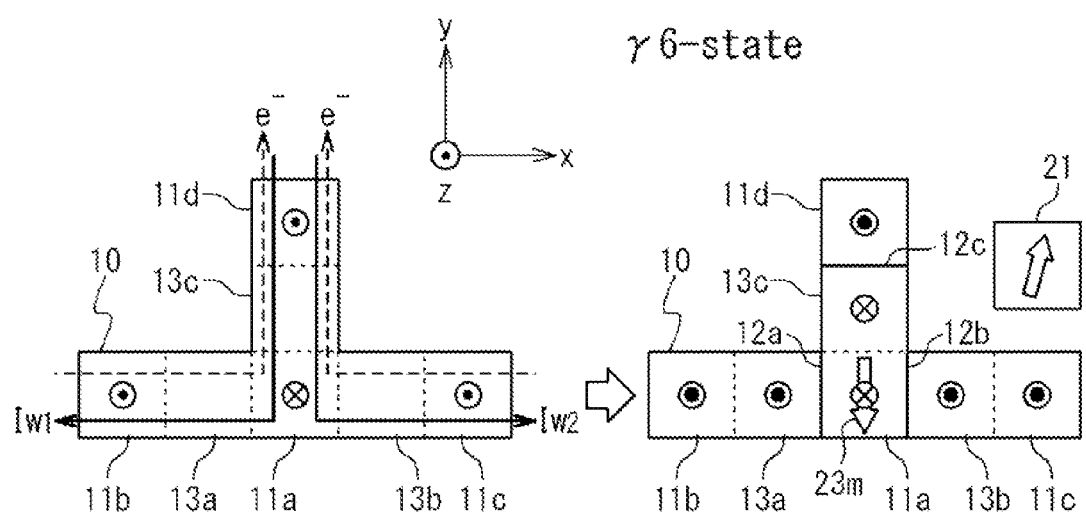
FIG. 37F is a plan view showing the data write principle according to the fourth exemplary embodiment of the present invention.

As shown in the left side of FIG. 37F, in a case of write operation of the sixth data (γ6-state), the first write current Iw1 flows from the third magnetization fixed region 11d to the first magnetization fixed region 11b through the third domain wall motion region 13c, the $0^{th}$ magnetization fixed region 11a and the first domain wall motion region 13a in this order (solid line arrow). In addition, the second write current Iw2 flows from the third magnetization fixed region 11d to the second magnetization fixed region 11c through the third domain wall motion region 13c, the $0^{th}$ magnetization fixed region 11a and the second domain wall motion region 13b in this order (solid line arrow). In this case, the motion of electrons e⁻ (broken line arrow) is opposite to that of the write currents Iw1 and Iw2. As a result, by the spin transfer effect, the magnetization direction of the first domain wall motion region 13a is inverted to the direction of +z, the magnetization direction of the second domain wall motion region 13b is inverted to the direction of +z, and the magnetization direction of the third domain wall motion region 13c is inverted to the direction of −z. The domain wall 11a is moved to the boundary between then the first domain wall motion region 13a and the 0th magnetization fixed region 11a, the domain wall 12b is moved to the boundary between the 0th magnetization fixed region 11a and the second domain wall motion region 13b, and the domain wall 12c to the boundary between the third magnetization fixed region 11d and the third domain wall motion region 13c. In this way, the sixth data (γ6-state) is written as shown in the right side of FIG. 37F.

In this method, the write currents Iw1 and Iw2 which flow through the magnetization record layer 10 in plane invert the magnetization directions of the first domain wall motion region 13a to the third domain wall motion region 13c. The first data to the sixth data are written and stored according to combinations of the magnetization directions. At this time, the magnetization fixed regions which are on both sides of each domain wall motion region have the magnetization directions anti-parallel to each other and function as different supply sources of the spin electrons to the domain wall motion region. It should be noted that when each domain wall 12 is initially present in a position after the write operation, the state is maintained regardless of the injection of spin electrons e⁻. Therefore, over-write is possible. Also, in any case of FIG. 37A to FIG. 37F, the first write current Iw1 and the second write current Iw2 may flow at the same time, or different times, and may be opposite in the order. Also, the write currents Iw1 and Iw2 may flow wherever later if passing through the domain walls 12a and 12b.

5. Read Operation

The data read principle from the magnetic memory device according to the fourth exemplary embodiment of the present invention is the same as the first exemplary embodiment, excluding that the relative angles θ1-θ6 in a range shown in FIG. 26 are used. Therefore, the description is omitted.

6. Configuration and Operation of Magnetic Memory Cell and MRAM

The configuration and operation of the magnetic memory cell and MRAM according to the fourth exemplary embodiment of the present invention is the same as those of the third exemplary embodiment. Therefore, the description is omitted.

7. Position of Sensor Layer,
8. Domain Wall Stopping Method,
9. Magnetization Fixing Method,
10. Anisotropy of Sensor Layer The position of the sensor layer, the domain wall stopping method, the magnetization fixing method, and the anisotropy of the sensor layer in the magnetic memory device according to the fourth exemplary embodiment of the present invention are same as those of the first exemplary embodiment. Therefore, the description is omitted.

As described above, the same effect as in the third exemplary embodiment can be attained in the present exemplary embodiment. That is, in the MRAM of the current drive domain wall motion type in which the magnetic anisotropy of the magnetization record layer is of a perpendicular direction, the magnetization fixed region can be easily formed, the data read operation is performed in a high reliability and it is easy to provide the pinning site of the domain wall. In addition, the magnetization record layer can be made multi-valued to store six kinds of data and it is possible to increases a data amount per unit area in the semiconductor chip.

Fifth Exemplary Embodiment

In a fifth exemplary embodiment, the magnetic memory cell and MRAM in a case of N=4 will be described.

1. Basic Configuration of Magnetic Memory Device

Figure 38A:
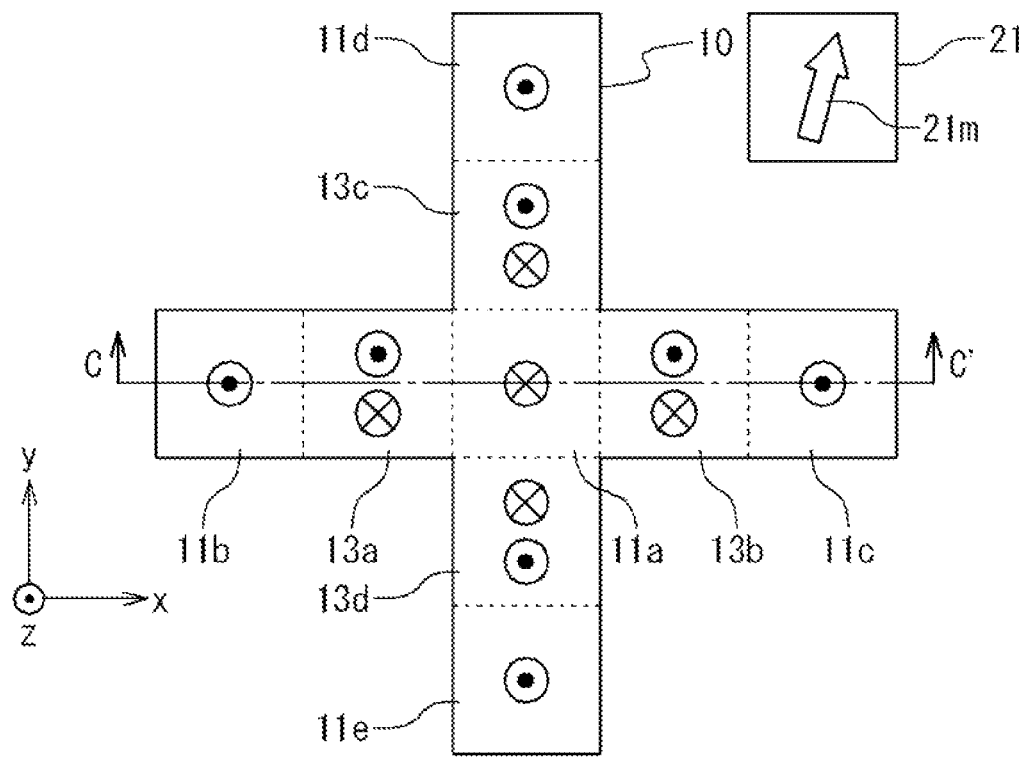
FIG. 38A is a plan view showing the configuration of the magnetization record layer according to fifth and sixth exemplary embodiments of the present invention.
Figure 38B:
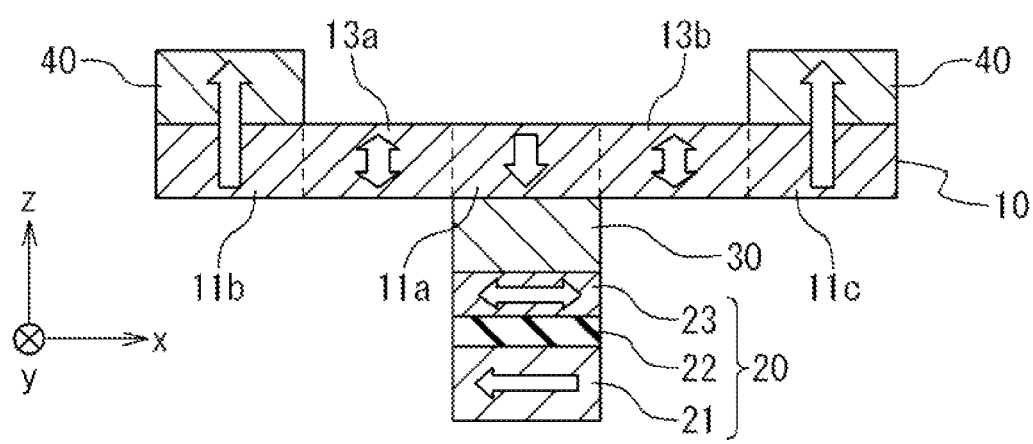
FIG. 38B is a sectional view showing the configuration of the magnetic memory device according to the fifth and sixth exemplary embodiments of the present invention.

FIG. 38A is a plan view showing an example of the configuration of the magnetization record layer of the magnetic memory device according to the fifth exemplary embodiment of the present invention. FIG. 38B is a sectional view showing an example of the configuration of the magnetic memory device according to the fifth exemplary embodiment of the present invention. Here, FIG. 38B is the sectional view along the line CC' of FIG. 38A.

The magnetic memory device 1 of the present exemplary embodiment is provided with the magnetization record layer 10 and the magnetic tunnel junction section 20. Here, the present exemplary embodiment differs from the first exemplary embodiment in that the number of domain wall motion regions extending from the 0th magnetization fixed region 11a and the magnetization fixed regions connected with the domain wall motion regions is four (N=4).

The description is omitted because the magnetic tunnel junction section 20 is the same as in the first exemplary embodiment.

The magnetization record layer 10 is provided with the 0th magnetization fixed region 11a, the first magnetization fixed region 11b, the second magnetization fixed region 11c, the third magnetization fixed region 11d, the fourth magnetization fixed region 11e, the first domain wall motion region 13a, the second domain wall motion region 13b, the third domain wall motion region 13c, and the fourth domain wall motion region 13d. The first domain wall motion region 13a to the fourth domain wall motion region 13d are connected with the side surfaces of the 0th magnetization fixed region 11a, respectively. Moreover, the first magnetization fixed region 11b to the fourth magnetization fixed region 11c are connected with the outer sides of the first domain wall motion region 13a to the fourth domain wall motion region 13d, respectively. When the shape of the xy section of the 0th magnetization fixed region 11a is substantially square, the magnetic recording layer 10 has a rotational symmetry to the 0th magnetization fixed region 11a.

The 0th magnetization fixed region 11a to the fourth magnetization fixed region 11c are ferromagnetic regions having perpendicular magnetic anisotropy and the fixed magnetization directions. The magnetization directions of the first magnetization fixed region 11b to the fourth magnetization fixed region 11e are substantially identical and the magnetization direction of the 0th magnetization fixed region 11a is opposite to them. That is, the magnetization directions of the first magnetization fixed region 11b to the fourth magnetization fixed region 11e are fixed to the parallel direction to each other. The magnetization directions of the first magnetization fixed region 11b to the fourth magnetization fixed region 11e and the 0th magnetization fixed region 11a are fixed on the anti-parallel direction to each other. It should be noted that the magnetization directions of the first magnetization fixed region 11b to the fourth magnetization fixed region 11e and the magnetization direction of and the 0th magnetization fixed region 11a are sufficient if the function to generate the domain walls 12a, 12b, 12c and 12d can be accomplished and do not means in the strict meaning that these directions are identical or opposition to each other. Also, in an example of this figure, the magnetization directions of the first magnetization fixed region 11b to the fourth magnetization fixed region 11c are the direction of +z, and the magnetization direction of the 0th magnetization fixed region 11a is the direction of −z. These magnetization directions may be opposite.

It is desirable that the first magnetization fixed region 11b to the fourth magnetization fixed region 11c are substantially identically formed. The reason is in that it is the easiest to form identically from the viewpoint of the manufacturing process, and the high symmetric property is desirable in the view of the stability and the reliability, for the write operation and the data retention to be mentioned later. Here, the phrase of "substantially identical" is used in the meaning that the shape and material are identical in a range of variation on the manufacturing process, including a film thickness. In this case, the magnetization fixing method, too, is identical, as described later.

The first hard layers 40 are formed neighboring to the first magnetization fixed region 11b to the fourth magnetization fixed region 11c, respectively. The first hard layers 40 enhance the coercive forces of the first magnetization fixed region 11b to the fourth magnetization fixed region 11e larger effectively, as compared with the coercive forces of the $0^{th}$ magnetization fixed region 11a and the first domain wall motion region 11a to the fourth domain wall motion region 13d, to facilitate the initialization. When the first hard layers 40 are provided, it is desirable in the above-mentioned meaning that the magnetization fixed portions which includes the first hard layer 40 are substantially identical in each of: a set of the first magnetization fixed region 11b and the first hard layers 40, a set of the second magnetization fixed region 11c and the first hard layers 40, a set of the third magnetization fixed region 11d and the first hard layers 40, and a set of the fourth magnetization fixed regions 11c and the first hard layers 40.

The first domain wall motion region 13a to the fourth domain wall motion region 13d are ferromagnetic regions which have an invertible magnetization, in which the domain wall is movable, and which have perpendicular magnetic anisotropy. Therefore, the magnetization directions of the first domain wall motion region 13a to the fourth domain wall motion region 13d can take $2^4$ (=16) combinations. In the present exemplary embodiment, of these combinations, the following eight combinations of the magnetization directions are used according to storage data: (+z, −z, *, *), (+z, −z, +z, −z), (+z, −z, −z, +z), (*, *, +z, −z), (*, *, −z, +z), (−z, +z, +z, +z, −z, +z), and (−z, +z, *, *). Here, "*" shows that the direction may be +z or −z but are same. Hereinafter, this is applied in this description.

Figure 39:
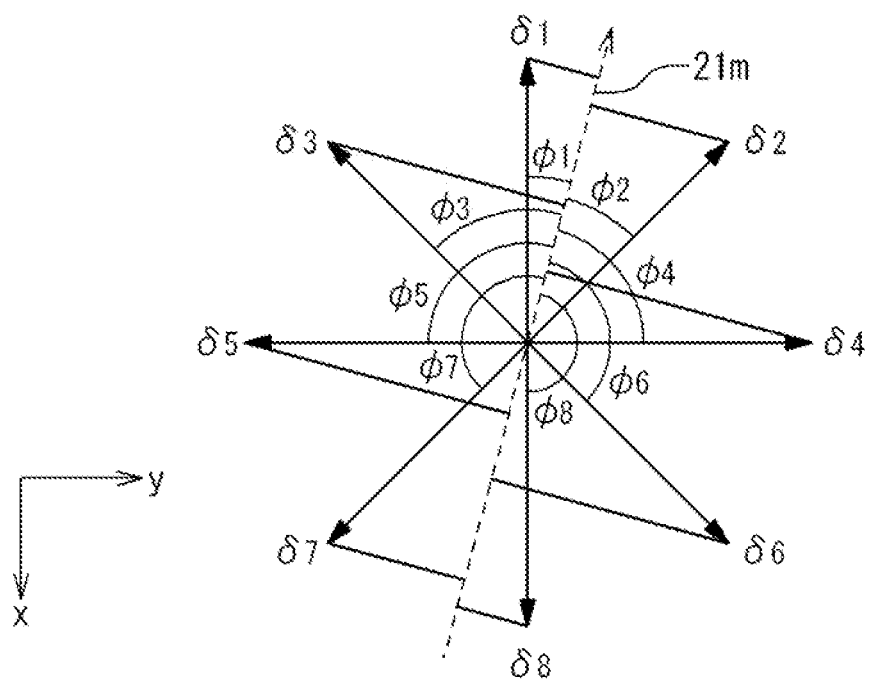
FIG. 39 is a conceptual diagram showing a relation between the magnetization direction of the reference layer and the direction of the synthetic magnetic field of the domain wall motion regions according to the fifth exemplary embodiment of the present invention.

The above-mentioned magnetic tunnel junction section 20 is provided in the neighborhood of the $0^{th}$ magnetization fixed region 11a. Here, in the present exemplary embodiment, the magnetization direction of the reference layer 21 of the magnetic tunnel junction section 20 takes a direction which is shifted slightly from the direction of −x, in order to improve a multi-valued function. FIG. 39 is a conceptual diagram showing relation between the magnetization direction of the reference layer and the direction of the synthetic magnetic field by the domain wall motion regions in the fifth exemplary embodiment of the present invention. The magnetic recording layer 10 can take eight kinds of states of δ1-state to δ8-state, as mentioned later. At this time, the direction of the synthetic magnetic field of the first domain wall motion region 13a to the fourth domain wall motion region 13d is any of eight kinds of directions (solid line arrows of δ1 to δ8). Therefore, the magnetization direction of the sensor layer 23 of the magnetic tunnel junction section 20 is any of these eight kinds of directions. Here, the direction of the magnetization 21m (broken line arrow) of the reference layer 21 is set to a direction shifted slightly (by about φ1) from the −x direction. Thus, it is possible to set the eight kinds of relative angles φ1 to φ8 (φ1<φ2<φ3<φ4<φ5<φ6<φ7<φ8) between the direction of the magnetization direction 21m of the reference layer 21 and the magnetization direction of the sensor layer 23 (δ1 to δ8). Therefore, by assigning eight kinds of data to the eight kinds of relative angles, the magnetic memory device in the present exemplary embodiment can be made multi-valued or octal-valued, as shown in FIG. 26.

The other portion of the configuration of the magnetic memory device 1 is the same as that of the fourth exemplary embodiment, and therefore the description is omitted.

2. Storage State of Data

FIG. 40A to FIG. 40H are plan views showing an example of the configuration of the magnetic memory device according to the fifth exemplary embodiment of the present invention. In the present exemplary embodiment, the magnetization record layer 10 retains data by the mutual relation of the magnetization directions of the domain wall motion regions. The magnetic memory device 1 of the present exemplary embodiment can take eight states and can store eight kinds of data. Here, it is supposed that the shape of the $0^{th}$ magnetization fixed region 11a is square. For example, FIG. 40A to FIG. 40H show a state when the first data is stored (δ1-state) to the state when the eighth data is stored (δ8-state), respectively. The eight kinds of data may be optional data.

Figure 40A:
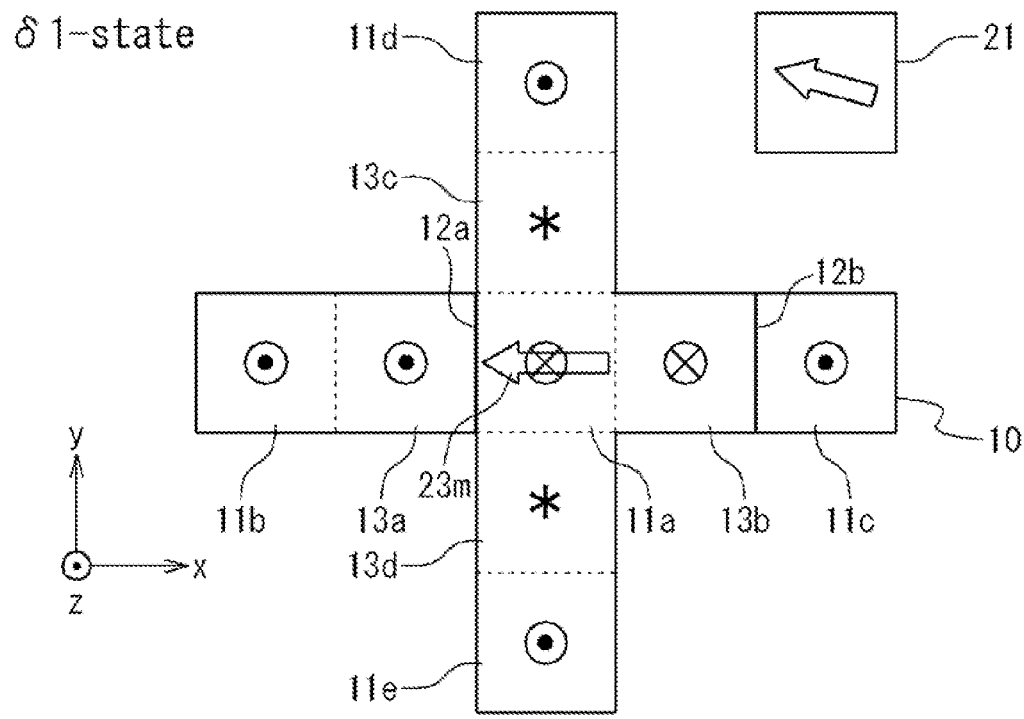
FIG. 40A is a plan view showing the configuration of the magnetic memory device according to the fifth exemplary embodiment of the present invention.

As shown in FIG. 40A, when the magnetization record layer 10 stores the first data, the magnetization directions of the first domain wall motion region 13a to the fourth domain wall motion region 13d are the direction of +z to the −z direction, the direction of *, the direction of *, respectively, i.e. (+z, −z, *, *). Thus, the domain wall 12a and 12b are formed between the first domain wall motion region 13a and the $0^{th}$ magnetization fixed region 11a and between the second domain wall motion region 13b and the second magnetization fixed region 11c, respectively. Here, for example, supposing that the direction of * is the direction of −z, the domain wall 12c and 12d (not shown) are formed between the third magnetization fixed region 11d and the third domain wall motion region 13c and between and fourth magnetization fixed region 11e and the fourth domain wall motion region 13d, respectively. At this time, the magnetic field H is generated in the neighborhood of the sensor layer 23 on the lower-side of the magnetization record layer 10 (on the side of −z) to direct to the first direction as the direction of −x. Thus, the direction of the magnetization 23m of the sensor layer 23 is the first direction in the same way. As a result, the relative angle is about φ1 (FIG. 39) between the direction of the magnetization 23m attic sensor layer 23 and the magnetization direction of the reference layer 21 in the magnetic tunnel junction section 20. Therefore, the state that the relative angle is about φ1 can be detected by detecting a resistance value in the direction of ±z of the magnetic tunnel junction section 20. That is, the first data (δ1-state) stored in the magnetization record layer 10 can be read.

Figure 40B:
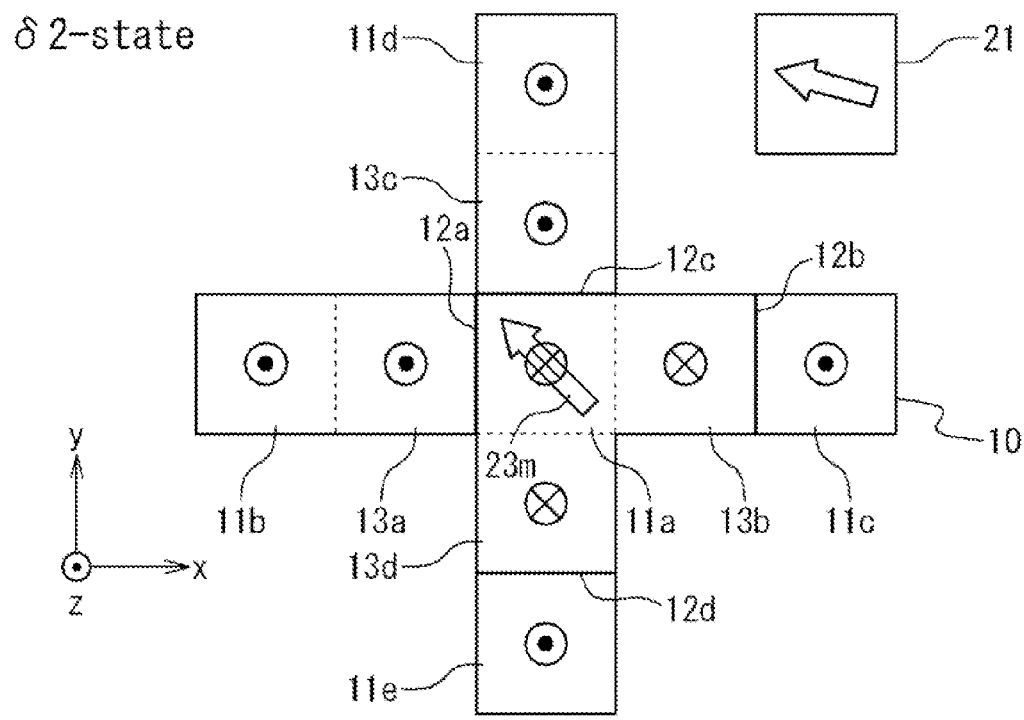
FIG. 40B is a plan view showing the configuration of the magnetic memory device according to the fifth exemplary embodiment of the present invention.

As shown in FIG. 40B, when the magnetization record layer 10 stores the second data, the magnetization directions of the first domain wall motion region 13a to the fourth domain wall motion region 13d are the direction of +z, the direction of −z, the direction of +z, and the direction of −z, respectively, i.e. (+z, −z, +z, −z). Thus, the domain walls 12a, 12b, 12c and 12d are formed between the first domain wall motion region 13a and the $0^{th}$ magnetization fixed region 11a, between the second domain wall motion region 13b and the second magnetization fixed region 11c, between the $0^{th}$ magnetization fixed region 11a and the third domain wall motion region 13c, and between and the fourth domain wall motion region 13d and fourth magnetization fixed region 11c, respectively. At this time, the magnetic field H is generated in the neighborhood of the sensor layer 23 on the lower-side of the magnetization record layer 10 (on the side of −z) to direct to the second direction shifted to the direction of +y by about 45 degrees from the direction of −x. Thus, the direction of the magnetization 23m of the sensor layer 23 is the second direction in the same way. As a result, in the magnetic tunnel junction section 20, the relative angle is about φ2 (FIG. 39) between the direction of the magnetization 23m of the sensor layer 23 and the magnetization direction of the reference layer 21. Therefore, the state that the relative angle is about φ2 can be detected by detecting a resistance value in the direction of ±z of the magnetic tunnel junction section 20. That is, the second data (δ2-state) stored in the magnetization record layer 10 can be read.

Figure 40C:
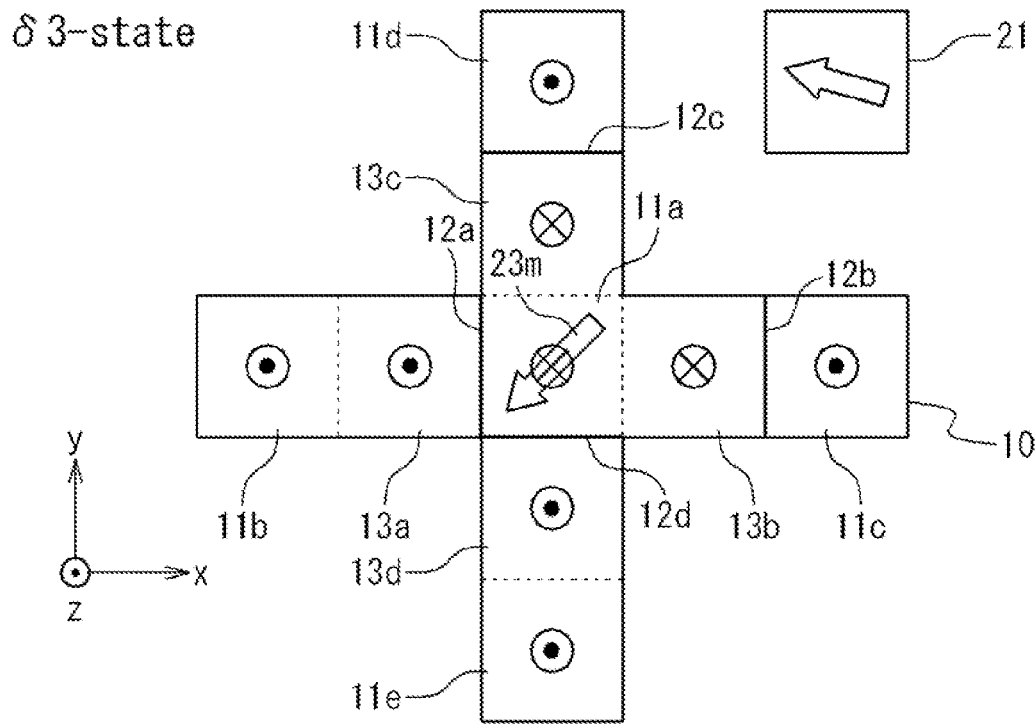
FIG. 40C is a plan view showing the configuration of the magnetic memory device according to the fifth exemplary embodiment of the present invention.

As shown in FIG. 40C, when the magnetization record layer 10 stores the third data, the magnetization directions of the first domain wall motion region 13a to the fourth domain wall motion region 13d are the direction of +z, the direction of −z to the direction of −z, the direction of +z, respectively, i.e. (+z, −z, −z, +z). The domain walls 12a, 12b, 12c and 12d are formed between the first domain wall motion region 13a and the 0$^{th}$ magnetization fixed region 11a, between the second domain wall motion region 13b and the second magnetization fixed region 11e, between the third magnetization fixed region 11d and the third domain wall motion region 13c and between the fourth domain wall motion region 13d and the 0$^{th}$ magnetization fixed region 11a, respectively. At this time, the magnetic field H is generated in the neighborhood of the sensor layer 23 on the lower-side of the magnetization record layer 10 (on the side of −z) to direct to the third direction shifted to the direction of −y by about 45 degrees from the direction of −x. Thus, the direction of the magnetization 23m of the sensor layer 23 is the third direction in the same way. As a result, in the magnetic tunnel junction section 20, the relative angle is about φ3 (FIG. 39) between the direction of the magnetization 23m of the sensor layer 23 and the magnetization direction of the reference layer 21. Therefore, the state that the relative angle is about φ3 can be detected by detecting a resistance value in the direction of ±z of the magnetic tunnel junction section 20. That is, the third data (δ3-state) stored in the magnetization record layer 10 can be read.

Figure 40D:
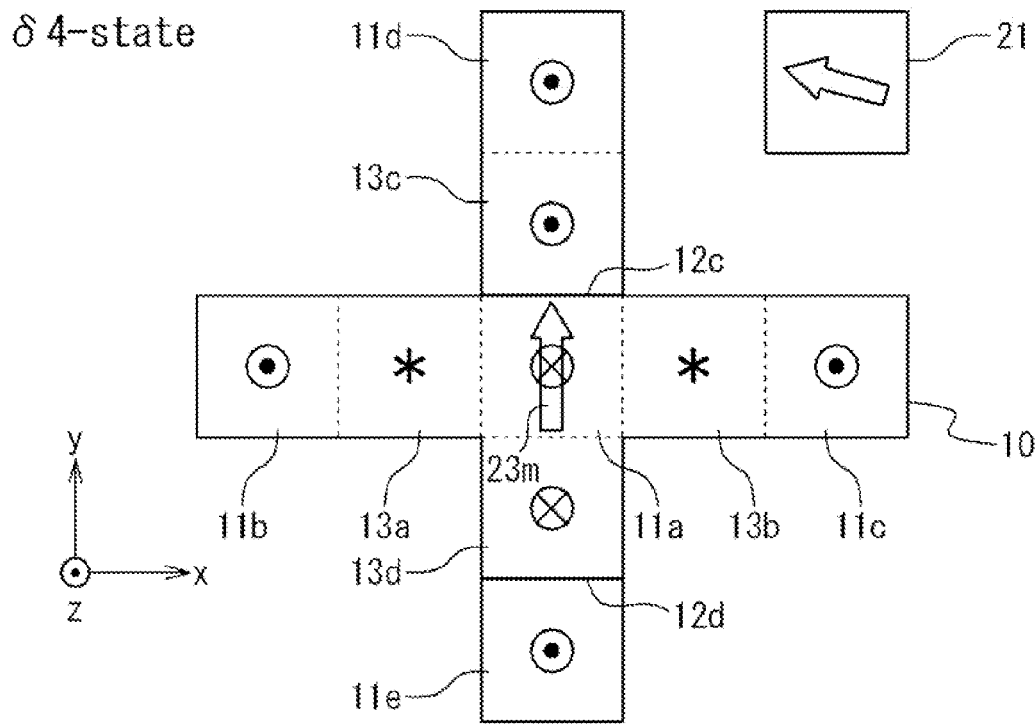
FIG. 40D is a plan view showing the configuration of the magnetic memory device according to the fifth exemplary embodiment of the present invention.

As shown in FIG. 40D, when the magnetization record layer 10 stores the fourth data, the magnetization directions of the first domain wall motion region 13a to the fourth domain wall motion region 13d are the direction of *, the direction of *, the direction of +z to the direction of −z, respectively, i.e. (*, *, +z, −z). Thus, the domain walls 12c and 12d are formed between the third domain wall motion region 13c and the 0$^{th}$ magnetization fixed region 11a and between the fourth domain wall motion region 13d and fourth magnetization fixed region 11c, respectively. Here, for example, supposing that the direction of * is the direction of −z, the domain walls 12a and 12b (not shown) are formed between the first magnetization fixed region 11b and the first domain wall motion region 13a and between the second magnetization fixed region 11c and the second domain wall motion region 13b, respectively. At this time, the magnetic field H is generated in the neighborhood of the sensor layer 23 on the lower-side of the magnetization record layer 10 (on the side of −z) to direct to the fourth direction as the direction of +y. Thus, the direction of the magnetization 23m of the sensor layer 23 is the fourth direction in the same way. That is, the data stored in the magnetization record layer 10 is reflected in the sensor layer 23. As a result, in the magnetic tunnel junction section 20, the relative angle is about φ4 (FIG. 39) between the direction of the magnetization 23m of the sensor layer 23 and the magnetization direction of the reference layer 21. Therefore, the state that the relative angle is about φ4 can be detected by detecting a resistance value in the direction of ±z of the magnetic tunnel junction section 20. That is, the fourth data (δ4-state) stored in the magnetization record layer 10 can be read.

Figure 40E:
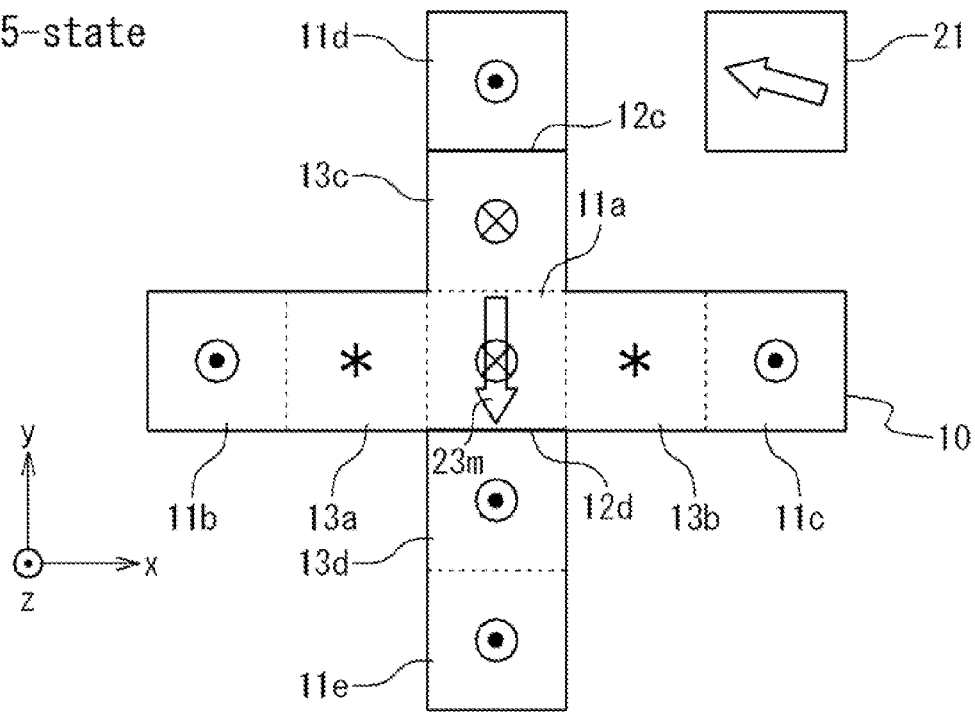
FIG. 40E is a plan view showing the configuration of the magnetic memory device according to the fifth exemplary embodiment of the present invention.

As shown in FIG. 40E, when the magnetization record layer 10 stores the fifth data, the magnetization directions of the first domain wall motion region 13a to the fourth domain wall motion region 13d are the direction of *, the direction of *, the direction of −z, and the direction of +z, respectively, i.e. (*, *, −z, +z). Thus, the domain walls 12c and 12d are formed between the third magnetization fixed region 11d and the third domain wall motion region 13c and between the 0$^{th}$ magnetization fixed region 11a and the fourth domain wall motion region 13d, respectively. Here, for example, supposing that the direction of * is the direction −z, the domain walls 11a and 12b (not shown) are formed between the first magnetization fixed region 11b and the first domain wall motion region 13a, and between the second magnetization fixed region 11c and the second domain wall motion region 13b, respectively. At this time, the magnetic field H is generated in the neighborhood of the sensor layer 23 on the lower-side of the magnetization record layer 10 (on the side of −z) to direct to the fifth direction as the direction of −y. Thus, the direction of the magnetization 23m of the sensor layer 23 is the fifth direction in the same way. As a result, in the magnetic tunnel junction section 20, the relative angle is about φ5 (FIG. 39) between the direction of the magnetization 23m of the sensor layer 23 and the magnetization direction of the reference layer 21. Therefore, the state that the relative angle is about φ5 can be detected by detecting a resistance value in the direction of ±z of the magnetic tunnel junction section 20. That is, the fifth data (δ5-state) stored in the magnetization record layer 10 can be read.

Figure 40F:
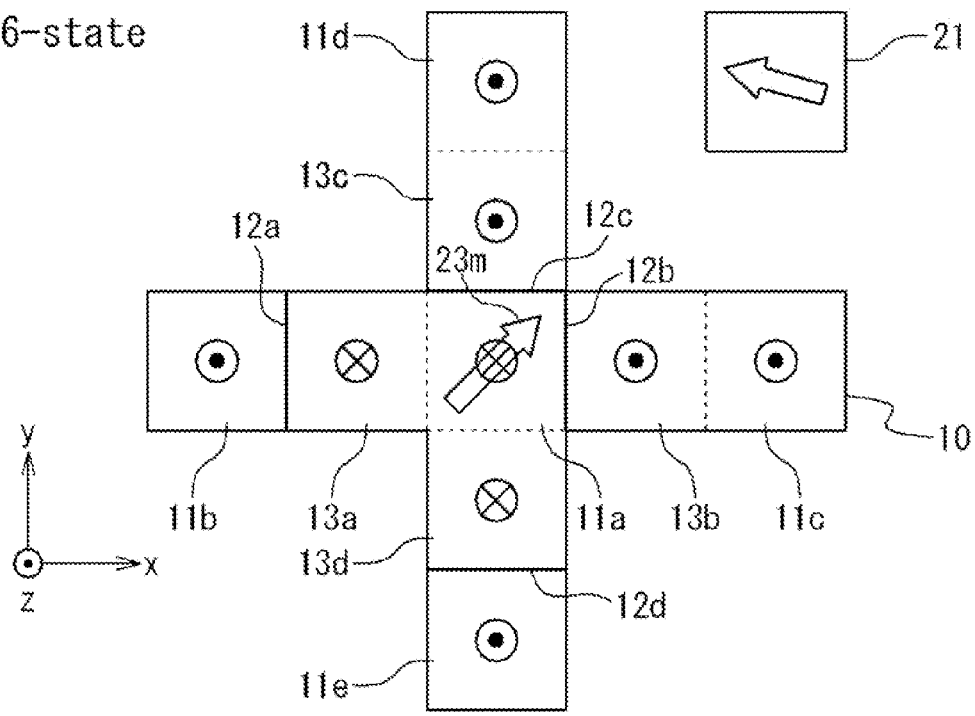
FIG. 40F is a plan view showing the configuration of the magnetic memory device according to the fifth exemplary embodiment of the present invention.

As shown in FIG. 40F, when the magnetization record layer 10 stores the sixth data, the magnetization directions of the first domain wall motion region 13a to the fourth domain wall motion region 13d are the direction of −z, the direction of +z, the direction of +z to the direction of −z, respectively, i.e. (−z, +z, +z, −z). Thus, the domain walls 12a, 12b, 12c and 12d are formed between the first magnetization fixed region 11b and the first domain wall motion region 13a, between the 0$^{th}$ magnetization fixed region 11a and the second domain wall motion region 13b, between the 0$^{th}$ magnetization fixed region 11a and the third domain wall motion region 13c, and between and the fourth domain wall motion region 13d and fourth magnetization fixed region 11c, respectively. At this time, the magnetic field H is generated in the neighborhood of the sensor layer 23 on the lower-side of the magnetization record layer 10 (on the side of −z) to direct to the sixth direction shifted to the direction of +y by about 45 degrees from the direction of +x. Thus, the direction of the magnetization 23m of the sensor layer 23 is the sixth direction in the same way. As a result, in the magnetic tunnel junction section 20, the relative angle is about φ6 (FIG. 39) between the direction of the magnetization 23m of the sensor layer 23 and the magnetization of the reference layer 21. Therefore, the state that the relative angle is about φ6 can be detected by detecting a resistance value in the direction of ±z of the magnetic tunnel junction section 20. That is, the sixth data (δ6-state) stored in the magnetization record layer 10 can be read.

Figure 40G:
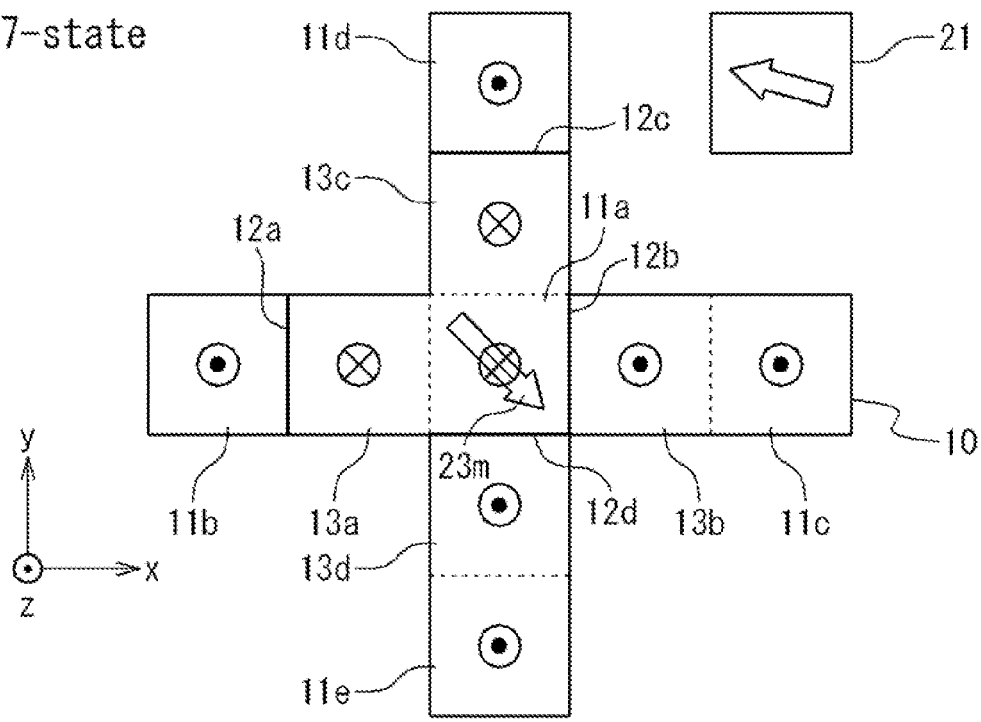
FIG. 40G is a plan view showing the configuration of the magnetic memory device according to the fifth exemplary embodiment of the present invention.

As shown in FIG. 40G, when the magnetization record layer 10 stores the seventh data, the magnetization directions of the first domain wall motion region 13a to the fourth domain wall motion region 13d are the direction of −z, the direction of +z, the direction of −z, and the direction of +z, respectively, i.e. (−z, +z, −z, +z). Thus, the domain walls 12a, 12b, 12e and 12d are formed between the first magnetization fixed region 11b and the first domain wall motion region 13a, between the 0$^{th}$ magnetization fixed region 11a and the second domain wall motion region 13b, between the third magnetization fixed region 11d and the third domain wall motion region 13c, and between and the 0$^{th}$ magnetization fixed region 11a and the fourth domain wall motion region 13d, respectively. At this time, the magnetic field H is generated in the neighborhood of the sensor layer 23 on the lower-side of the magnetization record layer 10 (on the side of −z) to direct to the seventh direction shifted to the direction of −y by about 45 degrees from the direction of +x. Thus, the direction of the magnetization 23m of the sensor layer 23 is the seventh direction in the same way. As a result, in the magnetic tunnel junction section 20, the relative angle is about ϕ7 (FIG. 39) between the direction of the magnetization 23m of the sensor layer 23 and the magnetization direction of the reference layer 21. Therefore, the state that the relative angle is about ϕ7 can be detected by detecting a resistance value in the direction of ±z of the magnetic tunnel junction section 20. That is, the seventh data (δ7-state) stored in the magnetization record layer 10 can be read.

Figure 40H:
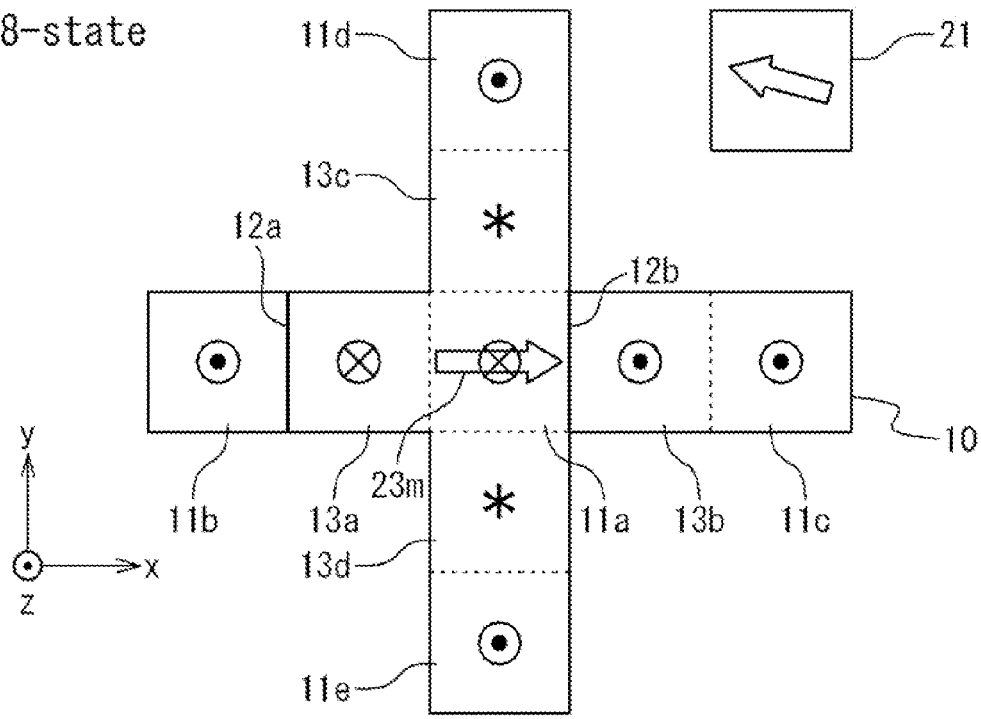
FIG. 40H is a plan view showing the configuration of the magnetic memory device according to the fifth exemplary embodiment of the present invention.

As shown in FIG. 40H, when the magnetization record layer 10 stores the eighth data, the magnetization directions of the first domain wall motion region 13a to the fourth domain wall motion region 13d are the direction of −z, the direction of +z, the direction of *, and the direction of *, i.e. (−z, +z, *, *), respectively. Thus, the domain walls 12a and 12b are formed between the first magnetization fixed region 11b and the first domain wall motion region 13a and between and the 0$^{th}$ magnetization fixed region 11a and the second domain wall motion region 13b, respectively. Here, for example, supposing that the direction of * is the direction −z, the domain walls 12c and 12d (not shown) are formed between the third magnetization fixed region 11d and the third domain wall motion region 13c and between fourth magnetization fixed region 11c and the fourth domain wall motion region 13d, respectively. At this time, the magnetic field H is generated in the neighborhood of the sensor layer 23 on the lower-side of the magnetization record layer 10 (on the side of −z) to direct to the eighth direction as the direction of +x. Thus, the direction of the magnetization 23m of the sensor layer 23 is the eighth direction in the same way. As a result, in the magnetic tunnel junction section 20, the relative angle is about ϕ8 (FIG. 39) between the direction of the magnetization 23m of the sensor layer 23 and the magnetization direction of the reference layer 21. Therefore, the state that the relative angle is about ϕ8 can be detected by detecting a resistance value in the direction of ±z of the magnetic tunnel junction section 20. That is, the eighth data (δ8-state) stored in the magnetization record layer 10 can be read.

It should be noted that the relation of the relative angle between magnetization direction of the sensor layer 23 and magnetization direction of the reference layer 21 and the resistance value of the magnetic tunnel junction section 20 are such as shown in FIG. 26, excluding that the relative angles in δ1-state to δ8-state are ϕ1 to ϕ8, respectively. Therefore, the description is omitted.

The magnetic memory device 1 of the present exemplary embodiment is made 8-valued and can store eight kinds of data. It should be noted that the magnetization direction of the reference layer 21 is not limited in case of FIG. 40A to FIG. 40H. If the relative angle between the magnetization direction of the sensor layer 23 and the magnetization direction of the reference layer 30 is of eight kinds, the magnetization direction of the reference layer 21 may be another direction.

3. Initializing Method of Magnetization Fixed Region

For example, the initializing method of the magnetic memory device according to the fifth exemplary embodiment of the present invention can be performed in the same manner as the first exemplary embodiment (FIG. 6A to FIG. 6C). Therefore, the description is omitted.

4. Write Operation

Next, the data write principle into the magnetic memory device will be described. The data write principle of the present exemplary embodiment is basically the same as that of the fourth exemplary embodiment. That is, a current is supplied through the route such that electrons are supplied from the domain wall motion region for the magnetization direction to be directed to the direction of +z and the electrons are drawn out from the domain wall motion region for the magnetization direction to be directed to the direction of −z. A plurality of routes may be used according to the necessity. Here, a combination of the write current supply destination and the write current drawn-out destination is changed according to the combinations of the magnetization directions of the first domain wall motion region 13a to the fourth domain wall motion region 13d in δ1-state to δ8-state. It should be noted that it is supposed in the following description that the direction of* is the direction of −z.

FIG. 41A to FIG. 41H are plan views showing a data write principle into the magnetic memory device according to the fifth exemplary embodiment of the present invention. The data write is performed by the domain wall motion method using spin transfer. The write current Iw flows into the direction passing through the magnetization record layer 10 in plane while passing through the domain wall, not the direction passing through MTJ (magnetic tunnel junction section 20). The write current Iw is supplied to the magnetization record layer 10 from either of the current supply terminals (not shown) connected with the first magnetization fixed region 11b to the fourth magnetization fixed region.

Figure 41A:
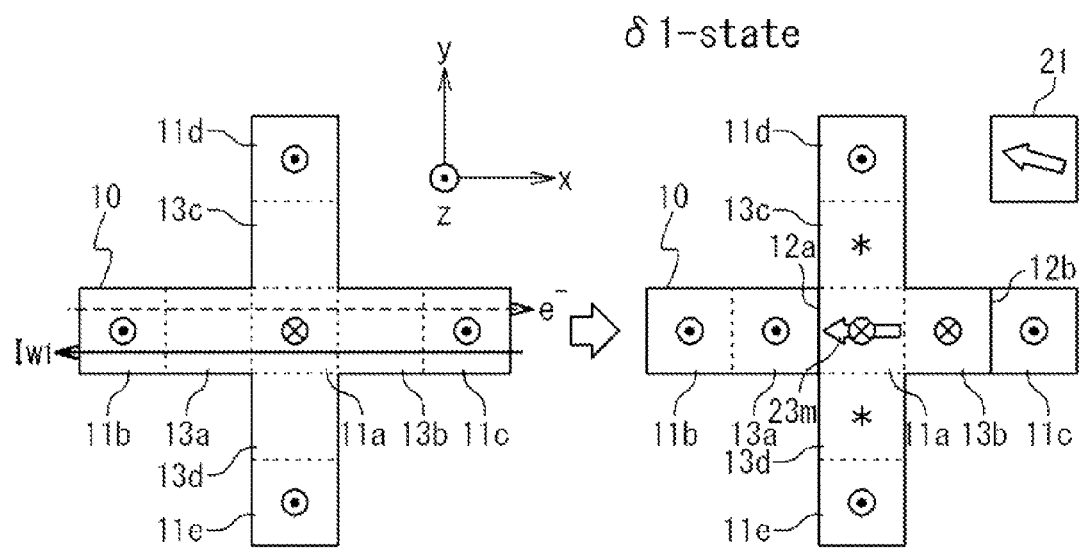
FIG. 41A is a plan view showing the data write principle according to the fifth exemplary embodiment of the present invention.

As shown in the left side of FIG. 41A, in a case of the write operation of the first data (δ1-state), the first write current Iw1 flows from the second magnetization fixed region 11e to the first magnetization fixed region 11b through the second domain wall motion region 13b, the 0$^{th}$ magnetization fixed region 11a and the first domain wall motion region 13a in this order (solid line arrow). In addition, for example, the second write current Iw2 (not shown) flows from the third magnetization fixed region 11d and the fourth magnetization fixed region 11c to the first magnetization fixed region 11b through the 0$^{th}$ magnetization fixed region 11a. In this case, the motion of electrons e$^-$ (broken line arrow) is opposite to the write currents Iw1 and Iw2. As a result, by the spin transfer effect, the magnetization direction of the first domain wall motion region 13a is inverted to the direction of +z and the magnetization direction of the second domain wall motion region 13b is inverted to the direction of −z. In addition, the magnetization directions of the third domain wall motion region 13c and the fourth domain wall motion region 13d are inverted to the direction of −z. Thus, the domain wall 12a is moved to the boundary between the first domain wall motion region 13a and the 0$^{th}$ magnetization fixed region 11a, the domain wall 12b is moved to the boundary between the second domain wall motion region 13b and the second magnetization fixed region 11e, the domain wall 12c is moved to the boundary between the third domain wall motion region 13c and the third magnetization fixed region 11d, and the domain wall 12d is moved to the boundary between the fourth domain wall motion region 13d and the fourth magnetization fixed region 11e. Thus, the first data (δ1-state) is written in as shown in the right side of FIG. 41A.

Figure 41B:
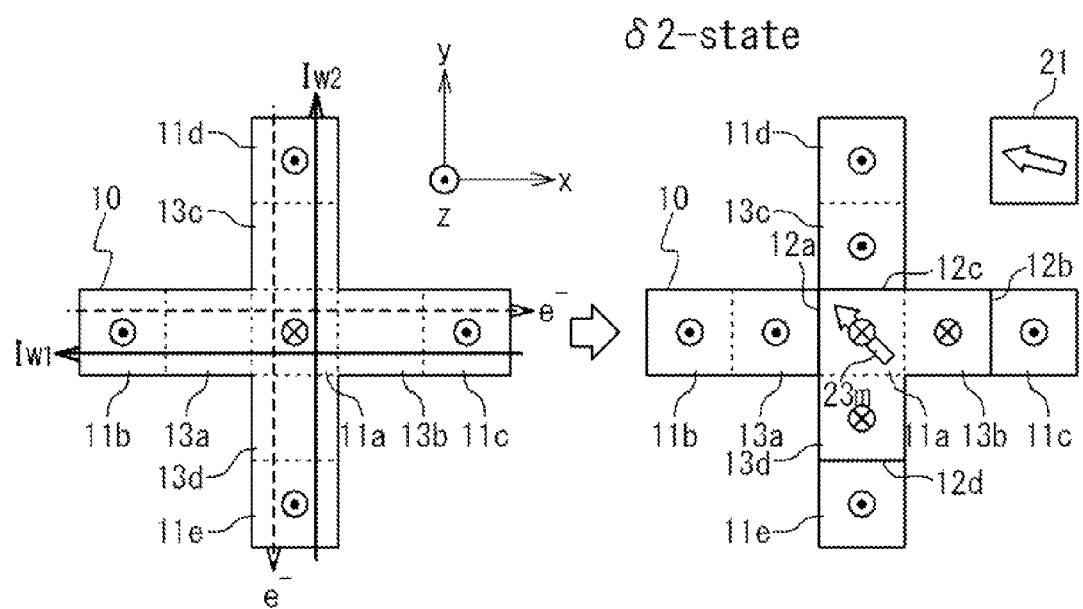
FIG. 41B is a plan view showing the data write principle according to the fifth exemplary embodiment of the present invention.

As shown in the left side of FIG. 41B, in a case of the write operation of the second data (δ2-state), the first write current Iw1 flows from the second magnetization fixed region 11c to the first magnetization fixed region 11b through the second domain wall motion region 13b, the $0^{th}$ magnetization fixed region 11a and the first domain wall motion region 13a in this order (solid line arrow). In addition, the second write current Iw2 flows from the fourth magnetization fixed region 11c to the third magnetization fixed region 11d through the fourth domain wall motion region 13d, the $0^{th}$ magnetization fixed region 11a and the third domain wall motion region 13c in this order (solid line arrow). In this case, the motion of electrons $e^-$ (broken line arrow) is opposite to the write currents Iw1 and Iw2. As a result, by the spin transfer effect, the magnetization direction of the first domain wall motion region 13a is inverted to the direction of +z, the magnetization direction of the second domain wall motion region 13b is inverted to the direction −z, the magnetization direction of the third domain wall motion region 13c is inverted to the direction of +z, the magnetization direction of the fourth domain wall motion region 13d is inverted to the direction of −z. Thus, the domain wall 12a is moved to the boundary between then the first domain wall motion region 13a and the $0^{th}$ magnetization fixed region 11a, the domain wall 12b is moved to the boundary between the second domain wall motion region 13b and the second magnetization fixed region 11c, the domain wall 12c is moved to the boundary between the third domain wall motion region 13c and the $0^{th}$ magnetization fixed region 11a, and the domain wall 12d is moved to the boundary between the fourth domain wall motion region 13d and the fourth magnetization fixed region 11e. Thus, the second data (δ2-state) is written as shown in the right side of FIG. 41B.

Figure 41C:
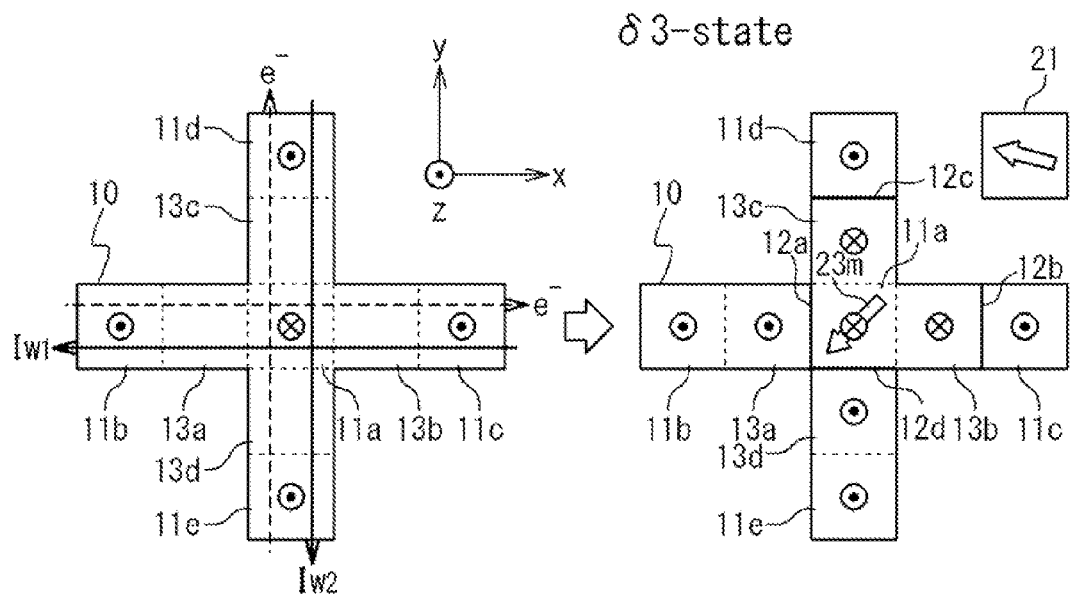
FIG. 41C is a plan view showing the data write principle according to the fifth exemplary embodiment or the present invention.

As shown in the left side of FIG. 41C, in a case of the write operation of the third data (δ3-state), the first write current Iw1 flows from the second magnetization fixed region 11c to the first magnetization fixed region 11b through the second domain wall motion region 13b, the $0^{th}$ magnetization fixed region 11a and the first domain wall motion region 13a in this order (solid lint arrow). In addition, the second write current Iw2 flows from the third magnetization fixed region 11d to the fourth magnetization fixed region 11c through the third domain wall motion region 13c, the $0^{th}$ magnetization fixed region 11a and the fourth domain wall motion region 13d in this order (solid line arrow). In this case, the motion of electrons $e^-$ (broken line arrow) is opposite to the write currents Iw1 and Iw2. As a result, by the spin transfer effect, the magnetization direction of the first domain wall motion region 13a is inverted to the direction of +z, the magnetization direction of the second domain wall motion region 13b is inverted to the direction −z, the magnetization direction of the third domain wall motion region 13c is inverted to the direction −z, and the magnetization direction of the fourth domain wall motion region 13d is inverted to the direction of +z. In this way, the domain wall 12a is moved to the boundary between then the first domain wall motion region 13a and the $0^{th}$ magnetization fixed region 11a, the domain wall 12b is moved to the boundary between the second domain wall motion region 13b and the second magnetization fixed region 11c, the domain wall 12c is moved to the boundary between the third domain wall motion region 13c and the third magnetization fixed region 11d, and the domain wall 12d is moved to the boundary between the fourth domain wall motion region 13d and the $0^{th}$ magnetization fixed region 11a. Thus, the third data (δ3-state) is written in as shown in the right side of FIG. 41C.

Figure 41D:
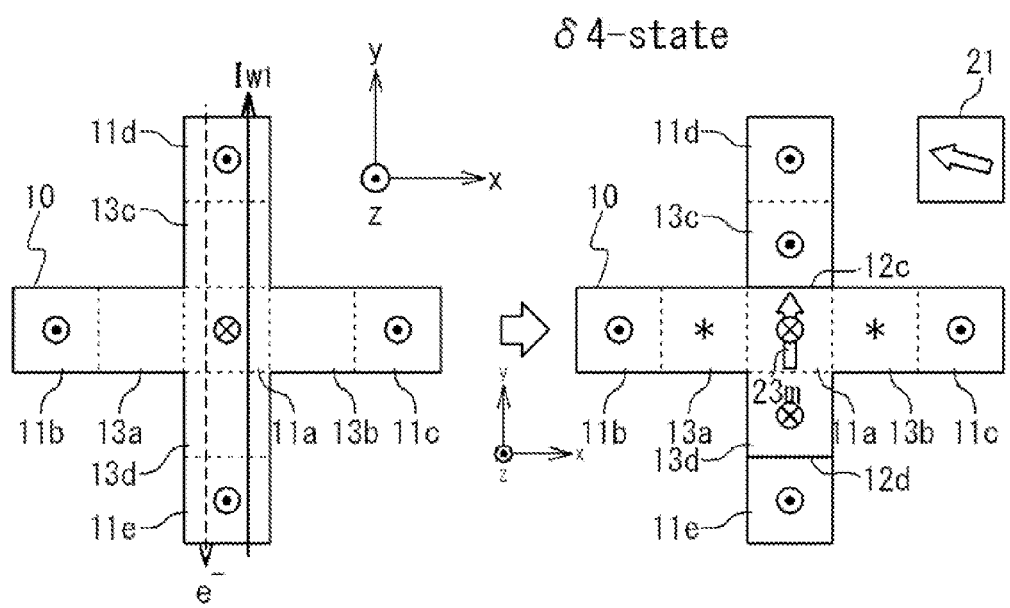
FIG. 41D is a plan view showing the data write principle according to the fifth exemplary embodiment of the present invention.

As shown in the left side of FIG. 41D, in a case of the write operation of the fourth data (δ4-state), the first write current Iw1 flows from the fourth magnetization fixed region 11e to the third magnetization fixed region 11d through the fourth domain wall motion region 13d, the $0^{th}$ magnetization fixed region 11a and the third domain wall motion region 13c in this order (solid line arrow). In addition, for example, the second write current Iw2 (not shown) flows from the first magnetization fixed region 11b and the second magnetization fixed region 11c to the third magnetization fixed region 11d through the $0^{th}$ magnetization fixed region 11a. In this case, the motion of electrons c (broken line arrow) is opposite to the write currents Iw1 and Iw2. As a result, by the spin transfer effect, the magnetization direction of the third domain wall motion region 13c is inverted to the direction of +z and the magnetization direction of the fourth domain wall motion region 13d is inverted to the direction of −z. In addition, the magnetization directions of the first domain wall motion region 13a and the second domain wall motion region 13b are inverted to the direction of −z. Thus, the domain wall 12a is moved to the boundary between then the first domain wall motion region 13a and the $0^{th}$ magnetization fixed region 11a, the domain wall 12b is moved to the boundary between the second domain wall motion region 13b and the $0^{th}$ magnetization fixed region 11a, the domain wall 12c is moved to the boundary between the third domain wall motion region 13c and the $0^{th}$ magnetization fixed region 11a, and the domain wall 12d is moved to the boundary between the fourth domain wall motion region 13d and the fourth magnetization fixed region 11e. Thus, the fourth data (δ4-state) is written as shown in the right side of FIG. 41D.

Figure 41E:
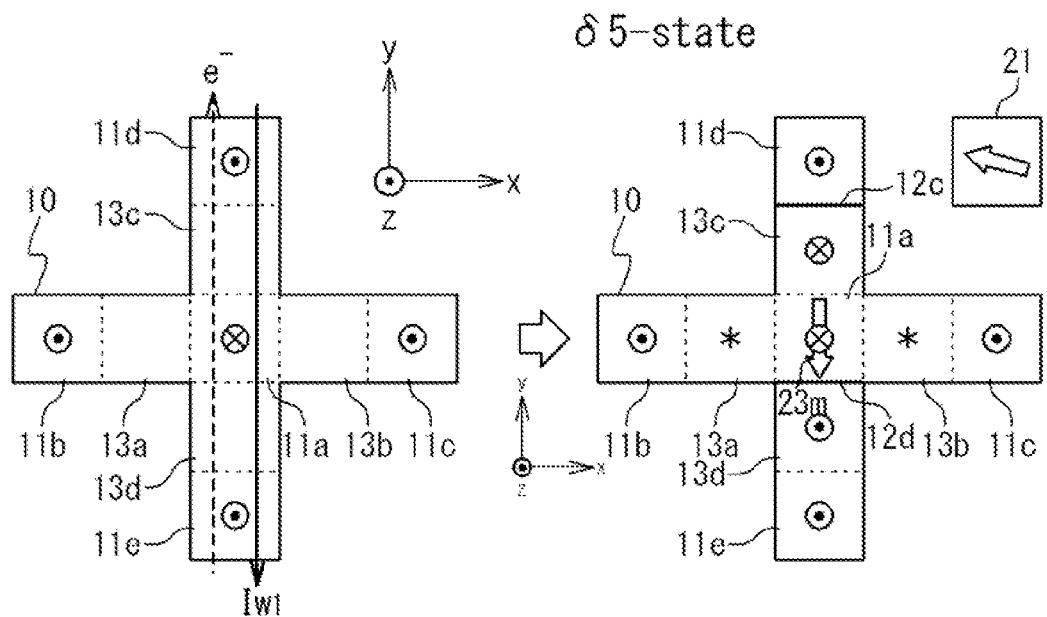
FIG. 41E is a plan view showing the data write principle according to the fifth exemplary embodiment of the present invention.

As shown in the left side of FIG. 41E, in a case of the write operation of the fifth data (δ5-state), the first write current Iw1 flows from the third magnetization fixed region 11d to the fourth magnetization fixed region 11c through the third domain wall motion region 13c, the $0^{th}$ magnetization fixed region 1 to and the fourth domain wall motion region 13d in this order (solid line arrow). In addition, for example, the second write current Iw2 (not shown) flows from the first magnetization fixed region 11b and the second magnetization fixed region 11c to the fourth magnetization fixed region 11c through the $0^{th}$ magnetization fixed region 11a. In this case, the motion of electrons $e^-$ (broken line arrow) is opposite to the write currents Iw1 and Iw2. As a result, by the spin transfer effect, the magnetization direction of the third domain wall motion region 13c is inverted to the direction of −z and the magnetization direction of the fourth domain wall motion region 13d is inverted to the direction of +z. Also, the magnetization directions of the first domain wall motion region 13a and the second domain wall motion region 13b are inverted to the direction of −z. In this way, the domain wall 12a is moved to the boundary between then the first domain wall motion region 13a and the $0^{th}$ magnetization fixed region 11a, the domain wall 12b is moved to the boundary between the second domain wall motion region 13b and the $0^{th}$ magnetization fixed region 11a, the domain wall 12c is moved to the boundary between the third domain wall motion region 13c and 11c of third magnetization fixed regions, and the domain wall 12d is moved to the boundary between the fourth domain wall motion region 13d and the $0^{th}$ magnetization fixed region 11a. Thus, the fifth data (δ5-state) is written as shown in the right side of FIG. 41E.

Figure 41F:
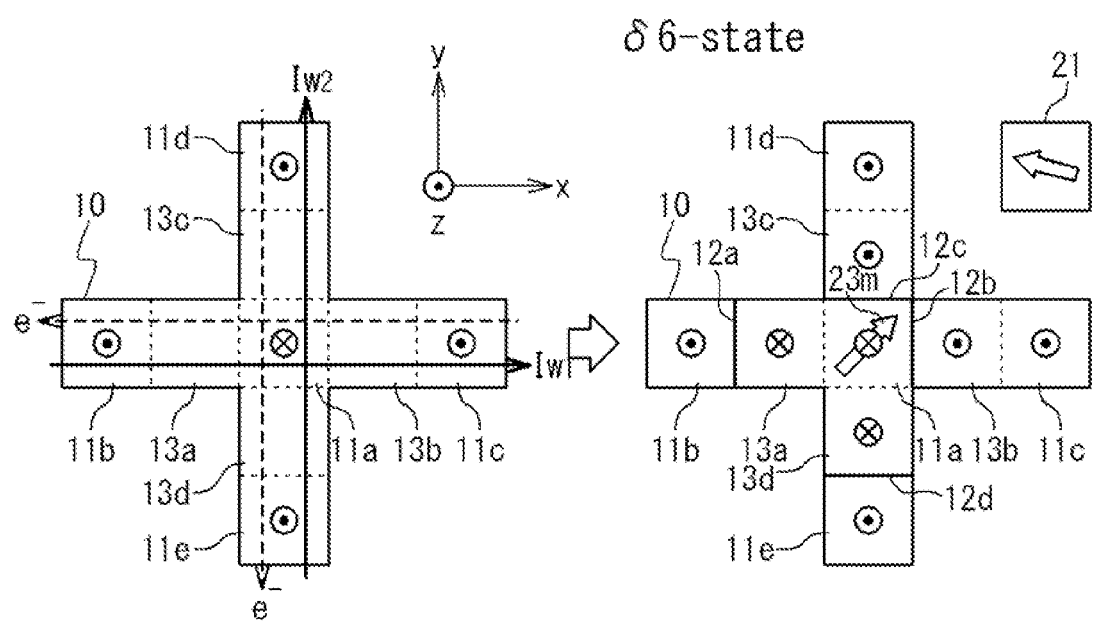
FIG. 41F is a plan view showing the data write principle according to the fifth exemplary embodiment of the present invention.

As shown in the left side of FIG. 41F, in a case of the write operation of the sixth data (δ6-state), the first write current Iw1 flows from the first magnetization fixed region 11b to the second magnetization fixed region 11c through the $0^{th}$ magnetization fixed region 11a, the first domain wall motion region 13a and the second domain wall motion region 13b in this order (solid line arrow). In addition, the second write current Iw2 flows from the fourth magnetization fixed region 11c to the third magnetization fixed region 11d through the fourth domain wall motion region 13d, the $0^{th}$ magnetization fixed region 11a and the third domain wall motion region 13c in this order (solid line arrow). In this case, the motion of electrons e⁻ (broken line arrow) is opposite to the write currents Iw1 and Iw2. As a result, by the spin transfer effect, the magnetization direction of the first domain wall motion region 13a is inverted to the direction of −z, the magnetization direction of the second domain wall motion region 13b is inverted to the direction of +z, the magnetization direction of the third domain wall motion region 13c is inverted to the direction of +z, and the magnetization direction of the fourth domain wall motion region 13d is inverted to the direction of −z. In this way, the domain wall 12a is moved to the boundary between then the first domain wall motion region 13a and the first magnetization fixed region 11b, the domain wall 12b is moved to the boundary between the second domain wall motion region 13b and the $0^{th}$ magnetization fixed region 11a, the domain wall 12c is moved to the boundary between the third domain wall motion region 13c and the $0^{th}$ magnetization fixed region 11a, and the domain wall 12d is moved to the boundary between the fourth domain wall motion region 13d and the fourth magnetization fixed region 11e. Thus, the sixth data (δ6-state) is written as shown in the right side of FIG. 41F.

Figure 41G:
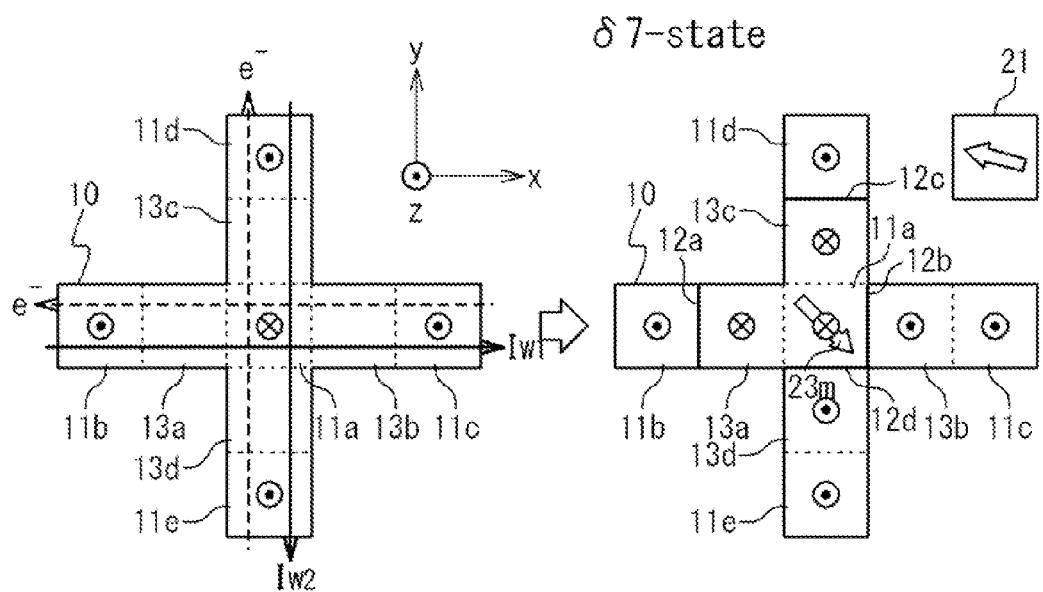
FIG. 41G is a plan view showing the data write principle according to the fifth exemplary embodiment of the present invention.

As shown in the left side of FIG. 41G, in a case of the write operation of the seventh data (δ7-state), the first write current Iw1 flows from the first magnetization fixed region 11b to the second magnetization fixed region 11c through the $0^{th}$ magnetization fixed region 11a, the first domain wall motion region 13a and the second domain wall motion region 13b in this order (solid line arrow). In addition, the second write current Iw2 flows from the fourth domain wall motion region 13d to the fourth magnetization fixed region 11e through the third domain wall motion region 13c, the $0^{th}$ magnetization fixed region 11a and the third magnetization fixed region 11d in this order (solid line arrow). In this case, the motion of electrons e⁻ (broken line arrow) is opposite to the write currents Iw1 and Iw2. As a result, by the spin transfer effect, the magnetization direction of the first domain wall motion region 13a is inverted to the direction −z, the magnetization direction of the second domain wall motion region 13b is inverted to the direction of +z, the magnetization direction of the third domain wall motion region 13c is inverted to the direction −z, and the magnetization direction of the fourth domain wall motion region 13d is inverted to the direction of +z. In this way, the domain wall 12a is moved to the boundary between then the first domain wall motion region 13a and the first magnetization fixed region 11b, the domain wall 12b is moved to the boundary between the second domain wall motion region 13b and the $0^{th}$ magnetization fixed region 11a, the domain wall 12c is moved to the boundary between the third domain wall motion region 13c and the third magnetization fixed region 11d, and the domain wall 12d is moved to the boundary between the fourth domain wall motion region 13d and the $0^{th}$ magnetization fixed region 11a. Thus, the seventh data (δ7-state) is written as shown in the right side of FIG. 41G.

Figure 41H:
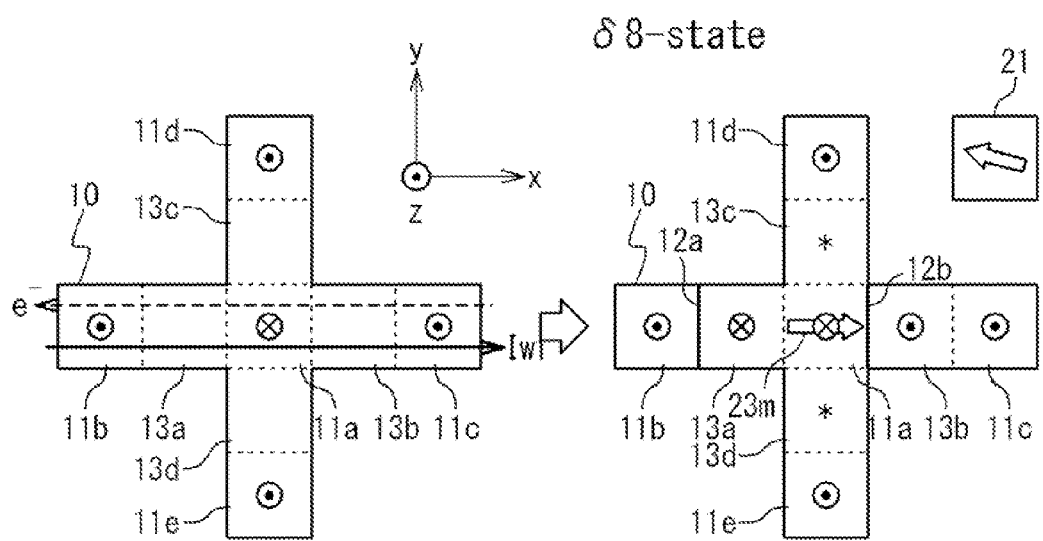
FIG. 41H is a plan view showing the data write principle according to the fifth exemplary embodiment of the present invention.

As shown in the left side of FIG. 41H, in a case of the write operation of the eighth data (δ8-state), the first write current Iw1 flows from the first magnetization fixed region 11b to the second magnetization fixed region 11c through the first domain wall motion region 13a, the $0^{th}$ magnetization fixed region 11a, and the second domain wall motion region 13b in this order (solid line arrow). In addition, for example, the second write current Iw2 (not shown) flows from the third magnetization fixed region 11d and the fourth magnetization fixed region 11e to the second magnetization fixed region 11c through the $0^{th}$ magnetization fixed region 11a. In this case, the motion of electrons e⁻ (broken line arrow) is opposite to the write currents Iw1 and Iw2. As a result, by the spin transfer effect, the magnetization direction of the first domain wall motion region 13a is inverted to the direction −z, and the magnetization direction of the second domain wall motion region 13b is inverted to the direction of +z. Also, the magnetization directions of the third domain wall motion region 13c and the fourth domain wall motion region 13d are inverted to the direction of −z. In this way, the domain wall 12a is moved to the boundary between then the first domain wall motion region 13a and the first magnetization fixed region 11b, the domain wall 12b is moved to the boundary between the second domain wall motion region 13b and the $0^{th}$ magnetization fixed region 11a, the domain wall 12c is moved to the boundary between the third domain wall motion region 13c and the third magnetization fixed region 11d, and the domain wall 12d is moved to the boundary between the fourth domain wall motion region 13d and the fourth magnetization fixed region 11e. Thus, the eighth data (δ8-state) is written as shown in the right side of FIG. 41H.

In this way, the magnetization directions of the first domain wall motion region 13a to the fourth domain wall motion region 13d are inverted with the write currents Iw1 and Iw2 which flow through the magnetization record layer 10 in plane. The first data to the eighth data are distinguishably written and stored based on the combinations of the magnetization directions. At this time, the magnetization fixed regions on both sides of each domain wall motion region have the magnetization directions anti-parallel to each other and function as different spin electron supply sources to the domain wall motion regions. It should be noted that when being initially in a state after the write operation, the domain wall 12 maintains the state regardless of the injection of spin electrons e⁻. Therefore, overwrite is possible. Also, in any case of FIG. 41A to FIG. 41H, the first write current Iw1 and the second write current Iw2 may be supplied at the same time or at different times, and the order of supply may be opposite. Also, the write currents Iw1 and Iw2 may pass wherever later if passing through the domain wall 12a and 12b.

5. Read Operation

The data read principle of the data from the magnetic memory device according to the fifth exemplary embodiment of the present invention is the same as that of the first exemplary embodiment, excluding that the relative angles of φ1 to φ8 are used in a range shown in FIG. 26. Therefore, the description is omitted.

6. Configuration and Operation of Magnetic Memory Cell and MRAM

Figure 42:
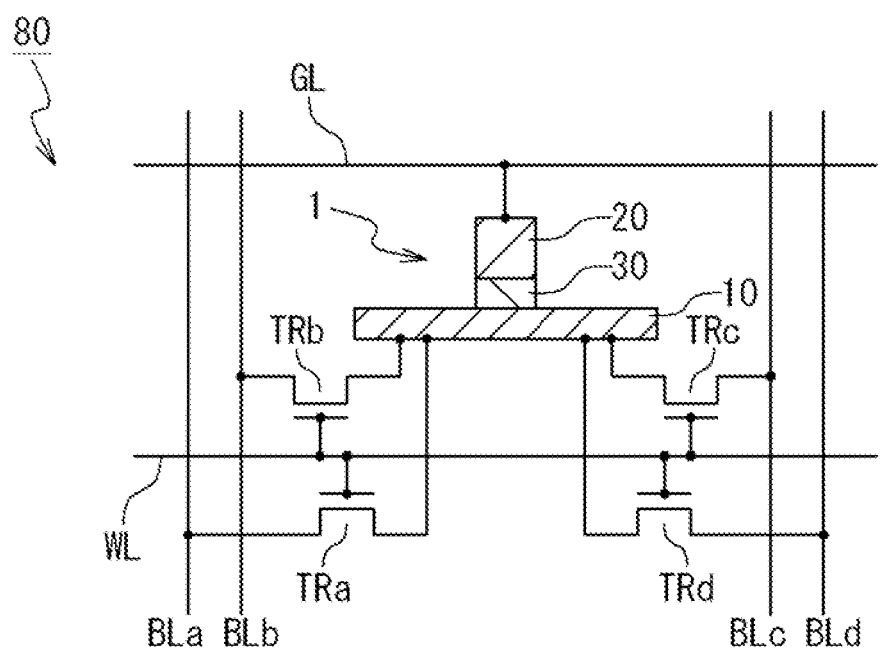
FIG. 42 is a block diagram showing the configuration of the memory cell according to the fifth and sixth exemplary embodiments of the present invention.

FIG. 42 is a block diagram showing the configuration of the memory cell in which the magneto-resistance effect element according to the fifth exemplary embodiment of the present invention is integrated. As shown in FIG. 42, in the magneto-resistance effect element 1, the terminal connected with the reference layer 21 of the magnetic tunnel junction section 20 is connected with the read ground line GL. Four terminals connected with the first magnetization fixed region 11b to the fourth magnetization fixed region 11c in the magnetization record layer 10 are connected with ones of the sources/drains of the MOS transistors TRa, TRb, TRc and TRd, respectively. Also, the other of the sources/drains of the MOS transistors TRa, TRb, TRc and TRd are connected with write bit lines BLa, BLb, BLc and BLd, respectively. Moreover, the gates of the MOS transistors TRa, TRb, TRc and TRd are connected with word line WL. Here, the configuration of the magnetic memory cell is not limited to this example.

Figure 43:
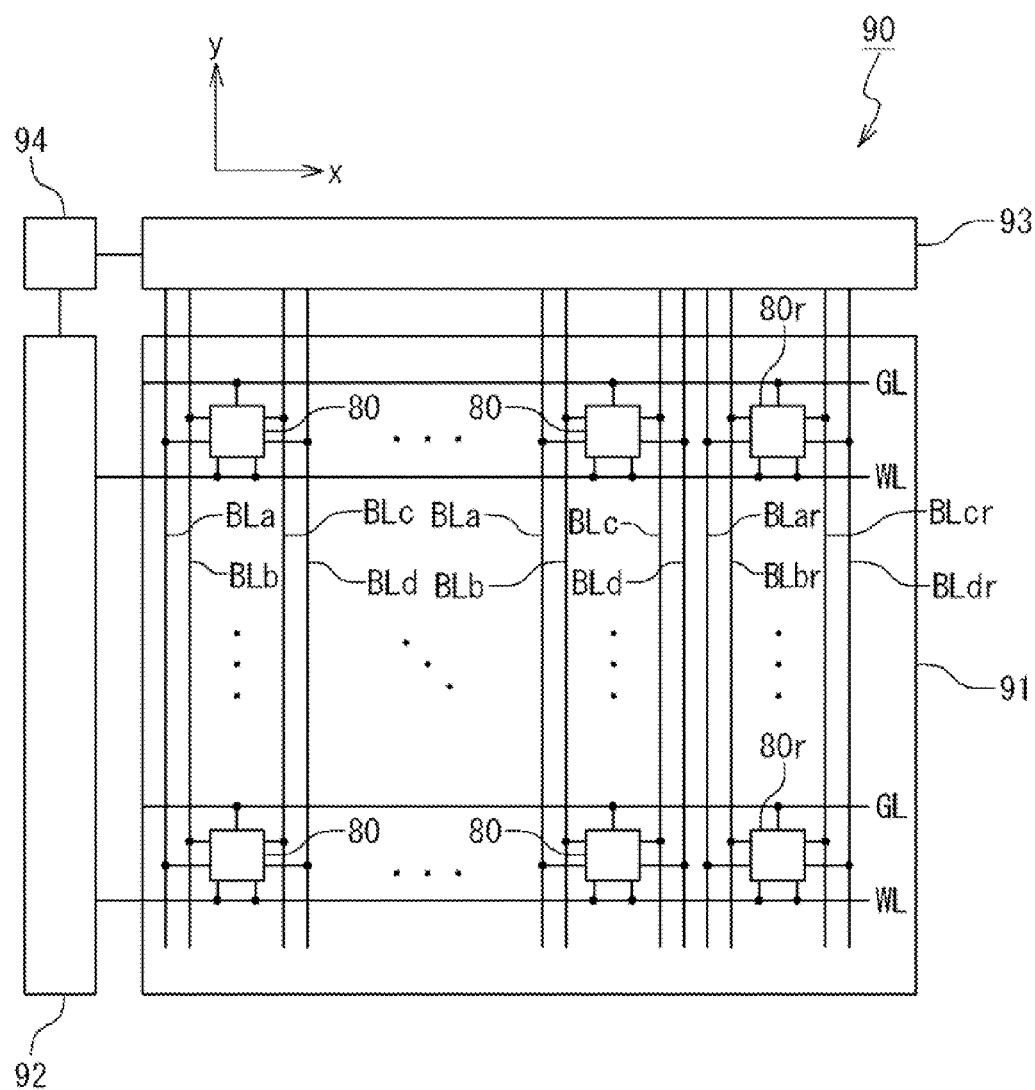
FIG. 43 is a block diagram showing the configuration of the MRAM according to the fifth and sixth exemplary embodiments of the present invention.

FIG. 43 is a block diagram showing the configuration of MRAM in which the memory cells according to the second exemplary embodiment of the present invention are integrated. In FIG. 43, MRAM 90 is provided with the memory array 91 in which a plurality of memory cells 80 are arranged in a matrix. The memory array 91 contains the reference cells 80r to be referred to in a case of the data read operation, together with the memory cells 80 which are used to store data as described with reference to FIG. 42. In an example of FIG. 43, the reference cells 80r for one column are provided. The structure of reference cell 80r is the same as that of the memory cell 80. For example, in this case, MTJ of the reference cell 80r has the resistance value of R0.5.

The word line WL and the ground line GL extend in the direction of x, respectively. The word line W is connected with the X-side control circuit 92 at one end. The X-side control circuit 92 selects as a selection word line WL, the word line WL which is connected with the memory cell 80 as a target in the case of the data write operation and the data read operation. The bit lines BLa, BLb, BLc and BLd extend in the direction of y and are connected with the Y-side control circuit 93 at one end, respectively. The Y-side control circuit 93 selects as selection bit lines BLa, BLb, BLc and BLd, the bit lines BLa, BLb, BLc and BLd which are connected with the memory cell 80 as the target in the case of the data write operation and the data read operation. The control circuit 94 controls the X-side control circuit 92 and the Y-side control circuit 93 in the case of the write operation and the data read operation.

Next, a write method and a read method of an MRAM shown in FIG. 43 will be described.

At first, the write operation will be described. The X-side control circuit 92 selects the selection word line WL. Thus, the selection word line WL is pulled up to the "high" level and the MOS transistors TRa, TRb. TRc and TRd are turned "ON". Also, the Y-side control circuit 93 selects the selection bit lines BLa, BLb, BLc and BLd. Thus, either of the selection bit lines BLa, BLb, BLc and BLd is pulled up to the "high" level, one of the remaining lines is pulled down to "low" level, and the remaining lines are set to an "Open" (floating) state. Which of the selection bit lines BLa, BLb, BLc and BLd should be set to the "high" state, the "low" state, and the "Open" state is determined based on the data written in the magneto-resistance effect element 1. That is, it is determined according to the route and direction of the write current Iw to be supplied to the magnetization record layer 10. The current flows through a plurality of routes according to the necessity. From the above, the first data to the eighth data can be distinguishably written.

Next, the read operation will be described. The X-side control circuit 92 selects the selection word line WL. Thus, the selection word line WL is pulled up to the "high" level and the MOS transistors TRa, TRb, TRc and TRd are turned "ON". Also, the Y-side control circuit 93 selects the selection bit lines BLa, BLb, BLc and BLd. Thus, either of the selection bit lines BLa, BLb, BLc and BLd is pulled up to the "high" level and the remaining three bit lines are set to the "open" (floating) state. At this time, the read current IR flows from one of the selection bit lines BLa, BLb, BLc and BLd to the ground line GL through, for example, the second magnetization fixed region 11c, the second domain wall motion region 13b, the $0^{th}$ magnetization fixed region 11a, the contact layer 30 and the magnetic tunnel junction section 20 (MTJ which is composed of sense layer 23, the barrier layer 22 and the reference layer 21). The voltage of the bit line BL through which the read current IR flows or a value of the read current depends on a change of the resistance value of the magneto-resistance effect element 1 (magnetic tunnel junction section 20) due to the magneto-resistance effect. Therefore, the read operation at high speed becomes possible by detecting the change of the resistance value as a voltage signal or a current signal by comparing with the output of the reference bit line BLr which is connected with the reference cell 80r and through which the read current IR flows in the same way.

7. Position of Sensor Layer,
8. Domain Wall Stopping Method,
9. Magnetization Fixing Method, and
10. Anisotropy of Sensor Layer The position of the sensor layer, the domain wall stopping method, the magnetization fixing method and the anisotropy of the sensor layer in the magnetic memory device according to the filth exemplary embodiment of the present invention are the same as those of the first exemplary embodiment. Therefore, the description is omitted.

As described above, in the present exemplary embodiment, the same effect as in the fourth exemplary embodiment can be obtained. That is, in the MRAM of the current drive domain wall motion type in which the magnetic anisotropy of the magnetization record layer is of the perpendicular direction, the magnetization fixed region can be easily formed, the read operation is in a high reliability and it is easy to form a pinning site of the domain wall. In addition, the multi-valued configuration can be realized in which eight kinds of data can be stored in the magnetization record layer, and it is possible to increases a data amount per unit area in the semiconductor chip.

Sixth Exemplary Embodiment

In a sixth exemplary embodiment, the magnetic memory cell and MRAM in a case of N=4 will be described.
1. Basic Configuration of Magnetic Memory Device FIG. 38A is a plan view showing an example of the configuration of the magnetization record layer of the magnetic memory device according to the sixth exemplary embodiment of the present invention. FIG. 38B is a sectional view showing the example of the configuration of the magnetic memory device according to the sixth exemplary embodiment of the present invention. Here, FIG. 38B is the sectional view along the line CC' of FIG. 38A.

The magnetic memory device 1 of the present exemplary embodiment is provided with the magnetization record layer 10 and the magnetic tunnel junction section 20 and is basically the same as the magnetic memory device 1 in the fifth exemplary embodiment. Here, the magnetization direction of the reference layer of the magnetic tunnel junction section 20 is the direction of −x and differs from the fifth exemplary embodiment in that the magnetization direction is not shifted in the direction of ±y.

Figure 44:
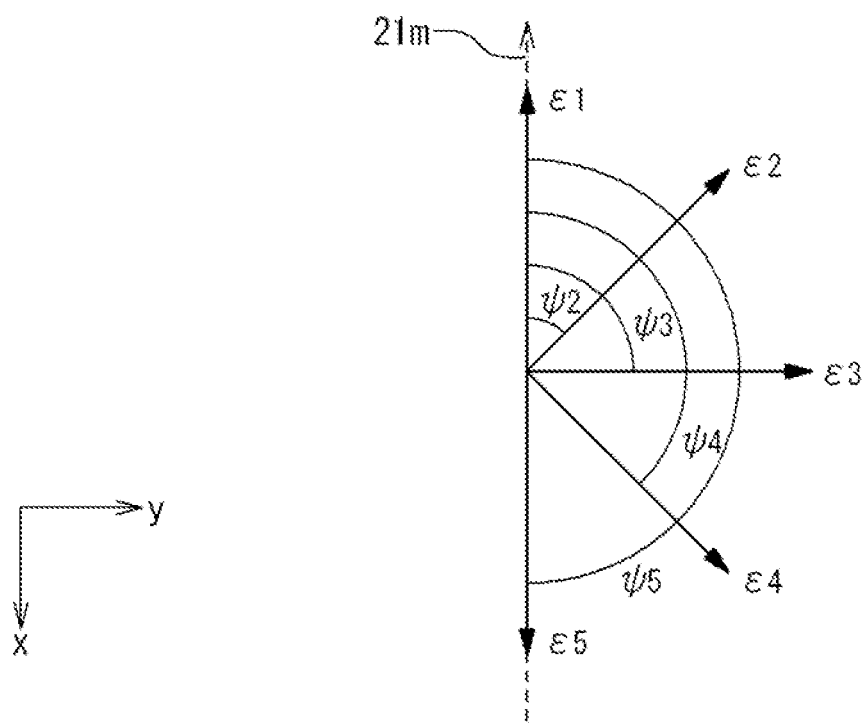
FIG. 44 is a conceptual diagram showing a relation between the magnetization direction of the reference layer and the direction of a synthetic magnetic field of the domain wall motion regions according to the sixth exemplary embodiment of the present invention.

That is, the magnetization direction of the reference layer 21 of the magnetic tunnel junction section 20 is the direction of −x. FIG. 44 is a conceptual diagram showing a relation between the magnetization direction of the reference layer according to the sixth exemplary embodiment of the present invention and the direction of the synthetic magnetic field by the domain wall motion regions. As mentioned later, the magnetic recording layer 10 can take five kinds of states of ∈1-state to ∈5-state. At the time, the direction of the synthetic magnetic field of the first domain wall motion region 13a to the fourth domain wall motion region 13d takes any of five kinds of directions (solid line arrows of ∈1 to ∈5). Therefore, the magnetization direction of the sensor layer 23 of the magnetic tunnel junction section 20 takes any of five kinds of directions. Here, the direction of the magnetization 21m of the reference layer 21 (broken line arrow) is set to the direction of −x. Thus, the relative angles between the direction of the magnetization 21m of the reference layer 21 and the direction of the magnetization direction of the sensor layer 23 (ϵ1 to ϵ5) are of five kinds of ψ1 to ψ5 (ψ1<ψ2<ψ3<ψ4<ψ5). Therefore, five kinds of data are assigned to the live kinds of relative angles, the magnetic memory device of the present exemplary embodiment can be made multi-valued as a quinary value, as shown in FIG. 26.

The other portion of the configuration of the magnetic memory device 1 is the same as that of the fifth exemplary embodiment, and therefore the description is omitted.

2. Storage State of Data

FIG. 45A to FIG. 45E are plan views showing an example of the configuration of the magnetic memory device according to the sixth exemplary embodiment of the present invention. In the present exemplary embodiment, the magnetization record layer 10 retains data as the mutual relation of the magnetization directions of the domain wall motion regions. The magnetic memory device 1 of the present exemplary embodiment can take five states and can store five kinds of data. Here, it is supposed that the shape of the $0^{th}$ magnetization fixed region 11a is square. For example, FIG. 45A to FIG. 45E show (ϵ1-state) when the first data is stored, to (ϵ5-state) when the fifth data is stored. The fifth kinds of data can make optional data.

Figure 45A:
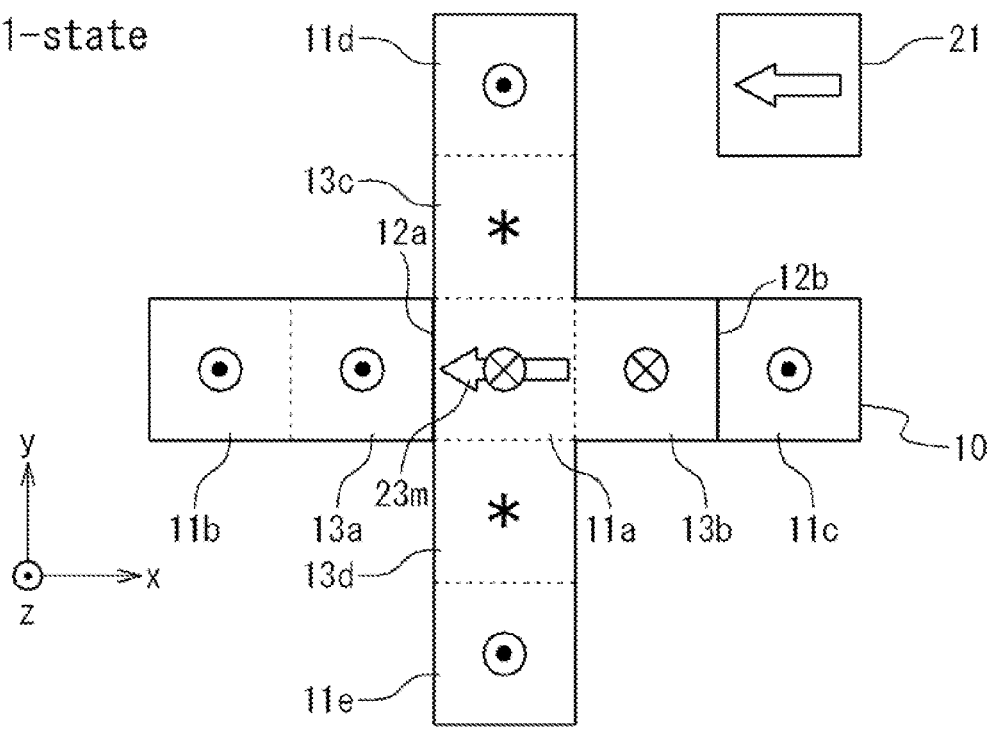
FIG. 45A is a plan view showing the configuration of the magnetic memory device according to the sixth exemplary embodiment of the present invention.

As shown in FIG. 45A, when the magnetization record layer 10 stores the first data, the magnetization directions of the first domain wall motion region 13a to the fourth domain wall motion region 13d are the direction of +z, the direction of −z, the direction of *, the direction of *, respectively, i.e. (+z, −z, *, *). Thus, the domain Walls 12a and 12b are formed between the first domain wall motion region 13a and the $0^{th}$ magnetization fixed region 11a and between the second domain wall motion region 13b and the second magnetization fixed region 11c, respectively. Here, for example, supposing that the direction of * is the direction of −z, the domain walls 12c and 12d (not shown) are formed between the third magnetization fixed region 11d and the third domain wall motion region 13c and between fourth magnetization fixed region 11e and the fourth domain wall motion region 13d, respectively. At this time, the magnetic field H is generated in the neighborhood of the sensor layer 23 on the lower-side of the magnetization record layer 10 (on the side of −z) to direct to the first direction as the direction of −x. Thus, the direction of the magnetization 23m of the sensor layer 23 is the first direction in the same way. As a result, in the magnetic tunnel junction section 20, the relative angle is the parallel state of about 0 degrees between the direction of the magnetization 23m of the sensor layer 23 and the magnetization direction of the reference layer 21. Therefore, by detecting a resistance value in the direction of ±z of the magnetic tunnel junction section 20, this parallel state can be detected. That is, the first data (ϵ1-state) stored in the magnetization record layer 10 can be read.

Figure 45B:
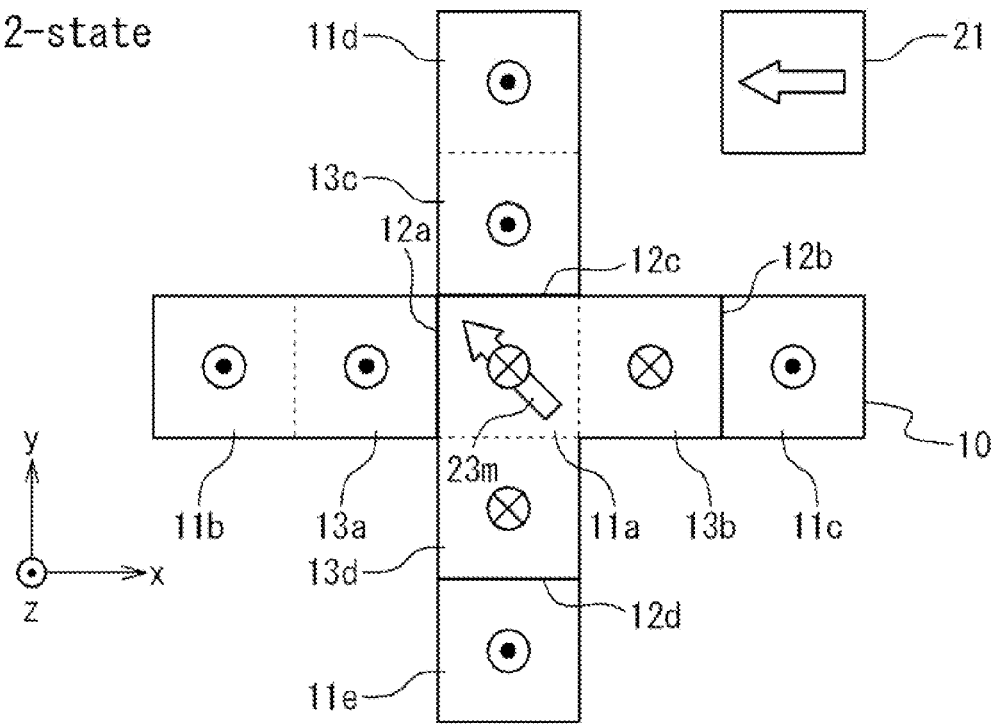
FIG. 45B is a plan view showing the configuration of the magnetic memory device according to the sixth exemplary embodiment of the present invention.

As shown in FIG. 45B, when the magnetization record layer 10 stores the second data, the magnetization directions of the first domain wall motion region 13a to the fourth domain wall motion region 13d are the direction of +z, the direction of −z, the direction of +z, the direction of −z, respectively, i.e. (+z, −z, +z, −z). Thus, the domain walls 12a, 12b, 12c and 12d are formed between the first domain wall motion region 13a and the $0^{th}$ magnetization fixed region 11a, between the second domain wall motion region 13b and the second magnetization fixed region 11c, between the $0^{th}$ magnetization fixed region 11a and the third domain wall motion region 13c, and between and the fourth domain wall motion region 13d and fourth magnetization fixed region 11c, respectively. At this time, the magnetic field H is generated in the neighborhood of the sensor layer 23 on the lower-side of the magnetization record layer 10 (on the side of −z) to direct to the Second direction shifted to the direction of +y by about 45 degrees from the direction of −x. Thus, the direction of the magnetization 23m of the sensor layer 23 is the second direction in the same way. As a result, in the magnetic tunnel junction section 20, the relative angle is about ψ2 (FIG. 44) between the direction of the magnetization 23m of the sensor layer 23 and the magnetization direction of the reference layer 21. Therefore, the state that the relative angle is about ψ2 can be detected by detecting a resistance value in the direction of ±z of the magnetic tunnel junction section 20. That is, the second data (ϵ2-state) stored in the magnetization record layer 10 can be read.

Figure 45C:
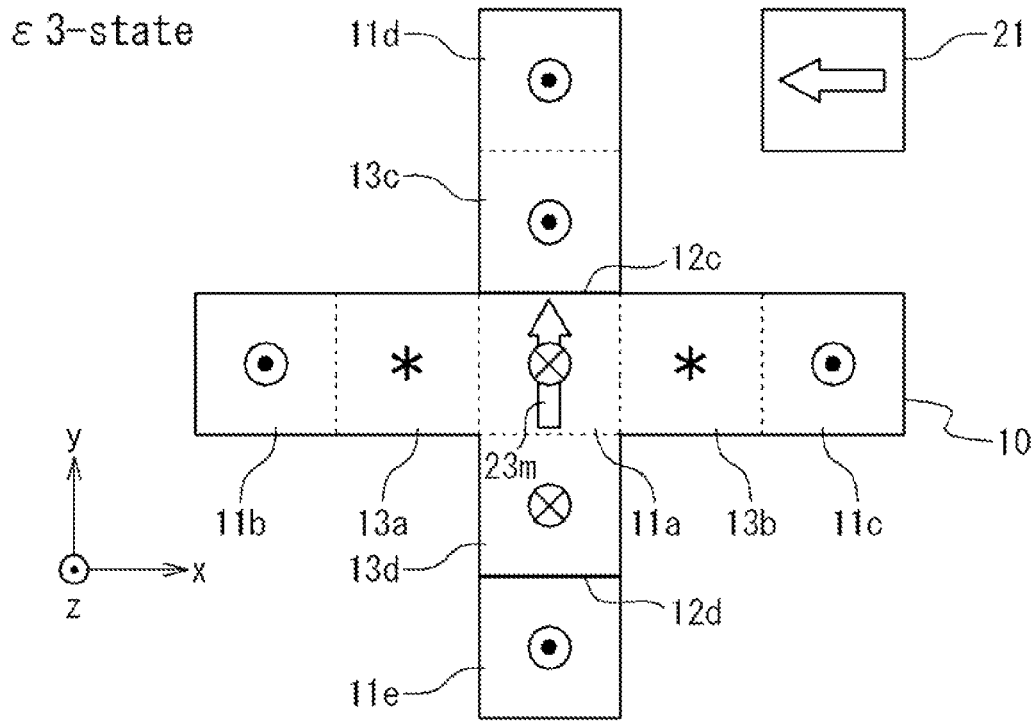
FIG. 45C is a plan view showing the configuration of the magnetic memory device according to the sixth exemplary embodiment of the present invention.

As shown in FIG. 45C, when the magnetization record layer 10 stores the third data, the magnetization directions of the first domain wall motion region 13a to the fourth domain wall motion region 13d are the direction of *, the direction of *, the direction of +z, and the direction of −z, respectively, i.e. (*, *, +z, −z). Thus, the domain walls 12c and 12d are formed between the fourth domain wall motion region 13d and fourth magnetization fixed region 11c and between the third domain wall motion region 13c and the $0^{th}$ magnetization fixed region 11a, respectively. Here, for example, supposing that the direction of * is the direction −z, the domain walls 12a and 12b (not shown) are formed between the first magnetization fixed region 11b and the first domain wall motion region 13a and between the second magnetization fixed region 11c and the second domain wall motion region 13b, respectively. At this time, the magnetic field H is generated in the neighborhood of the sensor layer 23 on the lower-side of the magnetization record layer 10 (on the side of −z) to direct to the third direction as the direction of +y. Thus, the direction of the magnetization 23m of the sensor layer 23 is the third direction in the same way. That is, the data stored in the magnetization record layer 10 is reflected in the sensor layer 23. As a result, in the magnetic tunnel junction section 20, the relative angle is about ψ3 (FIG. 44) between the direction of the magnetization 23m of the sensor layer 23 and the magnetization direction of the reference layer 21. Therefore, the state that the relative angle is about ψ3 can be detected by detecting a resistance value in the direction of ±z of the magnetic tunnel junction section 20. That is, the third data (ϵ3-state) stored in the magnetization record layer 10 can be read.

Figure 45D:
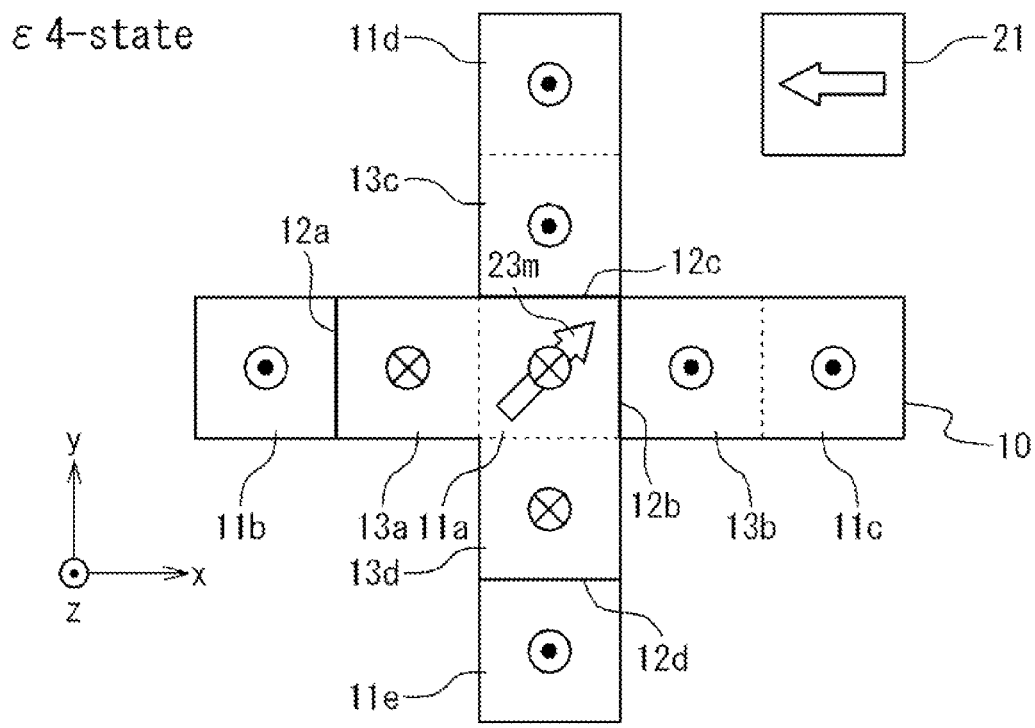
FIG. 45D is a plan view showing the configuration of the magnetic memory device according to the sixth exemplary embodiment of the present invention.

As shown in FIG. 45D, when the magnetization record layer 10 stores the fourth data, the magnetization directions of the first domain wall motion region 13a to the fourth domain wall motion region 13d are the direction of −z, the direction of +z, the direction of +z, and the direction of −z, respectively, i.e. (−z, +z. +z, −z). Thus, the domain walls 12a, 12b, 12c and 12d are formed between the first magnetization fixed region 11b and the first domain wall motion region 13a, between the $0^{th}$ magnetization fixed region 11a and the second domain wall motion region 13b, between the $0^{th}$ magnetization fixed region 11a and the third domain wall motion region 13c, and between and the fourth domain wall motion region 13d and fourth magnetization fixed region 11c, respectively. At this time, the magnetic field H is generated in the neighborhood of the sensor layer 23 on the lower-side of the magnetization record layer 10 (on the side of −z) to direct to the fourth direction shifted to the direction of +y by about 45 degrees from the direction of +x. Thus, the direction of the magnetization 23m of the sensor layer 23 is the fourth direction in the same way. As a result, in the magnetic tunnel junction section 20, the relative angle is about ψ4 (FIG. 44) between the direction of the magnetization 23m of the sensor layer 23 and the magnetization direction of the reference layer 21. Therefore, the state that the relative angle is about ψ4 can be detected by detecting a resistance value in the direction of ±z of the magnetic tunnel junction section 20. That is, the fourth data (ε4-state) stored in the magnetization record layer 10 can be read.

Figure 45E:
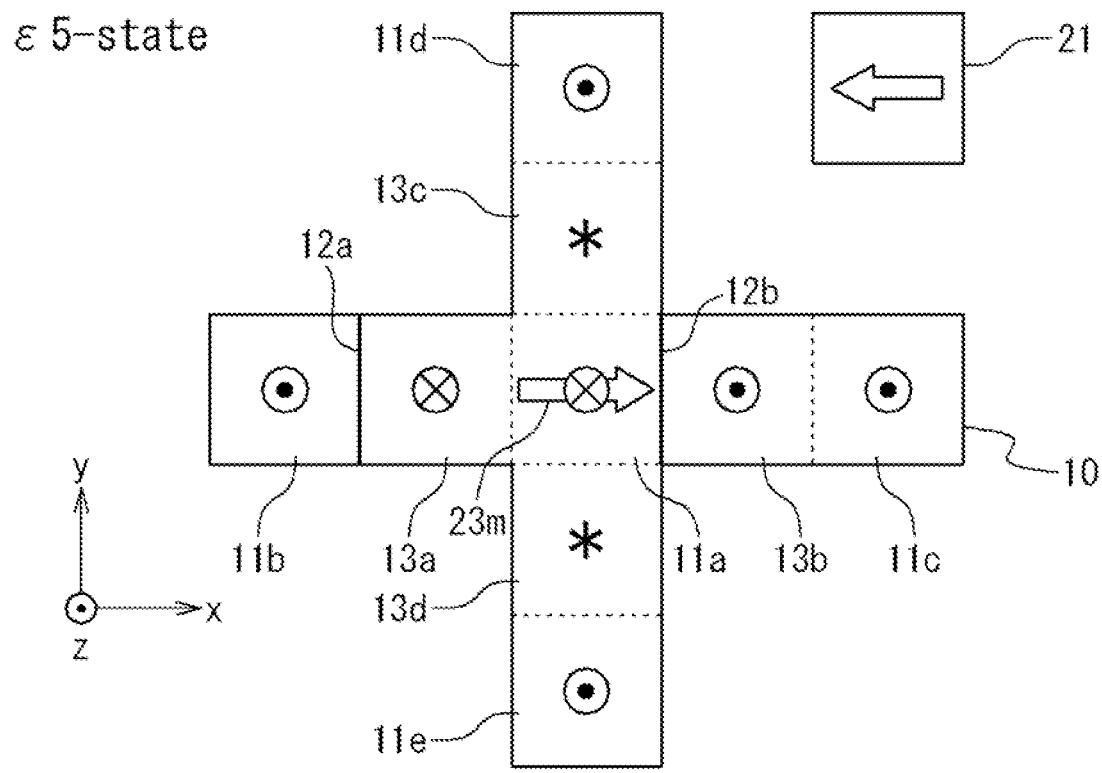
FIG. 45E is a plan view showing the configuration of the magnetic memory device according to the sixth exemplary embodiment of the present invention.

As shown in FIG. 45E, when the magnetization record layer 10 stores the fifth data, the magnetization directions of the first domain wall motion region 13a to the fourth domain wall motion region 13d are the direction of −z, the direction of +z, the direction of *, and the direction of *, respectively, i.e. (−z, +z, *, *). Thus, the domain walls 12a and 12b are formed between the first magnetization fixed region 11b and the first domain wall motion region 13a and between the 0th magnetization fixed region 11a and the second domain wall motion region 13b, respectively. Here, for example, supposing that the direction of * is the direction −z, the domain walls 12c and 12d (not shown) are formed between the third magnetization fixed region 11d and the third domain wall motion region 13c and between fourth magnetization fixed region 11e and the fourth domain wall motion region 13d, respectively. At this time, the magnetic field H is generated in the neighborhood of the sensor layer 23 on the lower-side of the magnetization record layer 10 (on the side of −z) to direct to the fifth direction as the direction of +x. Thus, the direction of the magnetization 23m of the sensor layer 23 is the fifth direction in the same way. As a result, in the magnetic tunnel junction section 20, the relative angle between the direction of the magnetization 23m of the sensor layer 23 and the magnetization direction of the reference layer 21 is in an anti-parallel state of ψ5=about 180 degrees (FIG. 44). Therefore, the anti-parallel state that the relative angle is about ψ5 can be detected by detecting a resistance value in the direction of ±z of the magnetic tunnel junction section 20. That is, the fifth data (ε5-state) stored in the magnetization record layer 10 can be read.

It should be noted that the relation between the relative angle between the magnetization direction of the sensor layer 23 and magnetization direction of the reference layer 21 and the resistance value of the magnetic tunnel junction section 20 are as shown in FIG. 26 in which the relative angles in ε1-state to ε5-state are ψ1 to ψ5, respectively. Therefore, the description is omitted.

The magnetic memory device 1 of the present exemplary embodiment is 5-valued and can store five kinds of data. It should be noted that the direction of the reference layer 21 is not limited to cases shown in FIG. 45A to FIG. 45E and may be another direction if the relative angle of the magnetization direction of the sensor layer 23 and the magnetization direction of the reference layer 30 is of five kinds.

3. Initializing Method of Magnetization Fixed Region

For example, the initializing method of the magnetic memory device according to the sixth exemplary embodiment of the present invention may be the same as that of the first exemplary embodiment (FIG. 6A to FIG. 6C). Therefore, the description is omitted.

4. Write Operation

Next, the data write principle into the magnetic memory device will be described. The data write principle of the present exemplary embodiment is basically the same as that of the fifth exemplary embodiment. That is, a current is supplied through a route such that electrons are supplied from the domain wall motion region for the magnetization to be turned to the direction of +z and the electrons are drawn out from the domain wall motion region for the magnetization to be turned to the direction of −z. A plurality of routes may be used according to the necessity. A combination the write current supply destination and the write current drawn-out destination is changed depending on a combination of the magnetization directions of the first domain wall motion region 13a to the fourth domain wall motion region 13d in each of ε1-state to ε5-state. It should be noted that is supposed in the following description that the direction of * is the direction of −z.

Figure 46A:
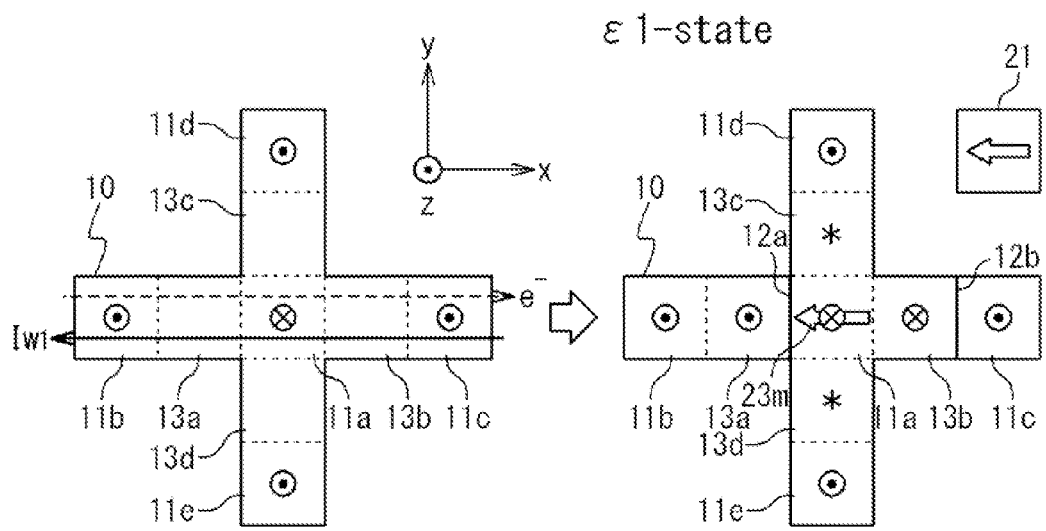
FIG. 46A is a plan view showing the data write principle according to the sixth exemplary embodiment of the present invention.
Figure 46B:
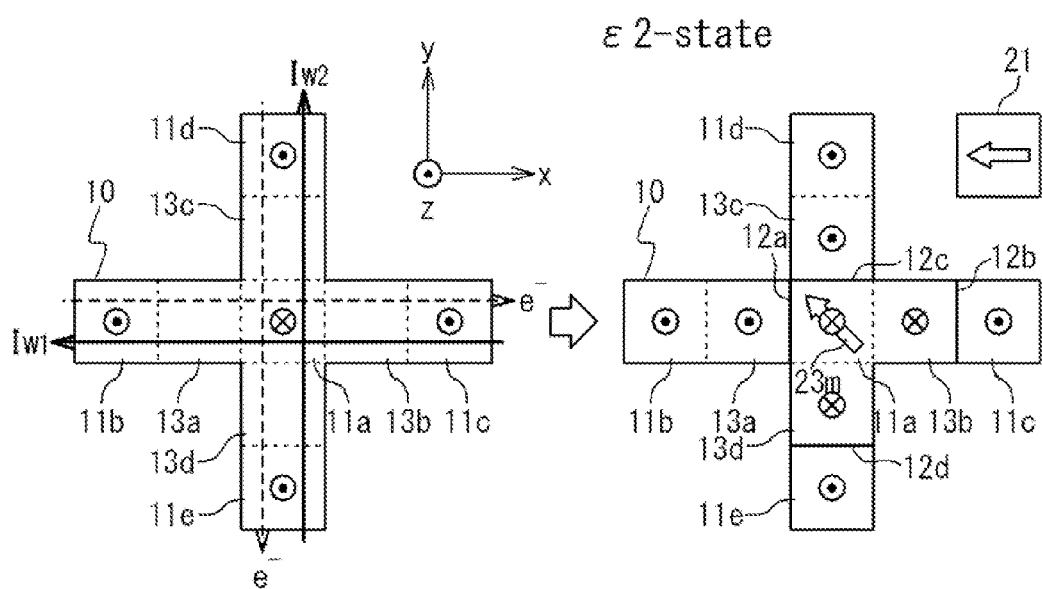
FIG. 46B is a plan view showing the data write principle according to the sixth exemplary embodiment of the present invention.
Figure 46C:
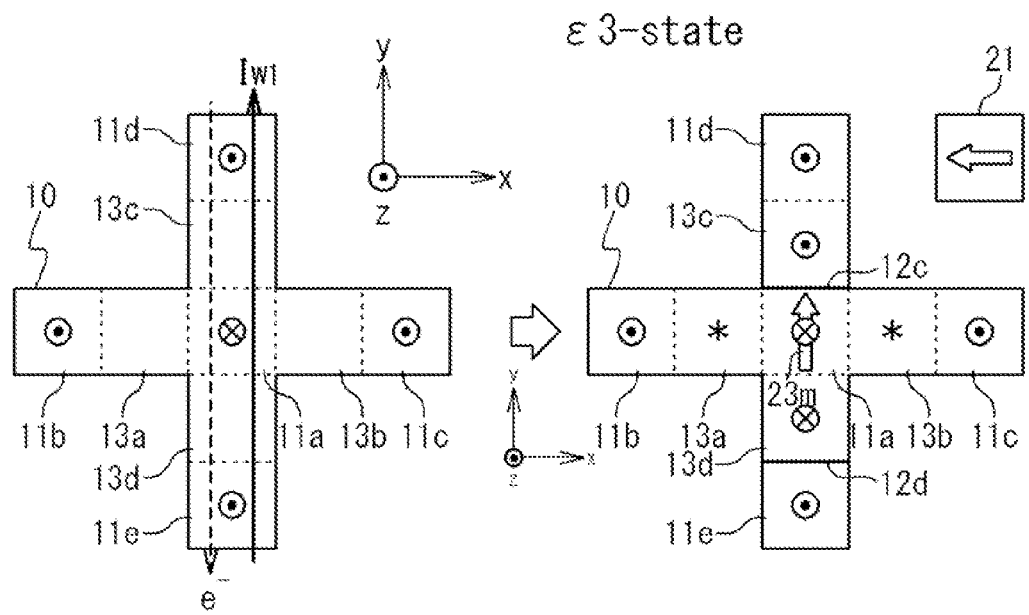
FIG. 46C is a plan view showing the data write principle according to the sixth exemplary embodiment of the present invention.
Figure 46D:
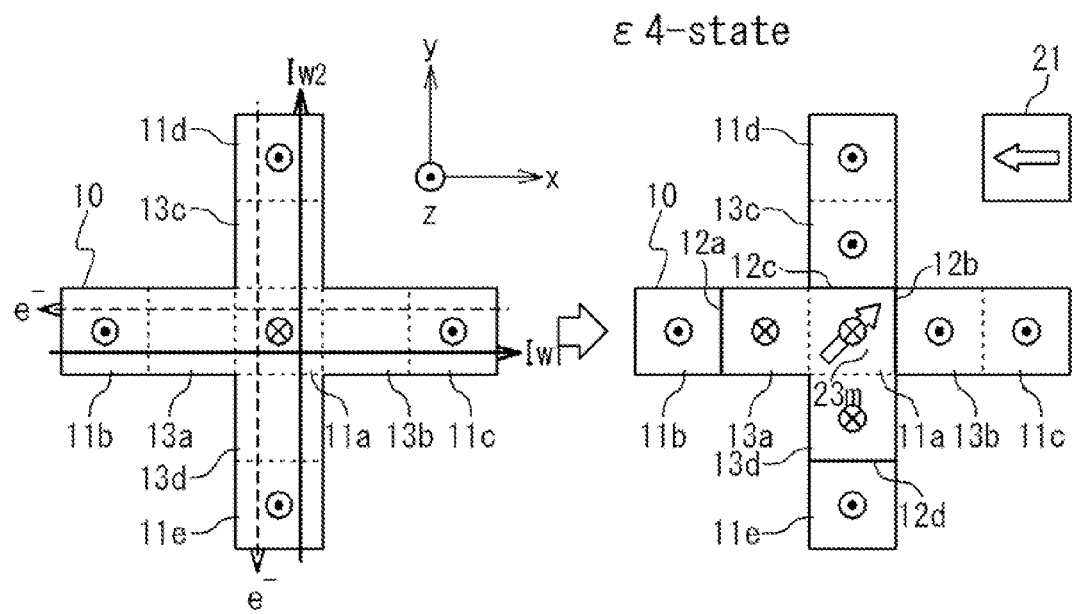
FIG. 46D is a plan view showing the data write principle according to the sixth exemplary embodiment of the present invention.
Figure 46E:
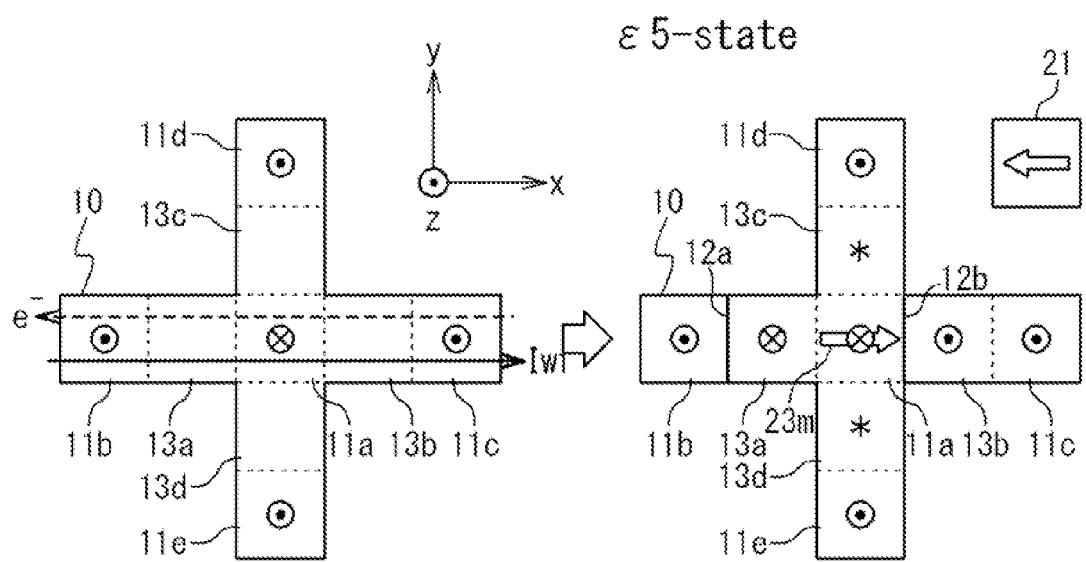
FIG. 46E is a plan view showing the data write principle according to the sixth exemplary embodiment of the present invention.

FIG. 46A to FIG. 46E are plan views showing the data write principle into the magnetic memory device according to the sixth exemplary embodiment of the present invention. The write operation of the first data (ε1-state) of FIG. 46A is the same as the write operation of the first data (δ1-state) of FIG. 41A. The write operation of the second data (ε2-state) of FIG. 46B is the same as the write operation of the second data (δ2-state) of FIG. 41B. The write operation of the third data (ε3-state) of FIG. 46C is the same as the write operation of the fourth data (δ4-state) of FIG. 41D. The write operation of the fourth data (ε4-state) of FIG. 46D is the same as the write operation of the sixth data (δ6-state) of FIG. 41F. The write operation of the fifth data (ε5-state) of FIG. 46E is the same as the write operation of the eighth data (δ8-state) of FIG. 41H.

In this way, the magnetization directions of the first domain wall motion region 13a to the fourth domain wall motion region 13d are inverted with the write currents Iw1 and Iw2 which flow through the magnetization record layer 10 in plane. The first data to the fifth data can be distinguishably written and stored as a combination of the magnetization directions. At this time, the magnetization fixed regions on both sides of each domain wall motion region have the magnetization directions anti-parallel to each other and function as the different spin electron supply sources to the domain wall motion regions. It should be noted that when the domain wall 12 has the same initial state as a state after the write, the state is maintained regardless of the injection of spin electrons e⁻. Therefore, overwrite is possible. Also, in any case of FIG. 46A to FIG. 46E, the first write current Iw1 and the second write current Iw2 may be supplied at the same time, or at different times, and the order may be opposite. Also, the write currents Iw1 and Iw2 may pass wherever later after passing through the domain wall 12a and 12b.

5. Read Operation

The read principle of the data from the magnetic memory device according to the sixth exemplary embodiment of the present invention is the same as that of the first exemplary embodiment, excluding that ψ1 to ψ5 age used among the relative angles in a range shown in FIG. 26. Therefore, the description is omitted.

6. Configuration and Operation of Magnetic Memory Cell and MRAM

The configuration and operation of the magnetic memory cell and MRAM in the magnetic memory device according to the sixth exemplary embodiment of the present invention are same as those of the fifth exemplary embodiment. Therefore, the description is omitted.

7. Position of Sensor Layer,
8. Domain Wall Stopping Method.
9. Magnetization Fixing Method, and
10. Anisotropy of Sensor Layer The position of the sensor layer, the method of stopping a domain wall, the method of fixing magnetization and the anisotropy of the sensor layer in the magnetic memory device according to the sixth exemplary embodiment of the present invention are the same as those of the first exemplary embodiment. Therefore, the description is omitted.

As described above, in the present exemplary embodiment, the same effect as in the fifth exemplary embodiment can be obtained. That is, in the MRAM of the current drive domain wall motion type in which the magnetic anisotropy of the magnetization record layer is of the perpendicular direction, the magnetization fixed region can be easily formed, the read operation is in a high reliability, and it is easy to form the pinning site of the domain wall. In addition, the multi-valued configuration can be realized in which five kinds of data can be stored in the magnetization record layer, and it is possible to increases a data amount per unit area in the semiconductor chip.

Seventh Exemplary Embodiment

In a seventh exemplary embodiment, the magnetic memory cell and the MRAM in the case of N=4 will be described.

1. Basic Configuration of Magnetic Memory Device

Figure 47A:
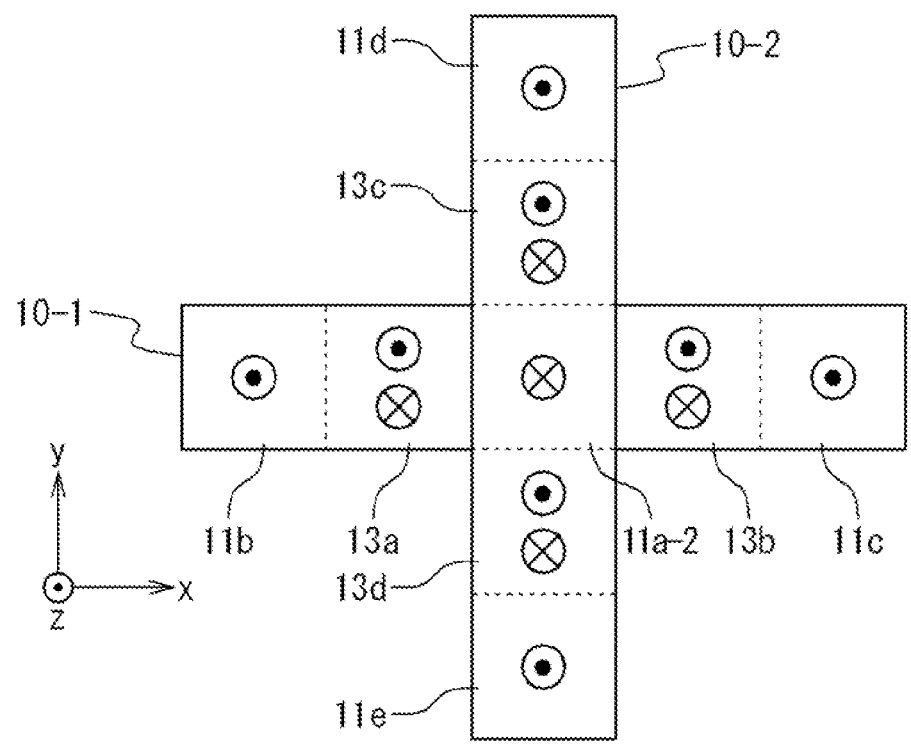
FIG. 47A is a plan view showing the configuration of the magnetization record layer according to a seventh exemplary embodiment of the present invention.
Figure 47B:
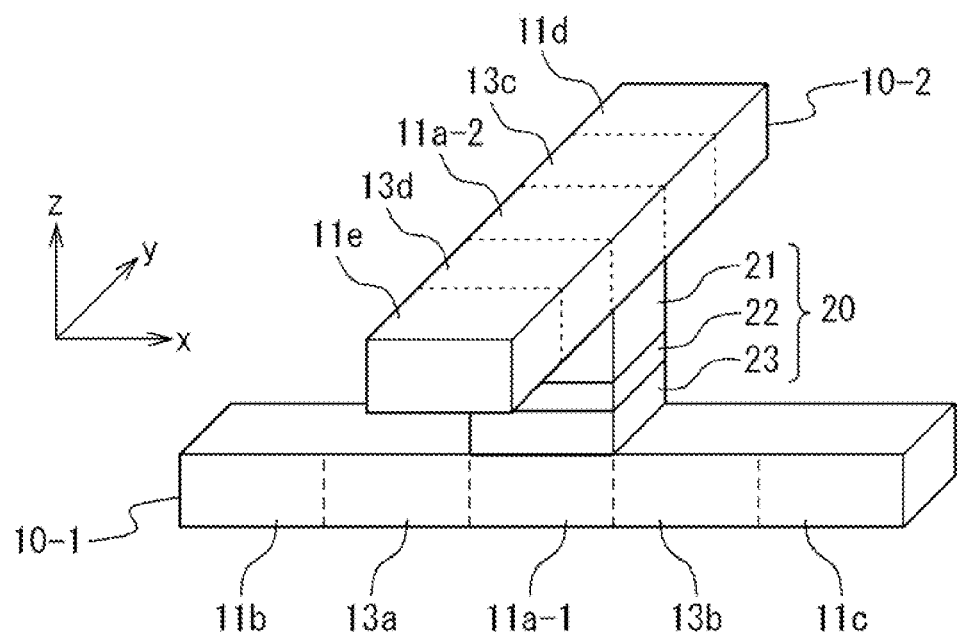
FIG. 47B is a perspective view showing the configuration of the magnetic memory device according to the seventh exemplary embodiment of the present invention.
Figure 47C:
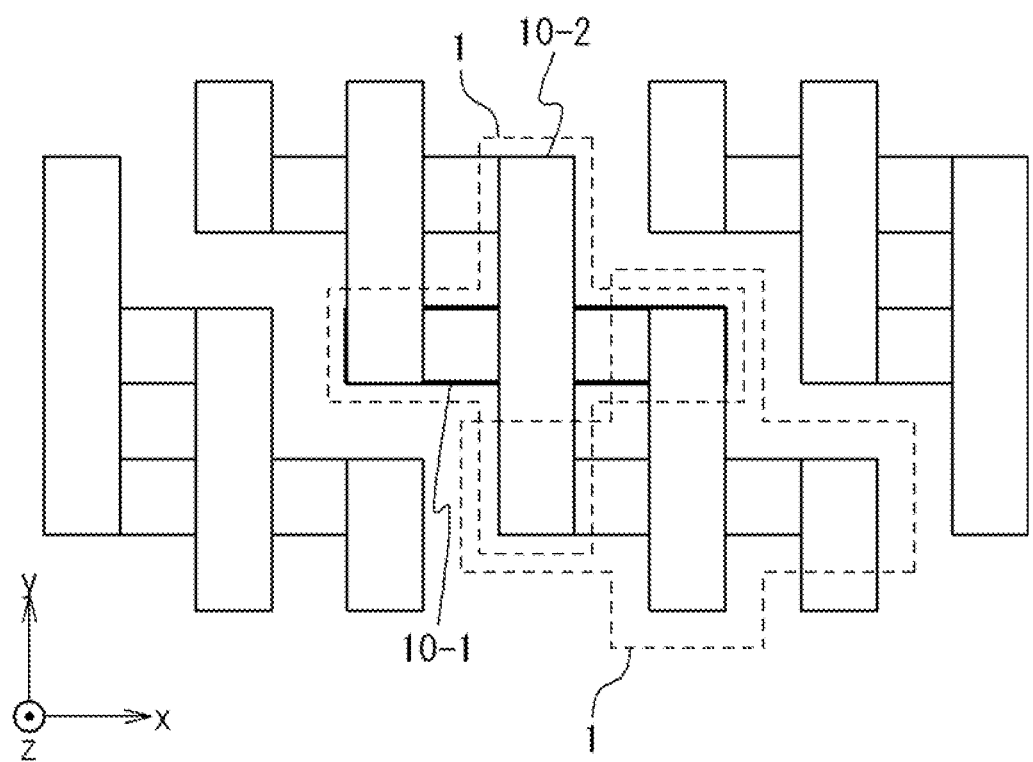
FIG. 47C is a plan view showing a layout of the MRAM according to the seventh exemplary embodiment of the present invention.

FIG. 47A is a plan view showing an example of the configuration of the magnetization record layer of the magnetic memory device according to the seventh exemplary embodiment of the present invention. FIG. 47B is a perspective view showing an example of the configuration of the magnetic memory device according to the seventh exemplary embodiment of the present invention. FIG. 47C is a plan view showing an example of a layout of the MRAM according to the seventh exemplary embodiment of the present invention.

The magnetic memory device 1 of the present exemplary embodiment is provided with the magnetization record layer 10 and the magnetic tunnel junction section 20 and is basically the same as the magnetic memory device 1 of the fifth exemplary embodiment or the sixth exemplary embodiment. Here, the present exemplary embodiment is different from the magnetic memory device 1 of the fifth exemplary embodiment or the sixth exemplary embodiment in that the magnetization record layer 10 has two layers which are connected through the magnetic tunnel junction section 20.

Specifically, the magnetization record layer 10 is provided with a first domain wall motion layer 10-1 and a second domain wall motion layer 10-2. The first domain wall motion layer 10-1 extends to the direction of x, and is provided with the $0^{th}$ magnetization fixed region 11a-1, the first magnetization fixed region 11b, the second magnetization fixed region 11c, the first domain wall motion region 13a and the second domain wall motion region 13b. On the other hand, the second domain wall motion layer 10-2 extends to the direction of y, and is provided with the $0^{th}$ magnetization fixed region 11a-2, the third magnetization fixed region 11d, the fourth magnetization fixed regions 11d, the third domain wall motion region 13c and the fourth domain wall motion region 13d. The magnetic tunnel junction section 20 is provided between the $0^{th}$ magnetization fixed region 11a-1 and the $0^{th}$ magnetization fixed region 11a-2 to be laminated in the direction of z.

when using such a configuration of the magnetic memory device, the magnetic memory device 1 can be arranged densely, as shown in FIG. 47C. Thus, the data memory quantity per unit area can be increased. It should be noted that in the present exemplary embodiment, 2 layers of the domain wail motion layer are laminated, but many layers of the domain wall motion layer may be laminated. In this case, a conductive layer may be used for connection between the $0^{th}$ magnetization fixed regions as well as the magnetic tunnel junction section 20. Thus, the data memory quantity per unit area can be more increased.

2. Storage State of Data
3. Initializing Method of Magnetization Fixed Region
4. Write Operation
5. Read Operation
6. Configuration and Operation of Magnetic Memory Cell and MRAM
7. Position of sensor layer
8. Domain Wall Stopping Method
9. Magnetization Fixing Method
10. Anisotropy of Sensor Layer The storage state of the data, the method of initializing of the magnetization fixed region, the write operation, the read operation, the configuration and operation of the magnetic memory cell and MRAM, the position of the sensor layer, the method of stopping a domain wall, the method of fixing magnetization, and the anisotropy of the sensor layer in the magnetic memory device according to a seventh exemplary embodiment of the present invention are the same as those of the fifth exemplary embodiment or the sixth exemplary embodiment. Therefore, the description is omitted.

As described above, in the present exemplary embodiment, the same effect as in the fifth exemplary embodiment or the fifth exemplary embodiment 1 can be obtained. That is, in the MRAM of the current drive domain wall motion type in which the magnetic anisotropy of the magnetization record layer is of the perpendicular direction, the magnetization fixed region can be easily formed, the read operation is in a high reliability, and it is easy to form the pinning site of the domain wall. In addition, the multi-valued configuration can be realized in which eight or five kinds of data can be stored in the magnetization record layer, and it is possible to increase a data amount per unit area in the semiconductor chip. Moreover, by adopting multi-layered domain wall motion layer and the magnetization record layer, the multi-valued configuration for more data can be realized and it is possible to increase a data amount per unit area in the semiconductor chip more.

As described above, by referring to the exemplary embodiments, the present invention has been described. However, the present invention is not limited to the above exemplary embodiments. It could be understood that various modifications can be made in the scope of the present invention. Also, the techniques in the exemplary embodiments of the present invention may be combined in a range that there is no technical contradiction.

The invention claimed is:

1. A magnetic memory device comprising:
   a magnetization record layer which is a ferromagnetic layer having a perpendicular magnetic anisotropy; and
   a magnetic tunnel junction section used to read data from said magnetization record layer,
   wherein said magnetization record layer is provided with a plurality of domain wall motion regions,
   wherein said magnetization record layer comprises:
   (N+1) magnetization fixed regions (N is a natural number equal to or more than 2) of a $0^{th}$ magnetization fixed region to an $N^{th}$ magnetization fixed region which have fixed magnetization directions; and
   N domain wall motion regions of a first domain wall motion region to an Nth domain wall motion region which have invertible magnetization directions and in which a domain wall is movable, and
   wherein one of said N domain wall motion regions is connected between every adjacent two of said 0th magnetization fixed region to said Nth magnetization fixed region which are arranged in order.

2. The magnetic memory device according to claim 1, wherein said magnetic tunnel junction section comprises:
a sensor layer which is a ferromagnetic layer having an in-plane magnetic anisotropy and having an invertible magnetization.

3. The magnetic memory device according to claim 1, wherein said magnetization record layer stores the data based on mutual relation of the magnetization directions of said N domain wall motion regions.

4. The magnetic memory device according to claim 1, wherein said N magnetization fixed regions of said (N+1) magnetization fixed regions other than said $0^{th}$ magnetization fixed region are substantially same.

5. The magnetic memory device according to claim 1, wherein said N magnetization fixed regions of said (N+1) magnetization fixed regions other than said $0^{th}$ magnetization fixed region have substantially a same magnetization direction, and
wherein the magnetization direction of said $0^{th}$ magnetization fixed region is opposite to the magnetization directions of said N magnetization fixed regions.

6. The magnetic memory device according to claim 1, wherein a projection of said sensor layer to said magnetization record layer overlaps at least a part of a region of said magnetization record layer among said N domain wall motion regions.

7. The magnetic memory device according to claim 1, further comprising:
a conductive contact layer provided between said $0^{th}$ magnetization fixed region and said magnetic tunnel junction section.

8. The magnetic memory device according to claim 1, further comprising:
first hard layers provided in neighborhood of said N magnetization fixed regions to fix the magnetization directions of said N magnetization fixed regions.

9. The magnetic memory device according to claim 1, further comprising:
a second hard layer provided in neighborhood of said $0^{th}$ magnetization fixed region.

10. The magnetic memory device according to claim 8, wherein said magnetic tunnel junction section and said first hard layers, or said first magnetic tunnel junction section and said first hard layer and said second hard layer are provided on an opposite side to a substrates with respect to said magnetization record layer.

11. The magnetic memory device according to claim 1, wherein said N domain wall motion regions are three domain wall motion regions,
wherein said magnetic tunnel junction section further comprises a reference layer which is a ferromagnetic layer having a fixed magnetization direction and having a in-plane magnetic anisotropy, and
wherein the magnetization direction of said reference layer is different from any of extending directions of said three domain wall motion regions from said $0^{th}$ magnetization fixed region.

12. The magnetic memory device according to claim 1, wherein said N domain wall motion regions are three domain wall motion regions,
wherein two domain wall motion regions of said three domain wall motion regions extend in a line in opposite directions with respect to said $0^{th}$ magnetization fixed region,
wherein said magnetic tunnel junction section further comprises a reference layer which is a ferromagnetic layer having an in-plane magnetic anisotropy and having a fixed magnetization direction, and
wherein a magnetization direction of said reference layer is same as the direction of the line.

13. The magnetic memory device according to claim 1, wherein said N domain wall motion regions are two domain wall motion regions,
wherein said magnetic tunnel junction section further comprises a reference layer which is a ferromagnetic layer having an in-plane magnetic anisotropy and having a fixed magnetization direction, and
wherein the magnetization direction of said reference layer is same as a direction of a line which links said two domain wall motion regions.

14. The magnetic memory device according to claim 13, wherein an anisotropic direction of said sensor layer is orthogonal to the direction of the line which links said two domain wall motion regions.

15. The magnetic memory device according to claim 1, wherein said N domain wall motion regions are four domain wall motion regions,
wherein said four domain wall motion regions extend radially from said $0^{th}$ magnetization fixed region to form right angles, and
wherein said magnetic tunnel junction section further comprises a reference layer which is a ferromagnetic layer having in-plane magnetic anisotropy and having a magnetization direction fixed.

16. The magnetic memory device according to claim 15, wherein the magnetization direction of said reference layer is different from the extending directions of said four domain wall motion regions and directions shifted by 45 degrees from the extending directions of said four domain wall motion regions.

17. The magnetic memory device according to claim 1, wherein said (N+1) magnetization fixed regions and said N domain wall motion regions configure one layer of domain wall motion layer, and
wherein said magnetization record layer comprises plural layers of domain wall motion layer.

18. The magnetic memory device according to claim 17, wherein said plural layers of domain wall motion layers comprises two layers of domain wall motion layer,
wherein in each of said two layers of domain wall motion layer, said N domain wall motion regions are two domain wall motion regions, which extend in a line in opposite directions from said $0^{th}$ magnetization fixed region, and
wherein said two layers of domain wall motion layer are provided such that the two lines are orthogonal to each other.

19. The magnetic memory device according to claim 7, wherein said contact layer has a resistance lower than that of said $0^{th}$ magnetization fixed region.

20. The magnetic memory device according to claim 1, wherein said $0^{th}$ magnetization fixed region has a step in a boundary with each of said N domain wall motion regions from said first domain wall motion region to said $N^{th}$ domain wall motion region.

21. The magnetic memory device according to claim 1, wherein a sectional area of said $0^{th}$ magnetization fixed region in a perpendicular direction is larger than the sectional area in the perpendicular direction of each of said N domain wall motion regions from said first domain wall motion region to said $N^{th}$ domain wall motion region.

22. The magnetic memory device according to claim 7, wherein said contact layer is a magnetic substance body, and wherein The magnetization direction of said contact layer is fixed to the same magnetization direction as said $0^{th}$ magnetization fixed region.

23. A magnetic random access memory comprising a plurality of magnetic memory cells arranged in a matrix, each of which comprises said magnetic memory device which comprises:
- a magnetization record layer which is a ferromagnetic layer having a perpendicular magnetic anisotropy; and
- a magnetic tunnel junction section used to read data from said magnetization record layer,
- wherein said magnetization record layer is provided with a plurality of domain wall motion regions,
- wherein said magnetic tunnel junction section comprises:
- a sensor layer which is a ferromagnetic layer having an in-plane magnetic anisotropy and having an invertible magnetization,
- wherein said magnetization record layer comprises:
- (N+1) magnetization fixed regions (N is a natural number equal to or more than 2) of a $0^{th}$ magnetization fixed region to an $N^{th}$ magnetization fixed region which have fixed magnetization directions; and
- N domain wall motion regions of a first domain wall motion region to an Nth domain wall motion region which have invertible magnetization directions and in which a domain wall is movable, and
- wherein one of said N domain wall motion regions is connected between every adjacent two of said 0th magnetization fixed region to said Nth magnetization fixed region which are arranged in order.

* * * * *